US012787341B2

(12) United States Patent
Hata

(10) Patent No.: US 12,787,341 B2
(45) Date of Patent: Nov. 3, 2026

(54) NITRIDE SEMICONDUCTOR DEVICE AND METHOD FOR MANUFACTURING NITRIDE SEMICONDUCTOR DEVICE

(71) Applicant: ROHM CO., LTD., Kyoto (JP)

(72) Inventor: Yosuke Hata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 500 days.

(21) Appl. No.: 18/472,252

(22) Filed: Sep. 22, 2023

(65) Prior Publication Data

US 2024/0105828 A1 Mar. 28, 2024

(30) Foreign Application Priority Data

Sep. 26, 2022 (JP) ................................ 2022-152273
Sep. 27, 2022 (JP) ................................ 2022-153819
Jul. 19, 2023 (JP) ................................ 2023-117518

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 30/4732* (2025.01);
(Continued)

(58) Field of Classification Search
CPC ....... H10D 30/015; H10D 30/47–4755; H10D 64/012; H10D 64/64; H10D 64/111; H10D 62/824; H10D 62/8503
See application file for complete search history.

(56) References Cited

U.S. PATENT DOCUMENTS

2008/0296618 A1* 12/2008 Suh ...................... H10D 62/343 257/190
2012/0299011 A1* 11/2012 Hikita .................. H10D 30/015 257/E29.252
(Continued)

FOREIGN PATENT DOCUMENTS

JP 2017-073506 A 4/2017
WO WO-2023276972 A1 * 1/2023 ........... H10D 64/111

OTHER PUBLICATIONS

Mohan, B, et al, "Analyzing Ga-Polar and N-Polar GaN HEMTs: A Comparative Study for High-Power DC Performance in Semiconductor Applications.", 2022 6th International Conference on Devices, Circuits and Systems (ICDCS), Apr. 23, 2024, pp. 317-321. (Year: 2024).*

*Primary Examiner* — Christine S. Kim
*Assistant Examiner* — Tien Tran
(74) *Attorney, Agent, or Firm* — XSENSUS LLP

(57) ABSTRACT

A nitride semiconductor device includes an electron transit layer composed of a nitride semiconductor, an electron supply layer formed on the electron transit layer and composed of a nitride semiconductor having a band gap that is larger than that of the electron transit layer, a gate layer formed on the electron supply layer and composed of a nitride semiconductor including an acceptor impurity, a gate electrode formed on the gate layer, and a source electrode and a drain electrode that are formed on the electron supply layer. The gate layer includes an upper surface in contact with the gate electrode. The upper surface is a Ga-polar surface.

11 Claims, 32 Drawing Sheets

(51) Int. Cl.
*H10D 62/824* (2025.01)
*H10D 62/85* (2025.01)
*H10D 64/00* (2025.01)
*H10D 64/64* (2025.01)

(52) U.S. Cl.
CPC ....... *H10D 62/824* (2025.01); *H10D 62/8503* (2025.01); *H10D 64/111* (2025.01); *H10D 64/64* (2025.01)

(56) References Cited

U.S. PATENT DOCUMENTS

| | | | | |
|---|---|---|---|---|
| 2014/0084344 | A1* | 3/2014 | Zhu | H10D 30/015 257/194 |
| 2014/0367742 | A1* | 12/2014 | Twynam | H10D 64/64 257/194 |
| 2017/0104091 | A1 | 4/2017 | Tanaka | |
| 2019/0006500 | A1* | 1/2019 | Ueda | H10D 30/015 |
| 2020/0365694 | A1* | 11/2020 | Ito | H10D 30/4755 |
| 2022/0029007 | A1* | 1/2022 | Chen | H10D 62/824 |
| 2022/0199816 | A1* | 6/2022 | Beumer | H10D 30/475 |
| 2023/0090106 | A1* | 3/2023 | Then | H10D 86/01 257/76 |

* cited by examiner

NITRIDE SEMICONDUCTOR DEVICE AND METHOD FOR MANUFACTURING NITRIDE SEMICONDUCTOR DEVICE

CROSS-REFERENCE TO RELATED APPLICATIONS

This application claims priority to Japanese Patent Application No. 2022-152273, filed on Sep. 26, 2022, Japanese Patent Application No. 2022-153819, filed on Sep. 27, 2022 and Japanese Patent Application No. 2023-117518, filed on Jul. 19, 2023, the entire contents of each are incorporated herein by reference.

BACKGROUND

1. Field

The following description relates to a nitride semiconductor device and a method for manufacturing a nitride semiconductor device.

2. Description of Related Art

A nitride semiconductor such as gallium nitride (GaN) has been used to produce a high-electron-mobility transistor (HEMT). An example of a nitride semiconductor HEMT includes an electron transit layer composed of a gallium nitride (GaN) layer and an electron supply layer composed of an aluminum gallium nitride (AlGaN) layer. When the electron transit layer and the electron supply layer form a heterojunction, two-dimensional electronic gas (2DEG) is formed in the electron transit layer in the vicinity of the interface between the electron transit layer and the electron supply layer. The two-dimensional electronic gas (2DEG) is used as a channel of the HEMT.

A nitride semiconductor layer (e.g., p-type GaN layer) including an acceptor impurity may be arranged as a gate layer between the gate electrode and the electron transit layer so that the HEMT performs a normally-off operation. Japanese Laid-Open Patent Publication No. 2017-73506 discloses such a normally-off-type HEMT.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
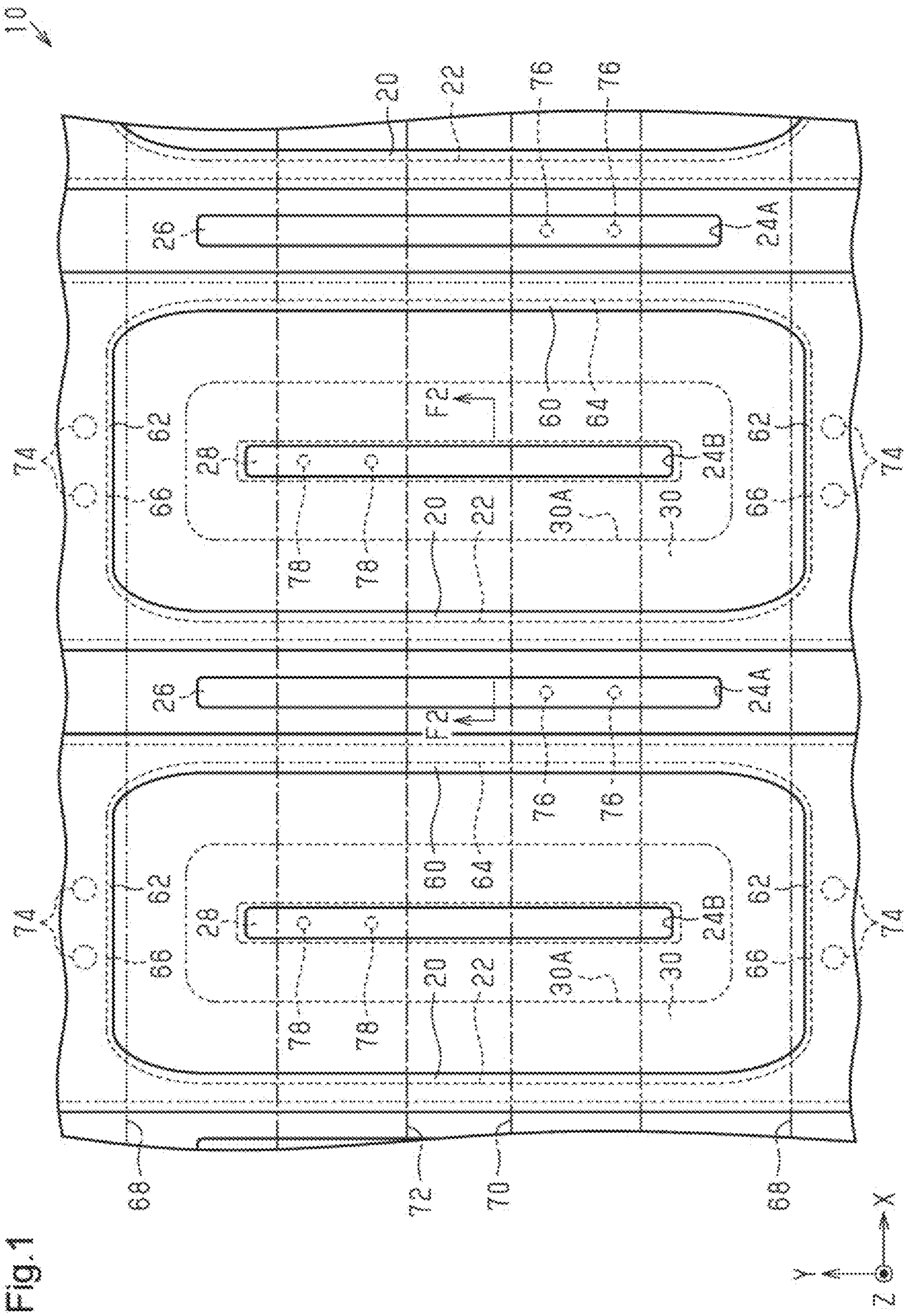
FIG. 1 is a schematic plan view showing a first embodiment of an exemplary nitride semiconductor device.

Embodiments of a nitride semiconductor device according to the present disclosure will be described below with reference to the drawings. In the drawings, elements may not be drawn to scale for simplicity and clarity of illustration. In a cross-sectional view, hatching may be omitted to facilitate understanding. The accompanying drawings only illustrate embodiments of the present disclosure and are not intended to limit the present disclosure.

The following detailed description includes exemplary embodiments of a device, a system, and a method according to the present disclosure. The detailed description is illustrative and is not intended to limit embodiments of the present disclosure or the application and use of the embodiments.

First Embodiment

General Structure of Nitride Semiconductor Device

Figure 2:
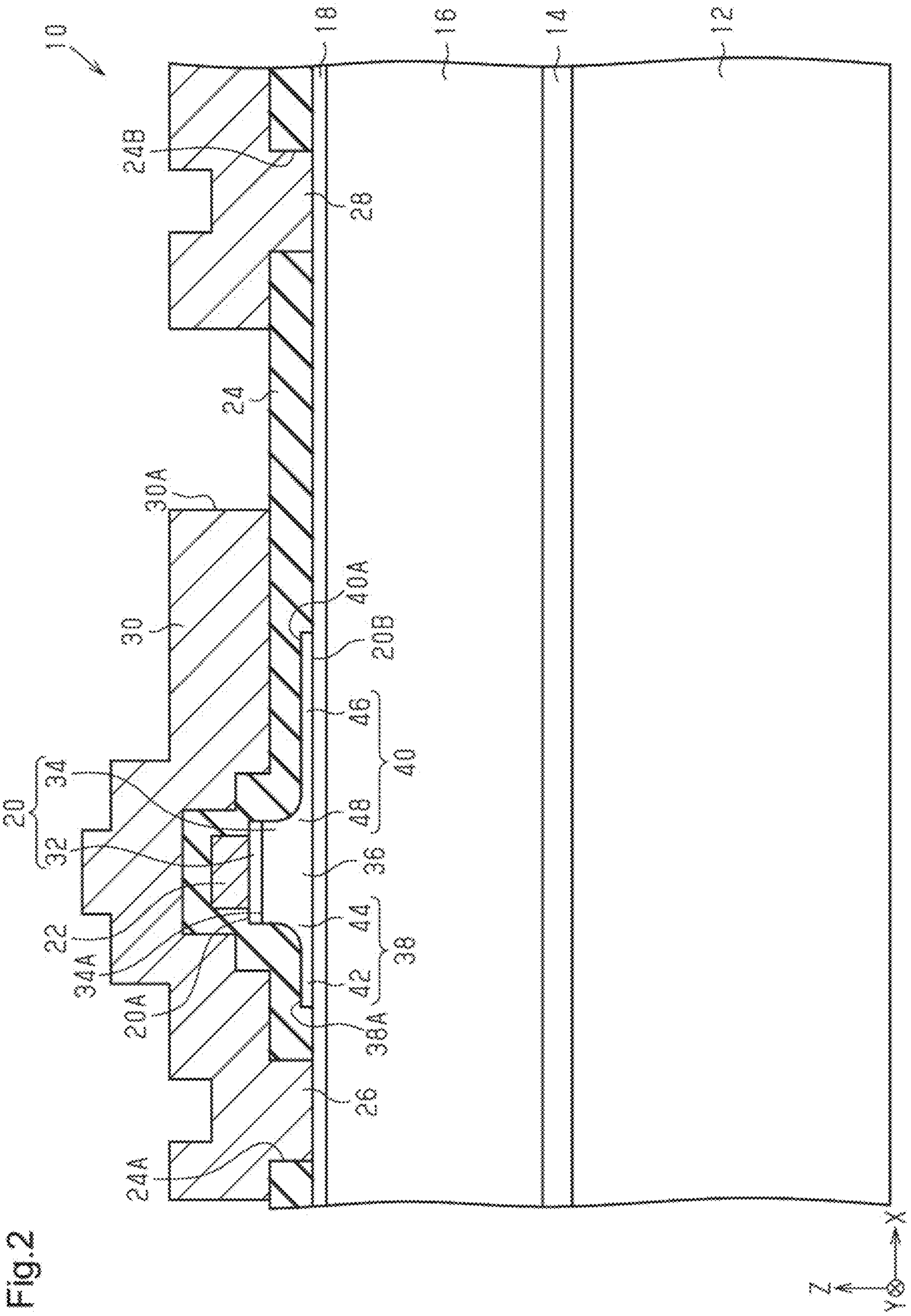
FIG. 2 is a schematic cross-sectional view of the nitride semiconductor device taken along line F2-F2 in FIG. 1.

FIG. 1 is a schematic plan view showing a first embodiment of an exemplary nitride semiconductor device 10. FIG. 2 is a schematic cross-sectional view of the nitride semiconductor device 10 taken along line F2-F2 in FIG. 1. As shown in FIG. 2, the nitride semiconductor device 10 may include a semiconductor substrate 12 and a buffer layer 14 formed on the semiconductor substrate 12. Among XYZ-axes that are orthogonal to each other shown in FIGS. 1 and 2, a Z-axis direction is orthogonal to a surface of the semiconductor substrate 12. The term "plan view" used in this specification refers to a view of the nitride semiconductor device 10 in the Z-axis direction from above unless otherwise specifically described. The nitride semiconductor device 10 further includes an electron transit layer 16 and an electron supply layer 18 formed on the electron transit layer 16.

The semiconductor substrate 12 may be formed from silicon (Si), silicon carbide (SiC), gallium nitride (GaN), sapphire, or other substrate materials. In an example, the semiconductor substrate 12 may be a Si substrate. The semiconductor substrate 12 may have a thickness, for example, in a range of 200 μm to 1500 μm.

The buffer layer 14 may include one or more nitride semiconductor layers. The electron transit layer 16 may be formed on the buffer layer 14. The buffer layer 14 may be formed from any material that limits, for example, bending of the semiconductor substrate 12 caused by a mismatch in thermal expansion coefficient between the semiconductor substrate 12 and the electron transit layer 16 and formation of cracks in the nitride semiconductor device 10. For example, the buffer layer 14 may include at least one of an aluminum nitride (AlN) layer, an aluminum gallium nitride (AlGaN) layer, and a graded AlGaN layer that has different aluminum (Al) compositions. For example, the buffer layer 14 may include a single AlN layer, a single AlGaN layer, a layer having a superlattice structure of AlGaN/GaN, a layer having a superlattice structure of AlN/AlGaN, or a layer having a superlattice structure of AlN/GaN.

In an example, the buffer layer 14 may include a first buffer layer that is an AlN layer formed on the semiconductor substrate 12 and a second buffer layer that is an AlGaN layer formed on the AlN layer. The first buffer layer may be, for example, an AlN layer having a thickness of 200 nm. The second buffer layer may be, for example, formed by stacking a graded AlGaN layer having a thickness of 300 nm a number of times. To inhibit current leakage of the buffer layer 14, a portion of the buffer layer 14 may be doped with an impurity so that the buffer layer 14 becomes semi-insulating. In this case, the impurity is, for example, carbon (C) or iron (Fe). The concentration of the impurity may be, for example, greater than or equal to $4\times10^{16}$ $cm^{-3}$.

The electron transit layer 16 is composed of a nitride semiconductor. The electron transit layer 16 may be, for example, a GaN layer. The electron transit layer 16 may have a thickness, for example, in a range of 0.5 μm to 2 μm. To inhibit current leakage of the electron transit layer 16, a portion of the electron transit layer 16 may be doped with an impurity so that the electron transit layer 16 excluding an outer layer region becomes semi-insulating. In this case, the impurity may be, for example, C. The concentration of the impurity in the electron transit layer 16 may be, for example, greater than or equal to $4\times10^{16}$ $cm^{-3}$. More specifically, the electron transit layer 16 may include GaN layers having different impurity concentrations, for example, a C-doped GaN layer and a non-doped GaN layer. In this case, the C-doped GaN layer may be formed on the buffer layer 14. The C-doped GaN layer may have a thickness in a range of 0.3 μm to 2 μm. The C concentration in the C-doped GaN layer may be in a range of $5\times10^{17}$ $cm^{-3}$ to $9\times10^{19}$ $cm^{-3}$. The non-doped GaN layer may be formed on the C-doped GaN layer and may have a thickness in a range of 0.05 μm to 0.4 μm. The non-doped GaN layer is in contact with the electron supply layer 18. In an example, the electron transit layer 16 may include a C-doped GaN layer having a thickness of 0.4 μm and a non-doped GaN layer having a thickness of 0.4 μm. The C concentration in the C-doped GaN layer may be approximately $2\times10^{19}$ $cm^{-3}$.

The electron supply layer 18 is composed of a nitride semiconductor having a band gap that is larger than that of the electron transit layer 16. The electron supply layer 18 may be, for example, an AlGaN layer. The band gap increases as the Al composition increases. Therefore, the electron supply layer 18, which is an AlGaN layer, has a larger band gap than the electron transit layer 16, which is a GaN layer. In an example, the electron supply layer 18 is composed of $Al_xGa_{1-x}N$, where $0.1<x<0.4$, and, more preferably, $0.1<x<0.3$. The electron supply layer 18 may have a thickness in a range of 5 nm to 20 nm. In an example, the electron supply layer 18 may have a thickness that is greater than or equal to 8 nm.

The electron transit layer 16 and the electron supply layer 18 are composed of nitride semiconductors having different lattice constants. Thus, the nitride semiconductor forming the electron transit layer 16 (e.g., GaN) and the nitride semiconductor forming the electron supply layer 18 (e.g., AlGaN) form a lattice-mismatching heterojunction. The energy level of the conduction band of the electron transit layer 16 in the vicinity of the heterojunction interface is lower than the Fermi level due to spontaneous polarization of the electron transit layer 16 and the electron supply layer 18 and piezoelectric polarization caused by crystal distortion in the vicinity of the heterojunction interface. As a result, two-dimensional electron gas (2DEG) spreads in the electron transit layer 16 at a location close to the heterojunction interface between the electron transit layer 16 and the electron supply layer 18 (e.g., within a range approximately a few nanometers from the interface). The sheet carrier density of the 2DEG formed in the electron transit layer 16 may be increased by increasing at least one of the Al composition and the thickness of the electron supply layer 18.

Gate Layer and Gate Electrode

The nitride semiconductor device 10 further includes a gate layer 20 formed on the electron supply layer 18 and a gate electrode 22 formed on the gate layer 20. The gate layer 20 may be formed on a portion of the electron supply layer 18.

The gate layer 20 is composed of a nitride semiconductor containing an acceptor impurity. In the present embodiment, the gate layer 20 may be a gallium nitride layer (p-type GaN layer) doped with an acceptor impurity. The acceptor impurity may include at least one of zinc (Zn), magnesium (Mg), and carbon (C). The maximum concentration of the acceptor impurity in the gate layer 20 may be in a range of $7\times10^{18}$ $cm^{-3}$ to $1\times10^{20}$ $cm^{-3}$. In an example, the gate layer 20 may be GaN containing at least one of Mg and Zn as an impurity. Further details of the gate layer 20 will be described later.

The gate electrode 22 may be composed of one or more metal layers. In an example, the gate electrode 22 may be composed of a titanium nitride (TiN) layer. In another example, the gate electrode 22 may be composed of a first metal layer formed from Ti and a second metal layer formed from TiN and arranged on the first metal layer. The gate electrode 22 may form a Schottky junction with the gate layer 20. The gate electrode 22 may be formed in a region smaller than the gate layer 20 in plan view. The gate electrode 22 may have a thickness, for example, in a range of 50 nm to 200 nm.

The nitride semiconductor device 10 may further include a passivation layer 24 that covers the electron supply layer 18, the gate layer 20, and the gate electrode 22. The passivation layer 24 includes a first opening 24A and a second opening 24B that are separated from each other in an X-axis direction. The gate layer 20 is arranged between the first opening 24A and the second opening 24B. More specifically, the gate layer 20 may be arranged between the first opening 24A and the second opening 24B at a position closer to the first opening 24A than to the second opening 24B. The passivation layer 24 may be formed from, for example, at least one of silicon nitride (SiN), silicon dioxide ($SiO_2$), silicon oxynitride (SiON), aluminum oxide ($Al_2O_3$), AlN, and aluminum oxynitride (AlON). The passivation layer 24 may have a thickness, for example, in a range of 80 nm to 150 nm.

Source Electrode and Drain Electrode

The nitride semiconductor device 10 further includes a source electrode 26, which is in contact with the electron supply layer 18 through the first opening 24A, and a drain electrode 28, which is in contact with the electron supply layer 18 through the second opening 24B. The source electrode 26 and the drain electrode 28 may be composed of one or more metal layers (e.g., any combination of a Ti layer, a TiN layer, an Al layer, an AlSiCu layer, an AlCu layer, and the like).

At least a portion of the source electrode 26 fills the first opening 24A. This allows the source electrode 26 to be in ohmic contact with the 2DEG, which is located immediately below the electron supply layer 18, through the first opening 24A. Also, at least a portion of the drain electrode 28 fills the second opening 24B. This allows the drain electrode 28 to be in ohmic contact with the 2DEG, which is located immediately below the electron supply layer 18, through the second opening 24B.

Field Plate Electrode

The nitride semiconductor device 10 may further optionally include a field plate electrode 30 formed on the passivation layer 24 and extending at least partially in a region between the gate layer 20 and the drain electrode 28 in plan view. In the example shown in FIG. 2, the field plate electrode 30 is formed integrally with the source electrode 26. Of the integrally formed electrodes, the source electrode 26 may include at least the portion that is embedded in the first opening 24A of the passivation layer 24, and the field plate electrode 30 may include the remaining portion. It is sufficient that the field plate electrode 30 is electrically connected to the source electrode 26. The field plate electrode 30 does not necessarily have to be continuous with the source electrode 26.

The field plate electrode 30 is separated from the drain electrode 28. Therefore, the field plate electrode 30 may include an end 30A located between the drain electrode 28 (second opening 24B) and the gate layer 20 in plan view.

When a drain voltage is applied to the drain electrode 28 in a zero bias state, in which no gate voltage is applied to the gate electrode 22, the field plate electrode 30 reduces concentration of an electric field in the vicinity of an end of the gate electrode 22.

Planar Layout of Nitride Semiconductor Device

An example of the planar layout of the nitride semiconductor device 10 will be described with reference to FIG. 1. In FIG. 1, the gate electrode 22, the source electrode 26, the drain electrode 28, and the field plate electrode 30 are indicated by broken lines. The first opening 24A and the second opening 24B of the passivation layer 24 are indicated by solid lines. The remaining of the passivation layer 24 is transparently shown.

As shown in FIG. 1, the gate layer 20 may be formed to surround the drain electrode 28 in plan view. The gate layer 20 may include body portions 60 extending in the Y-axis direction and connection portions 62 connecting adjacent ones of the body portions 60. The body portion 60 of the gate layer 20 is arranged between the first opening 24A and the second opening 24B of the passivation layer 24.

In plan view, the gate electrode 22 is arranged to overlap the gate layer 20. Therefore, in the same manner as the gate layer 20, the gate electrode 22 may be formed to surround the drain electrode 28 in plan view. The gate electrode 22 may include body portions 64 extending in the Y-axis direction and connection portions 66 connecting adjacent ones of the body portions 64. The gate electrode 22 may be smaller in area in plan view than the gate layer 20.

The nitride semiconductor device 10 may include a gate interconnect 68, a source interconnect 70, and a drain interconnect 72. In FIG. 1, the gate interconnect 68, the source interconnect 70, and the drain interconnect 72 are indicated by single-dashed lines. The gate interconnect 68, the source interconnect 70, and the drain interconnect 72 are located above the source electrode 26 and the drain electrode 28 in the Z-axis direction. The gate interconnect 68 may extend in the X-axis direction and may be arranged above the connection portion 66 of the gate electrode 22. The source interconnect 70 and the drain interconnect 72 may extend in the X-axis direction and respectively intersect with the source electrode 26 and the drain electrode 28 in plan view. In an example, the gate electrode 22 may be electrically connected to the gate interconnect 68 through vias 74 arranged on the connection portion 66. The source electrode 26 may be electrically connected to the source interconnect 70 through vias 76. The drain electrode 28 may be electrically connected to the drain interconnect 72 through vias 78.

The planar layout of the nitride semiconductor device 10 is not limited to the example shown in FIG. 1. Any other planar layout can be applied to the nitride semiconductor device 10.

Detail of Gate Layer

Referring again to FIG. 2, the gate layer 20 may include a first GaN layer 32, in contact with the gate electrode 22, and a second GaN layer 34, in contact with the electron supply layer 18. The first GaN layer 32 is composed of Ga-polar GaN. The second GaN layer 34 is composed of N-polar GaN.

In GaN crystal having a wurtzite structure, Ga atoms and N atoms are slightly offset from each other in the c-axial direction extending in direction. Hence, the crystal structure is asymmetrical. The asymmetry produces polarization and results in the c-plane (0001) of the GaN crystal being a polar surface. Ga-polar GaN refers to GaN resulting from crystal growth during which Ga atoms are arranged in the outermost surface of the growing film. The upper surface of the Ga-polar GaN is referred to as a Ga-polar surface. N-polar GaN refers to GaN resulting from crystal growth during which N atoms are arranged in the outermost surface of the growing film. The upper surface of the N-polar GaN is referred to as a N-polar surface.

Figure 3B:
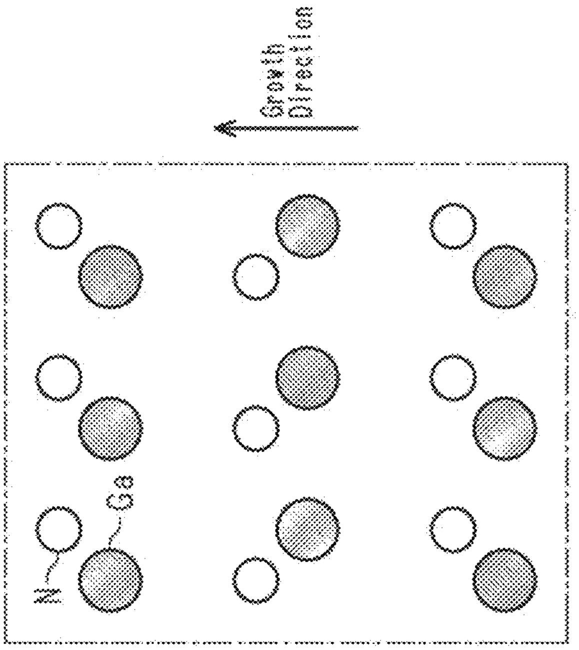
FIGS. 3A and 3B are diagrams showing crystal structures of Ga-polar GaN and N-polar GaN, respectively.
Figure 3A:
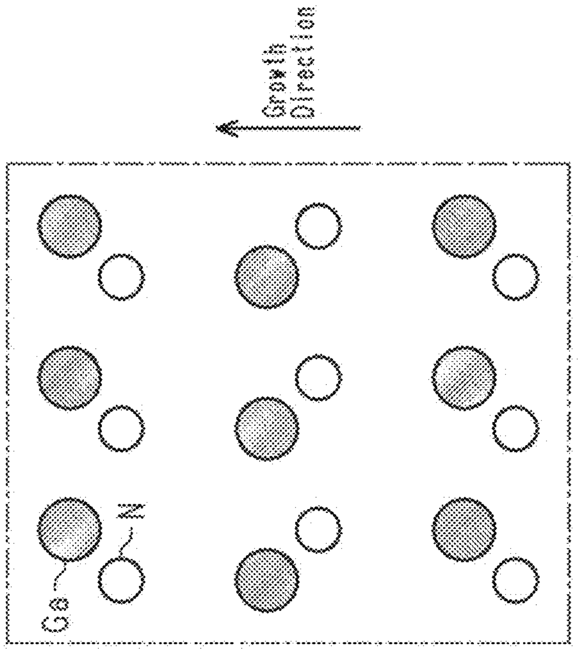

FIGS. 3A and 3B are diagrams showing crystal structures of Ga-polar GaN and N-polar GaN, respectively. In FIGS. 3A and 3B, the arrows indicate the growth direction of GaN crystal. As shown in FIG. 3A, in Ga-polar GaN, Ga atoms are arranged above N atoms in the growth direction. As shown in FIG. 3B, in N-polar GaN, N atoms are arranged above Ga atoms in the growth direction. The arrangement of Ga atoms and N atoms may be identified by observing a GaN crystal with, for example, a spherical aberration corrected scanning transmission electron microscope.

Referring again to FIG. 2, the gate layer 20 includes an upper surface 20A in contact with the gate electrode 22 and a bottom surface 20B in contact with the electron supply layer 18. The gate layer 20 grows on the electron supply layer 18. Thus, the growth direction of the gate layer 20 conforms to a direction (Z-axis direction in FIG. 2) extending from the bottom surface 20B of the gate layer 20 toward the upper surface 20A.

The upper surface 20A of the gate layer 20 corresponds to the upper surface of the first GaN layer 32, which is Ga-polar GaN. Therefore, the upper surface 20A of the gate layer 20 is a Ga-polar surface. The gate electrode 22 is in contact with the upper surface 20A of the gate layer 20, that is, the Ga-polar surface. The upper surface 20A of the gate layer 20 forms a Schottky junction with the gate electrode 22. The bottom surface 20B of the gate layer 20 corresponds to the bottom surface of the second GaN layer 34, which is N-polar GaN. Therefore, the bottom surface 20B of the gate layer 20 is a Ga-polar surface. The electron supply layer 18 is in contact with the bottom surface 20B of the gate layer 20, that is, the Ga-polar surface.

In the gate layer 20, the polarity of the GaN crystal is reversed in the interface of the first GaN layer 32 and the second GaN layer 34. The interface of the first GaN layer 32 and the second GaN layer 34 does not necessarily have to be flat. An intermediate layer that includes GaN having multiple polarities may be present between the first GaN layer 32 and the second GaN layer 34.

The first GaN layer 32 may be smaller in thickness than the second GaN layer 34. In an example, the gate layer 20 may have a thickness that is greater than or equal to 100 nm and less than 150 nm. The first GaN layer 32 may have a thickness that is greater than or equal to 5 nm and less than 30 nm.

In an example, the first GaN layer 32 may include a higher concentration of hydrogen than the second GaN layer 34. This may be due to the difference between a carrier gas used to grow the first GaN layer 32 and a carrier gas used to grow the second GaN layer 34, which will be described later.

The second GaN layer 34 may include a ridge 36 that is covered by the first GaN layer 32 and a first extension 38 and a second extension 40 that are smaller in thickness than the ridge 36. The ridge 36 includes an upper surface 34A of the second GaN layer 34. The first GaN layer 32 may be formed on the upper surface 34A of the second GaN layer 34. Each of the ridge 36, the first extension 38, and the second extension 40 is in contact with the electron supply layer 18. The first extension 38 and the second extension 40 extend outward from the ridge 36 in plan view. In the present disclosure, the first extension 38 and the second extension 40 may also be simply referred to as "extensions." In an example, the gate layer 20 may include at least one of the first extension 38 and the second extension 40. When the gate layer 20 includes at least one of the first extension 38 and the second extension 40, local concentration of an electric field in the gate layer 20 is limited. The first extension 38 and the second extension 40 are not shown in FIG. 1.

The first extension 38 extends from the ridge 36 toward the first opening 24A. The passivation layer 24 is arranged between the first extension 38 and the source electrode 26, which is embedded in the first opening 24A.

The second extension 40 extends from the ridge 36 toward the second opening 24B. The passivation layer 24 is arranged between the second extension 40 and the drain electrode 28, which is embedded in the second opening 24B.

The ridge 36 is arranged between the first extension 38 and the second extension 40 and formed integrally with the first extension 38 and the second extension 40. Since the gate layer 20 includes the first extension 38 and the second extension 40, the bottom surface 20B is greater in area than the upper surface 20A. In the example shown in FIG. 2, the second extension 40 may extend longer than the first extension 38 outward from the ridge 36 in plan view. In other words, the second extension 40 may be greater in dimension in the X-axis direction than the first extension 38. The dimension of the first extension 38 in the X-axis direction may be, for example, in a range of 0.2 μm to 0.3 μm. The dimension of the second extension 40 in the X-axis direction may be, for example, in a range of 0.2 μm to 0.6 μm.

The ridge 36 corresponds to a relatively thick portion of the second GaN layer 34. The ridge 36 may have a thickness, for example, in a range of 80 nm to 150 nm. In an example, the thickness of the ridge 36 may be greater than 110 nm.

Each of the first extension 38 and the second extension 40 is smaller in thickness than the ridge 36. In an example, the thickness of each of the first extension 38 and the second extension 40 may be less than or equal to one-half of the thickness of the ridge 36.

The first extension 38 may include a first step portion 42 having a substantially constant thickness and a first intermediate portion 44 connecting the first step portion 42 to the ridge 36. In this specification, "substantially constant thickness" refers to a thickness within a manufacturing variation range (for example, 20%). In an example, the first step portion 42 may have a thickness in a range of 5 nm to 25 nm. The first intermediate portion 44 may have a thickness that is greater than or equal to the thickness of the first step portion 42 and less than the thickness of the ridge 36.

The second extension 40 may also include a second step portion 46 having a substantially constant thickness and a second intermediate portion 48 connecting the second step portion 46 to the ridge 36. In an example, the second step portion 46 may have a thickness in a range of 5 nm to 25 nm. The second intermediate portion 48 may have a thickness that is greater than or equal to the thickness of the second step portion 46 and less than the thickness of the ridge 36. The second step portion 46 and the first step portion 42 may be equal in thickness.

The first extension 38 is composed of N-polar GaN. Thus, the first extension 38 may include an upper surface 38A that is at least partially a N-polar surface. More specifically, the N-polar surface may be a portion of the upper surface 38A of the first extension 38 included in the first step portion 42.

The second extension 40 is composed of N-polar GaN. Thus, the second extension 40 may include an upper surface 40A that is at least partially a N-polar surface. More specifically, the N-polar surface may be a portion of the upper surface 40A of the second extension 40 included in the second step portion 46.

Method for Manufacturing Nitride Semiconductor Device

An example of a method for manufacturing the nitride semiconductor device 10 shown in FIG. 2 will be described. FIGS. 4 to 10 are schematic cross-sectional views showing an example of manufacturing steps of the nitride semiconductor device 10. To facilitate understanding, in FIGS. 4 to 10, the same reference characters are given to those components that are the same as the corresponding components shown in FIG. 2.

A method for manufacturing the nitride semiconductor device 10 includes forming the electron transit layer 16 composed of a nitride semiconductor and forming the electron supply layer 18 on the electron transit layer 16, the electron supply layer 18 being composed of a nitride semiconductor having a band gap that is larger than that of the electron transit layer 16.

Figure 4:
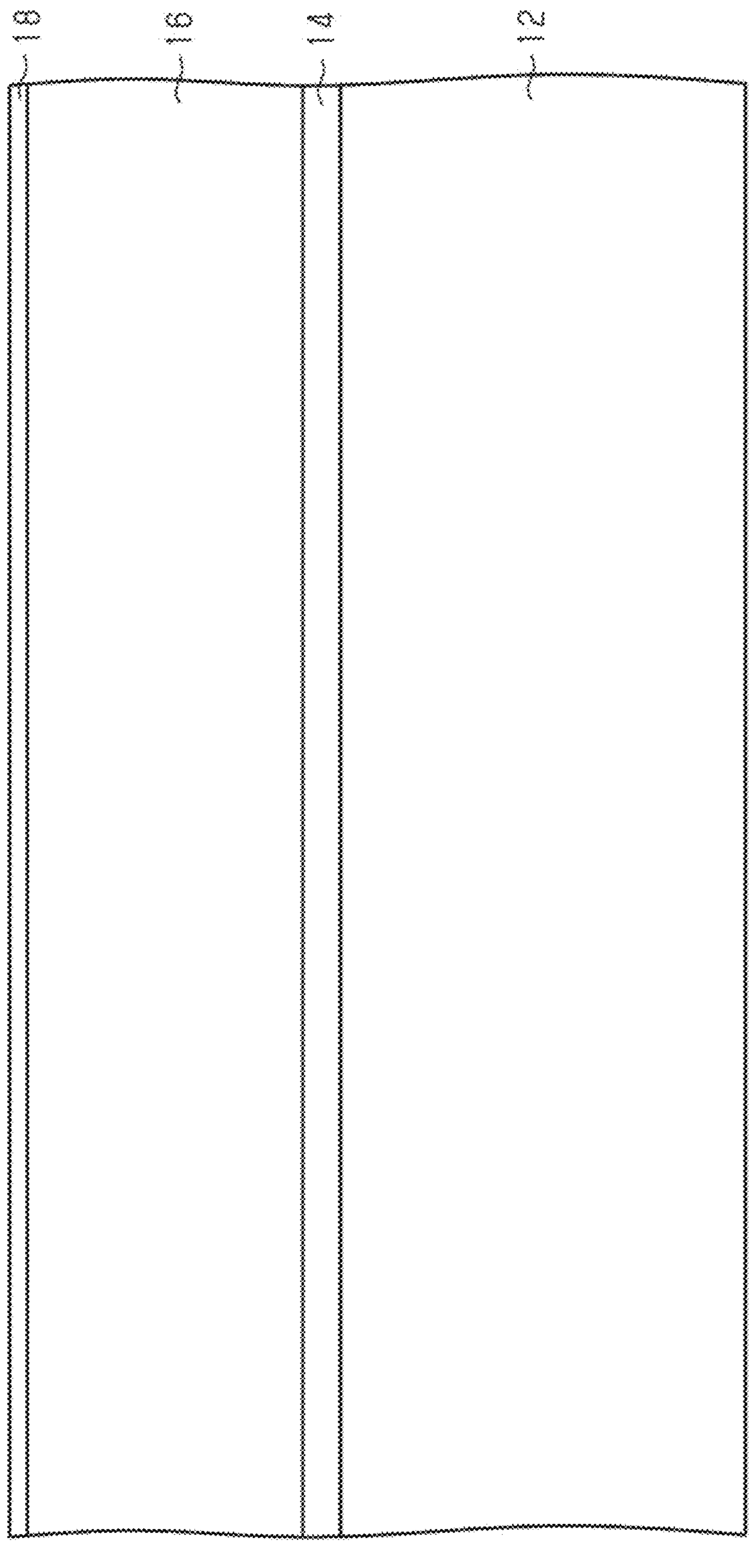
FIG. 4 is a schematic cross-sectional view showing an exemplary step for manufacturing the nitride semiconductor device shown in FIG. 2.

As shown in FIG. 4, the buffer layer 14 may be formed on the semiconductor substrate 12, which is, for example, a Si substrate. Subsequently, the electron transit layer 16 may be formed on the buffer layer 14. Metal organic chemical vapor deposition (MOCVD) may be used to epitaxially grow the buffer layer 14, the electron transit layer 16, and the electron supply layer 18.

Although not shown in detail, in an example, the buffer layer 14 may be a multilayer buffer layer. The multilayer buffer layer may include an AlN layer (first buffer layer) formed on the semiconductor substrate 12 and a graded AlGaN layer (second buffer layer) formed on the AlN layer. The graded AlGaN layer may be formed, for example, by stacking three AlGaN layers having Al compositions of 75%, 50%, and 25% in the order from the side of the AlN layer.

The electron transit layer 16 formed on the buffer layer 14 may be a GaN layer. The electron supply layer 18 formed on the electron transit layer 16 may be an AlGaN layer. Thus, the electron supply layer 18 is composed of a nitride semiconductor having a band gap that is larger than that of the electron transit layer 16.

The method for manufacturing the nitride semiconductor device 10 further includes forming the gate layer 20 on the electron supply layer 18, the gate layer 20 being composed of a nitride semiconductor including an acceptor impurity, forming the gate electrode 22 on the gate layer 20, and forming the source electrode 26 and the drain electrode 28 on the electron supply layer 18.

Figure 5:
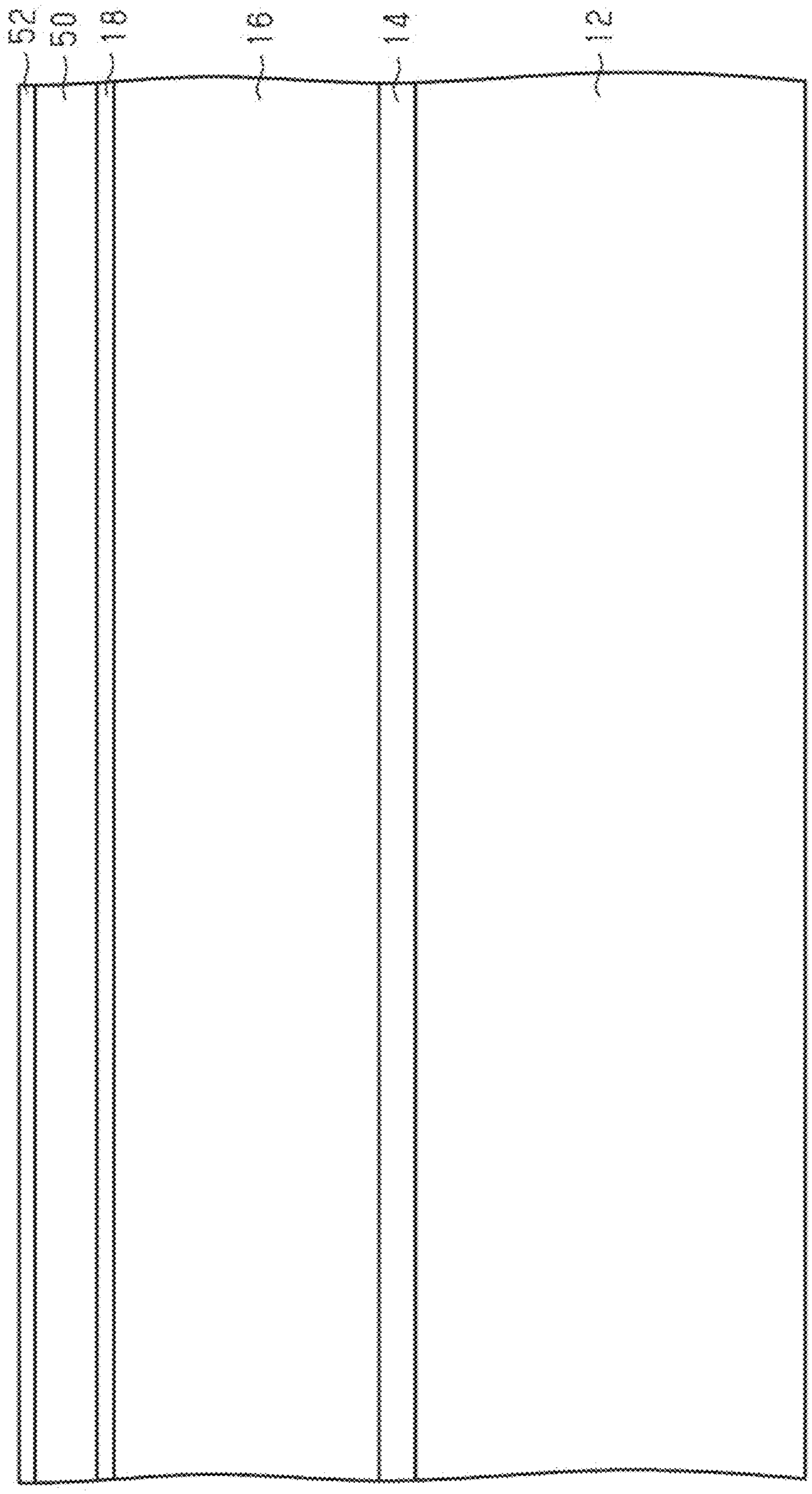
FIG. 5 is a schematic cross-sectional view showing a manufacturing step subsequent to the step shown in FIG. 4.

FIG. 5 is a schematic cross-sectional view showing a manufacturing step subsequent to the step shown in FIG. 4. As shown in FIG. 5, a first nitride semiconductor layer 50 is formed on the electron supply layer 18. Subsequently, a second nitride semiconductor layer 52 is formed on the first nitride semiconductor layer 50. The first nitride semiconductor layer 50 and the second nitride semiconductor layer 52 may be epitaxially grown by MOCVD. The first nitride semiconductor layer 50 and the second nitride semiconductor layer 52 may be composed of a nitride semiconductor including an acceptor impurity. In an example, the first nitride semiconductor layer 50 and the second nitride semiconductor layer 52 including an acceptor impurity may be formed by doping the first nitride semiconductor layer 50 and the second nitride semiconductor layer 52 with magnesium during the growth. The amount of magnesium, as a dopant in the first nitride semiconductor layer 50 and the second nitride semiconductor layer 52, may be adjusted by controlling, for example, the growth temperature and the flow rate of a doping gas (e.g., biscyclopentadienyl magnesium ($Cp_2Mg$)) supplied to the growth chamber. In an example, the first nitride semiconductor layer 50 and the second nitride semiconductor layer 52 may include magnesium as an impurity at a concentration that is greater than or equal to $1\times10^{18}$ $cm^{-3}$ and less than $1\times10^{20}$ $cm^{-3}$.

Each of the first nitride semiconductor layer 50 and the second nitride semiconductor layer 52 may be formed of GaN. The first nitride semiconductor layer 50 and the second nitride semiconductor layer 52 having different polarities may be formed by controlling carrier gases used to grow GaN. More specifically, the first nitride semiconductor layer 50 is N-polar GaN that grows when nitrogen ($N_2$) is used as the carrier gas. The second nitride semiconductor layer 52 is Ga-polar GaN that grows when hydrogen ($H_2$) is used as the carrier gas. The first GaN layer 32 shown in FIG. 2 is formed of a portion of the second nitride semiconductor layer 52. The second GaN layer 34 shown in FIG. 2 is formed of a portion of the first nitride semiconductor layer 50.

When starting the GaN crystal growth on the electron supply layer 18, $N_2$ is used as the carrier gas. While $N_2$ is used as the carrier gas, the growth of GaN crystal proceeds so that N atoms are arranged in the outermost surface. When the carrier gas is changed from $N_2$ to $H_2$, the growth of GaN crystal proceeds so that Ga atoms are arranged in the outermost surface. This forms the first nitride semiconductor layer 50, which is N-polar GaN, on the electron supply layer 18 and then forms the second nitride semiconductor layer 52, which is Ga-polar GaN, on the first nitride semiconductor layer 50. In an example, the second nitride semiconductor layer 52 may be formed to have a smaller thickness than the first nitride semiconductor layer 50. The first nitride semiconductor layer 50, which is N-polar GaN, has a superior thickness uniformity to the second nitride semiconductor layer 52, which is Ga-polar GaN.

Figure 6:
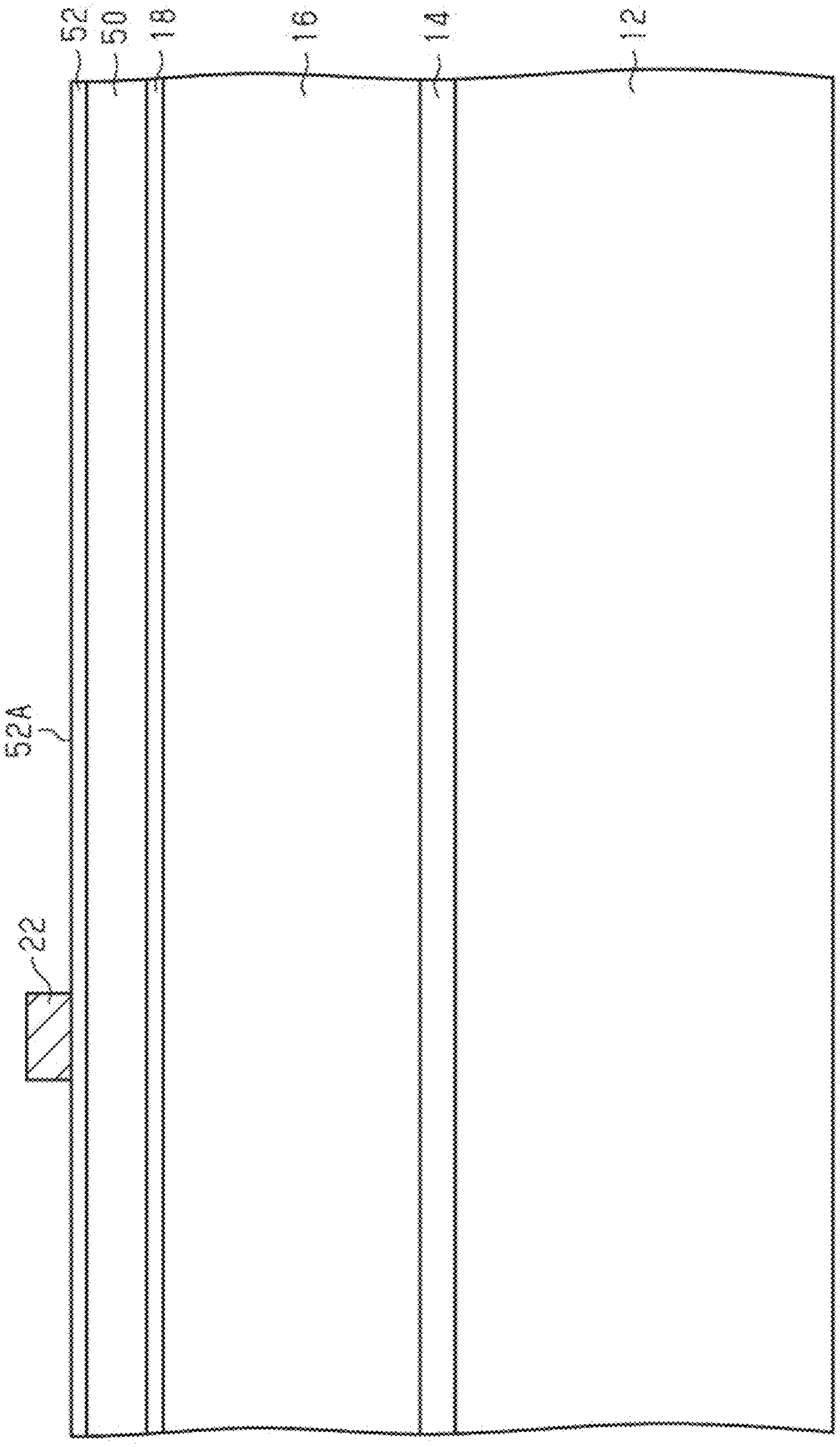
FIG. 6 is a schematic cross-sectional view showing a manufacturing step subsequent to the step shown in FIG. 5.

FIG. 6 is a schematic cross-sectional view showing a manufacturing step subsequent to the step shown in FIG. 5. As shown in FIG. 6, the gate electrode 22 is formed on the second nitride semiconductor layer 52. The gate electrode 22 may be formed by forming a metal layer (not shown) on the second nitride semiconductor layer 52 and then selectively removing the metal layer through lithography and etching.

The gate electrode 22 is formed on the second nitride semiconductor layer 52, which is Ga-polar GaN. The second nitride semiconductor layer 52, which is Ga-polar GaN, includes an upper surface 52A that is a Ga-polar surface. Thus, the gate electrode 22 is in contact with the upper surface 52A, or the Ga-polar surface, of the second nitride semiconductor layer 52.

Figure 7:
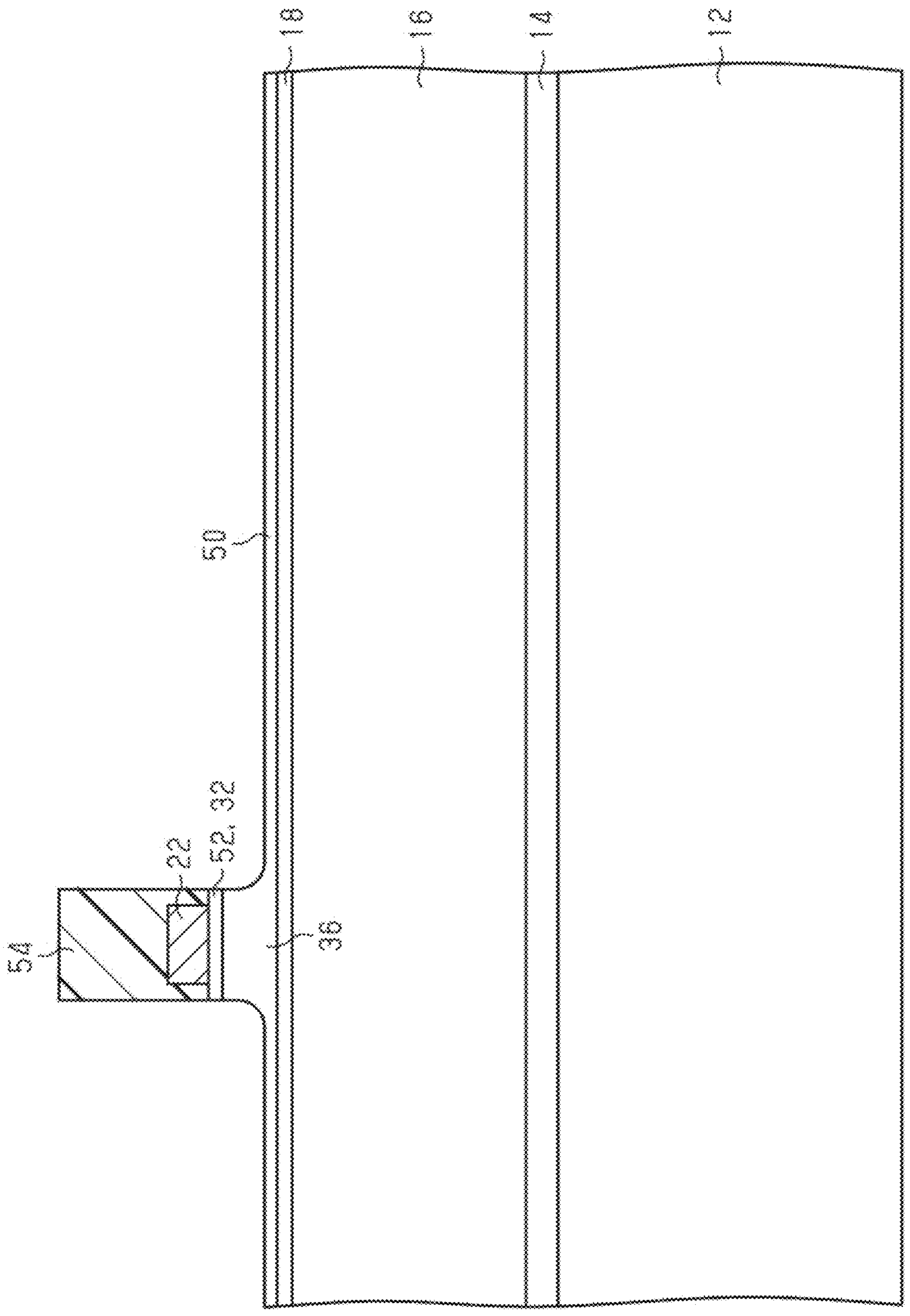
FIG. 7 is a schematic cross-sectional view showing a manufacturing step subsequent to the step shown in FIG. 6.

FIG. 7 is a schematic cross-sectional view showing a manufacturing step subsequent to the step shown in FIG. 6. As shown in FIG. 7, a mask 54 is formed to cover the upper surface and the side surfaces of the gate electrode 22 and a region of the second nitride semiconductor layer 52 surrounding the gate electrode 22. The mask 54 is used to etch the first nitride semiconductor layer 50 and the second nitride semiconductor layer 52. Consequently, the first nitride semiconductor layer 50 and the second nitride semiconductor layer 52 that is located under the mask 54 remains after the etching. This forms the ridge 36 of the second GaN layer 34 and the first GaN layer 32 located on the ridge 36, which have been described with reference to FIG. 2. The second nitride semiconductor layer 52 that is not covered by the mask 54 is removed by etching. The thickness of the first nitride semiconductor layer 50 in a region that is not covered by the mask 54 may be decreased by etching to be less than or equal to one-half of the thickness of the ridge 36. The mask 54 is removed after the etching.

Figure 8:
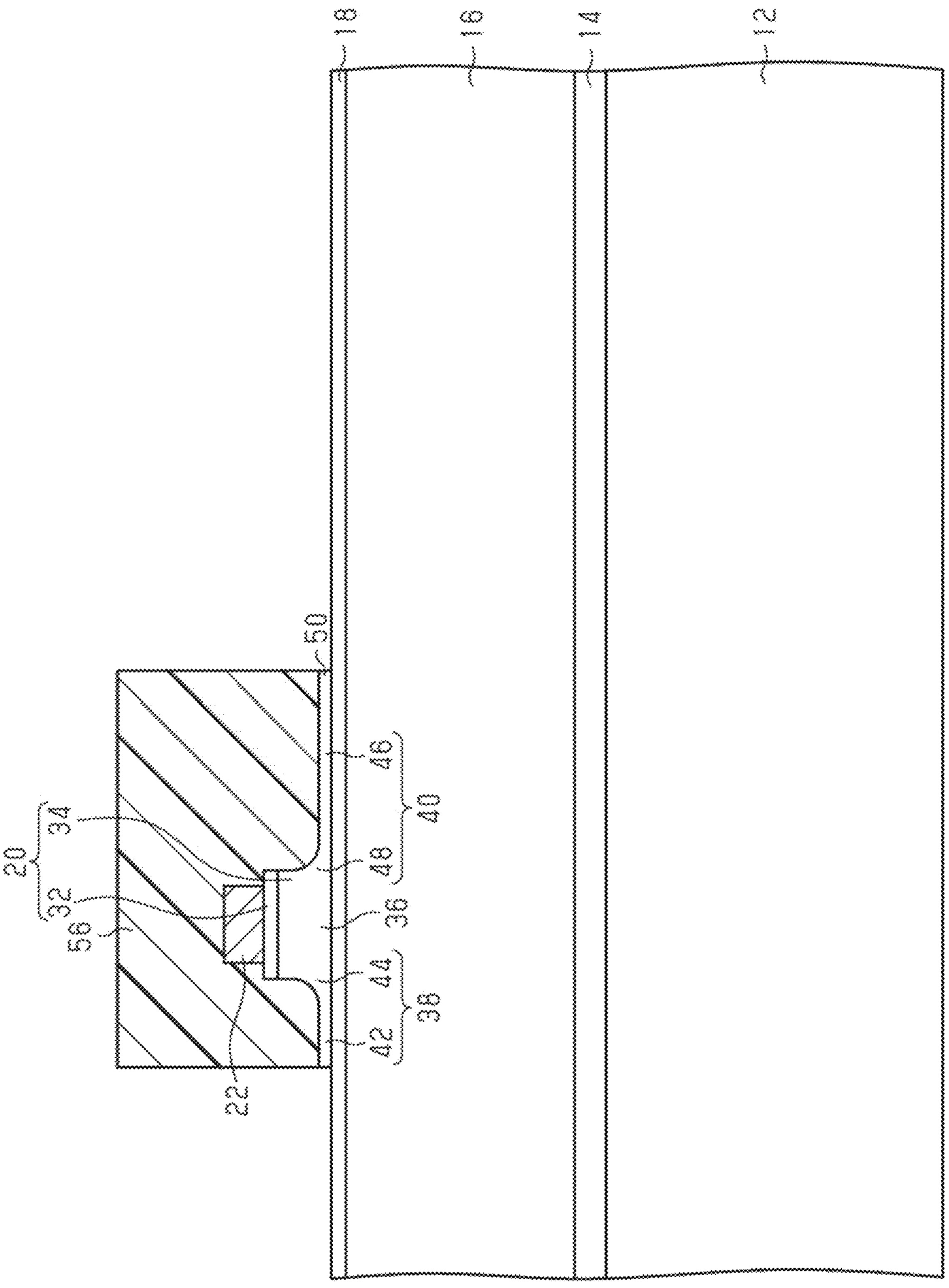
FIG. 8 is a schematic cross-sectional view showing a manufacturing step subsequent to the step shown in FIG. 7.

FIG. 8 is a schematic cross-sectional view showing a manufacturing step subsequent to the step shown in FIG. 7. As shown in FIG. 8, a mask 56 is formed to cover the upper surface and the side surfaces of the gate electrode 22, the ridge 36, and a region of the first nitride semiconductor layer 50 surrounding the ridge 36. The mask 56 is used to etch the first nitride semiconductor layer 50. Consequently, the first nitride semiconductor layer 50 located under the mask 56 remains after the etching. This forms the second GaN layer 34 including the ridge 36, the first extension 38, and the second extension 40. The mask 56 is removed after the etching. The etching steps shown in FIGS. 7 and 8 obtain the gate layer 20 including the first GaN layer 32 and the second GaN layer 34. The shape of the gate layer 20 may vary depending on the etching condition. The first extension 38 may include the first step portion 42 having a substantially constant thickness and the first intermediate portion 44 connecting the first step portion 42 to the ridge 36. The second extension 40 may also include the second step portion 46 having a substantially constant thickness and the second intermediate portion 48 connecting the second step portion 46 to the ridge 36.

Figure 9:
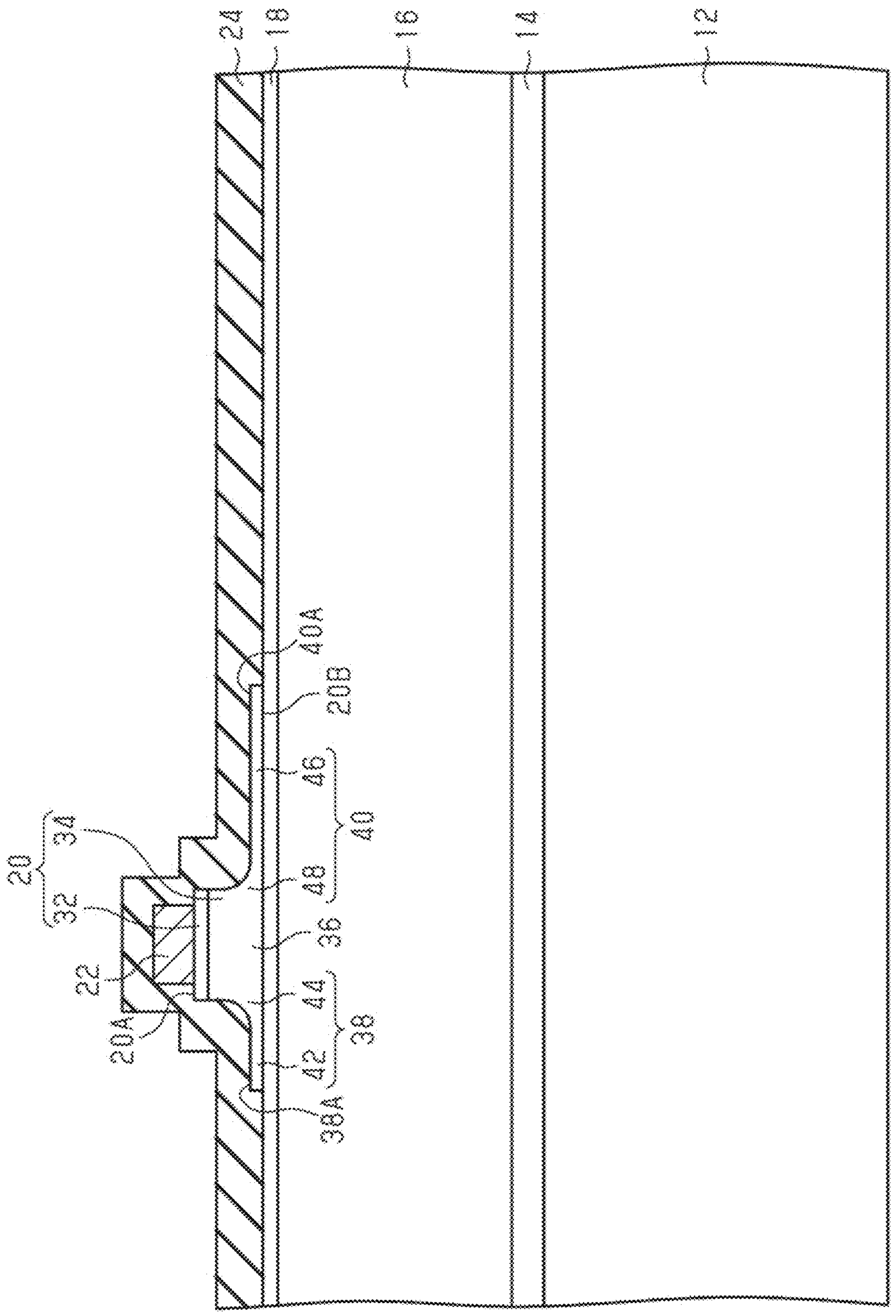
FIG. 9 is a schematic cross-sectional view showing a manufacturing step subsequent to the step shown in FIG. 8.

FIG. 9 is a schematic cross-sectional view showing a manufacturing step subsequent to the step shown in FIG. 8. As shown in FIG. 9, the method for manufacturing the nitride semiconductor device 10 further includes forming the passivation layer 24 to cover the entirety of exposed surfaces of the electron supply layer 18, the gate layer 20, and the gate electrode 22. In an example, the passivation layer 24 may be a SiN layer formed by low-pressure chemical vapor deposition (LPCVD).

The passivation layer 24 covers a portion of the upper surface 20A of the gate layer 20. The upper surface 20A of the gate layer 20 is a Ga-polar surface. The passivation layer 24 also covers the upper surface 38A of the first extension 38 and the upper surface 40A of the second extension 40. The first extension 38 and the second extension 40 are portions of the second GaN layer 34 composed of N-polar GaN. Therefore, the upper surface 38A of the first extension 38 is at least partially a N-polar surface. The upper surface 40A of the second extension 40 is at least partially a N-polar surface. Thus, the surfaces of the gate layer 20 covered by the passivation layer 24 include both the Ga-polar surface and the N-polar surface.

Figure 10:
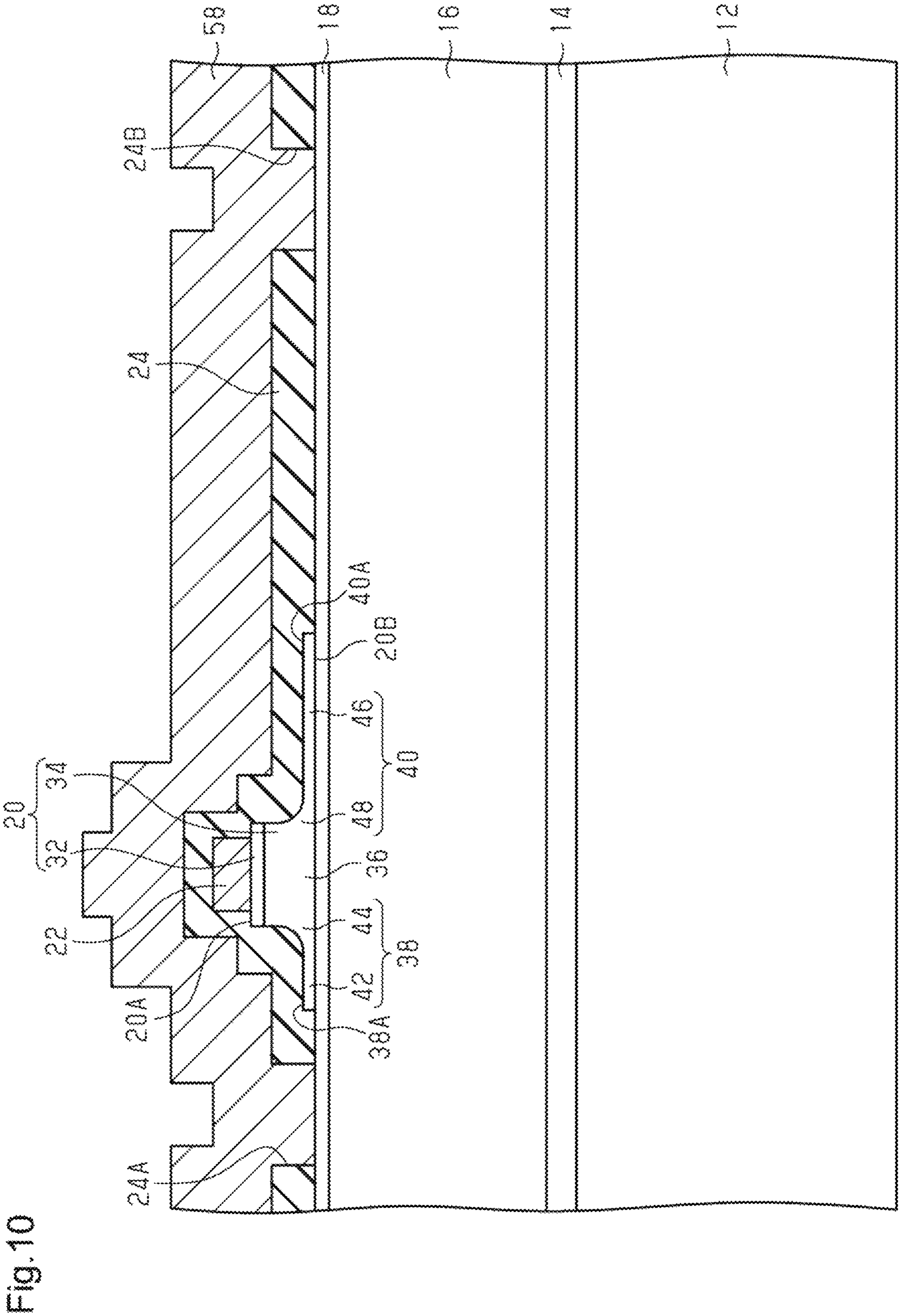
FIG. 10 is a schematic cross-sectional view showing a manufacturing step subsequent to the step shown in FIG. 9.

FIG. 10 is a schematic cross-sectional view showing a manufacturing step subsequent to the step shown in FIG. 9. As shown in FIG. 10, the first opening 24A and the second opening 24B are formed in the passivation layer 24. Then, a metal layer 58 is formed to cover the passivation layer 24. This step forms the first opening 24A and the second opening 24B extending through the passivation layer 24 and exposing the electron supply layer 18. The first opening 24A and the second opening 24B are formed such that the gate layer 20 is located between the first opening 24A and the second opening 24B. The gate layer 20 may be located closer to the first opening 24A than to the second opening 24B. The metal layer 58 is formed to fill the first opening 24A and the second opening 24B and contact the electron supply layer 18 through the first opening 24A and the second opening 24B. In an example, the metal layer 58 may include at least one of a Ti layer, a TiN layer, an Al layer, an AlSiCu layer, and an AlCu layer.

The metal layer 58 is selectively removed by lithography and etching to form the source electrode 26, the drain electrode 28, and the field plate electrode 30 shown in FIG. 2. As a result, the nitride semiconductor device 10 shown in FIG. 2 is obtained.

As described above, the forming the gate layer 20 includes forming the first nitride semiconductor layer 50, which is N-polar GaN that grows on the electron supply layer 18 when $N_2$ is used as the carrier gas, and forming the second nitride semiconductor layer 52, which is Ga-polar GaN that grows on the first nitride semiconductor layer 50 when $H_2$ is used as the carrier gas.

Operation of Nitride Semiconductor Device

The operation of the nitride semiconductor device 10 of the present embodiment will be described below. When a voltage exceeding the gate threshold voltage is applied to the gate electrode 22 of the nitride semiconductor device 10, a channel of the 2DEG is formed in the electron transit layer 16 and establishes a source-drain connection. In contrast, in the zero bias state, the 2DEG is not formed in at least a portion of the region of the electron transit layer 16 located under the gate layer 20. This is because the acceptor impurity contained in the gate layer 20 raises the energy levels of the electron transit layer 16 and the electron supply layer 18. As a result, the 2DEG is depleted. This achieves the normally-off operation of the nitride semiconductor device 10.

The gate threshold voltage of the nitride semiconductor device 10 depends on a Schottky barrier formed between the gate electrode 22 and the gate layer 20 in addition to an energy barrier formed by the electron supply layer 18. The gate threshold voltage of the nitride semiconductor device 10 may be increased by, for example, increasing the height of the Schottky barrier between the gate electrode 22 and the gate layer 20. The height of the Schottky barrier between the gate electrode 22 and the gate layer 20 is affected by the state of the upper surface 20A of the gate layer 20 that is in contact with the gate electrode 22. When forming a junction between a metal layer and a GaN layer, the height of the Schottky barrier between the metal layer and the GaN layer is greater when the surface of the GaN layer that contacts the metal layer is a Ga-polar surface than when the surface is a N-polar surface.

In this regard, in the nitride semiconductor device 10 of the present embodiment, the upper surface 20A of the gate layer 20 that is in contact with the gate electrode 22 is a Ga-polar surface. Thus, the height of the Schottky barrier between the gate electrode 22 and the gate layer 20 is increased. The upper surface 20A of the gate layer 20 being a Ga-polar surface has a relatively small effect on device parameters (e.g., on-resistance and maximum rated voltage) other than the gate threshold voltage. The nitride semiconductor device 10 of the present embodiment increases the gate threshold voltage while limiting the effect on other device parameters.

The nitride semiconductor device 10 of the present embodiment has the following advantages.

(1-1) The gate layer 20 includes the upper surface 20A in contact with the gate electrode 22. The upper surface 20A is a Ga-polar surface. This increases the height of the Schottky barrier between the gate electrode 22 and the gate layer 20. Thus, while the effect on other device parameters is limited, the gate threshold voltage is increased.

(1-2) The gate layer 20 may include the first GaN layer 32, in contact with the gate electrode 22, and the second GaN layer 34, in contact with the electron supply layer 18. The first GaN layer 32 is composed of Ga-polar GaN. The second GaN layer 34 is composed of N-polar GaN. In the gate layer 20, the second GaN layer 34 composed of N-polar GaN has a superior thickness uniformity than the first GaN layer 32 composed of Ga-polar GaN. This improves the thickness uniformity of the gate layer 20 as compared to when the gate layer 20 is composed of only Ga-polar GaN.

(1-3) The second GaN layer 34 may be greater in thickness than the first GaN layer 32. In the gate layer 20, the second GaN layer 34 is included in a greater proportion than the first GaN layer 32. The second GaN layer 34 is composed of N-polar GaN having a superior thickness uniformity than the first GaN layer 32 composed of Ga-polar GaN. This further improves the thickness uniformity of the gate layer 20.

(1-4) The gate layer 20 may have a thickness that is greater than or equal to 100 nm and less than 150 nm. The first GaN layer 32 may have a thickness that is greater than or equal to 5 nm and less than 30 nm. This increases the gate threshold voltage while maintaining a desired thickness uniformity of the gate layer 20.

(1-5) The second GaN layer 34 may include the ridge 36 that is in contact with the electron supply layer 18 and covered by the first GaN layer 32 and the extension (the first extension 38 and/or the second extension 40) that is in contact with the electron supply layer 18 and extends outward from the ridge 36 in plan view. The first extension 38 and the second extension 40 are smaller in thickness than the ridge 36. When the second GaN layer 34 includes the first extension 38 and/or the second extension 40 that is smaller in thickness than the ridge 36, local concentration of an electric field in the gate layer 20 is limited. This improves the gate reliability of the nitride semiconductor device 10.

Modified Example of Gate Layer

Figure 11:
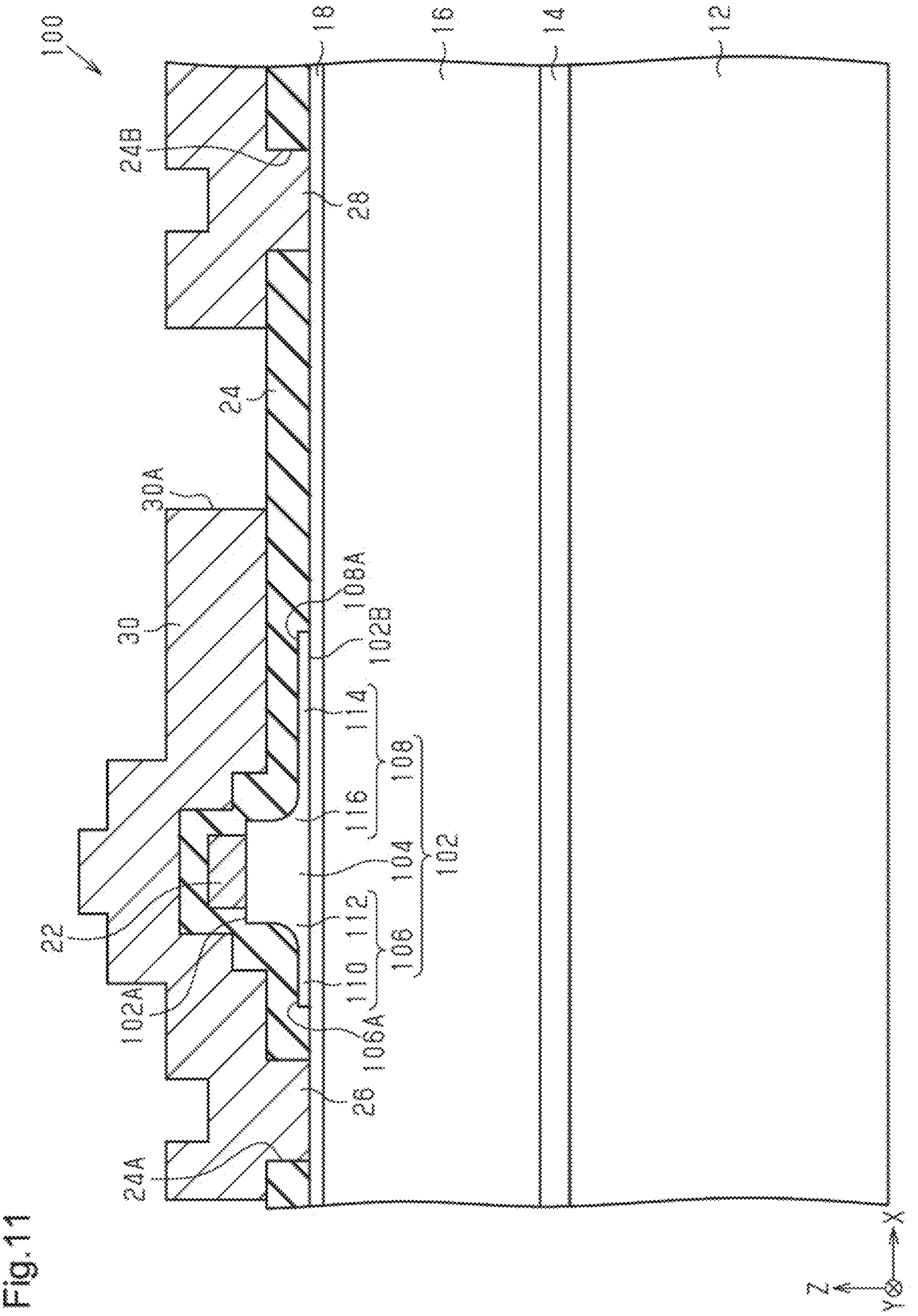
FIG. 11 is a schematic cross-sectional view showing a modified example of an exemplary nitride semiconductor device.

FIG. 11 is a schematic cross-sectional view of an exemplary nitride semiconductor device 100 showing a modified example of a gate layer. In FIG. 11, the same reference characters are given to those components that are the same as the corresponding components of the nitride semiconductor device 10 shown in FIG. 2. Such components will not be described in detail.

As shown in FIG. 11, the nitride semiconductor device 100 includes a gate layer 102 formed on the electron supply layer 18. The gate layer 102 includes an upper surface 102A in contact with the gate electrode 22 and a bottom surface 102B in contact with the electron supply layer 18. The gate layer 102 grows on the electron supply layer 18. Thus, the growth direction of the gate layer 102 conforms to a direction (Z-axis direction shown in FIG. 11) extending from the bottom surface 102B of the gate layer 102 toward the upper surface 102A.

The gate layer 102 is composed of Ga-polar GaN. Therefore, the upper surface 102A of the gate layer 102 is a Ga-polar surface. The gate electrode 22 is in contact with the upper surface 102A of the gate layer 102, that is, the Ga-polar surface. The upper surface 102A of the gate layer 102 forms a Schottky junction with the gate electrode 22. The bottom surface 102B of the gate layer 102 is a N-polar surface. The electron supply layer 18 is in contact with the bottom surface 102B of the gate layer 102, that is, the N-polar surface.

In the nitride semiconductor device 100, the upper surface 102A of the gate layer 102 that is in contact with the gate electrode 22 is a Ga-polar surface. Thus, the height of the Schottky barrier between the gate electrode 22 and the gate layer 102 is increased. The upper surface 102A of the gate layer 102 being a Ga-polar surface has a relatively small effect on device parameters other than the gate threshold voltage. While the effect on other device parameters is limited, the gate threshold voltage is increased.

The gate layer 102 may include a ridge 104 including the upper surface 102A of the gate layer 102 and a first extension 106 and a second extension 108 that are smaller in thickness than the ridge 104. The gate electrode 22 is formed on the ridge 104. Each of the ridge 104, the first extension 106, and the second extension 108 is in contact with the electron supply layer 18. The first extension 106 and the second extension 108 extend outward from the ridge 104 in plan view. In the present disclosure, the first extension 106 and the second extension 108 may also be simply referred to as "extensions." In an example, the gate layer 102 may include at least one of the first extension 106 and the second extension 108. When the gate layer 102 includes at least one of the first extension 106 and the second extension 108, local concentration of an electric field in the gate layer 102 is limited. This improves the gate reliability of the nitride semiconductor device 100.

The first extension 106 extends from the ridge 104 toward the first opening 24A. The passivation layer 24 is arranged between the first extension 106 and the source electrode 26, which is embedded in the first opening 24A.

The second extension 108 extends from the ridge 104 toward the second opening 24B. The passivation layer 24 is arranged between the second extension 108 and the drain electrode 28, which is embedded in the second opening 24B.

The ridge 104 is arranged between the first extension 106 and the second extension 108 and formed integrally with the first extension 106 and the second extension 108. Since the gate layer 102 includes the first extension 106 and the second extension 108, the bottom surface 102B is greater in area than the upper surface 102A. In the example shown in FIG. 11, the second extension 108 may extend longer than the first extension 106 outward from the ridge 104 in plan view. In other words, the second extension 108 may be greater in dimension in the X-axis direction than the first extension 106. The dimension of the first extension 106 in the X-axis direction may be, for example, in a range of 0.2 μm to 0.3 μm. The dimension of the second extension 108 in the X-axis direction may be, for example, in a range of 0.2 μm to 0.6 μm.

The ridge 104 corresponds to a relatively thick portion of the gate layer 102. The ridge 104 may have a thickness, for example, in a range of 80 nm to 150 nm. In an example, the thickness of the ridge 104 may be greater than 110 nm.

Each of the first extension 106 and the second extension 108 is smaller in thickness than the ridge 104. In an example, the thickness of each of the first extension 106 and the second extension 108 may be less than or equal to one-half of the thickness of the ridge 104.

The first extension 106 may include the first step portion 110 having a substantially constant thickness and the first intermediate portion 112 connecting the first step portion 110 to the ridge 104. In an example, the first step portion 110 may have a thickness in a range of 5 nm to 25 nm. The first intermediate portion 112 may have a thickness that is greater than or equal to the thickness of the first step portion 110 and less than the thickness of the ridge 104.

The second extension 108 may also include a second step portion 114 having a substantially constant thickness and a second intermediate portion 116 connecting the second step portion 114 to the ridge 104. In an example, the second step portion 114 may have a thickness in a range of 5 nm to 25 nm. The second intermediate portion 116 may have a thickness that is greater than or equal to the thickness of the second step portion 114 and less than the thickness of the ridge 104. The second step portion 114 and the first step portion 110 may be equal in thickness.

The first extension 106 is composed of Ga-polar GaN. Thus, the first extension 106 may include an upper surface 106A that is at least partially a Ga-polar surface. More specifically, the Ga-polar surface may be a portion of the upper surface 106A of the first extension 106 included in the first step portion 110.

The second extension 108 is composed of Ga-polar GaN. Thus, the second extension 108 may include an upper surface 108A that is at least partially a Ga-polar surface. More specifically, the Ga-polar surface may be a portion of the upper surface 108A of the second extension 108 included in the second step portion 114.

The method for manufacturing the nitride semiconductor device 100 may be the same as the method for manufacturing the nitride semiconductor device 10 except that, in the manufacturing process shown in FIG. 5, the first nitride semiconductor layer 50 is not formed and the second nitride semiconductor layer 52 is directly formed on the electron supply layer 18. The method for manufacturing the nitride semiconductor device 100 eliminates the need to control the carrier gas for reversing the polarity of the GaN layer, thereby reducing the complexity of the manufacturing process.

Modified Examples of First Embodiment

The embodiment and the modified examples described above may be modified as follows.

The growth of the GaN crystal to form the gate layer 20 may be controlled by gradually increasing the ratio of $H_2$ to $N_2$ in the carrier gas instead of changing the carrier gas from $N_2$ to $H_2$. In this case, an intermediate layer that includes GaN having different polarities may be present between the first GaN layer 32 and the second GaN layer 34.

In the example shown in FIG. 2, the first extension 38 and the second extension 40 may be omitted from the second GaN layer 34. That is, the second GaN layer 34 may have a substantially uniform thickness. In this case, the second GaN layer 34 and the first GaN layer 32 may have the same width in the X-axis direction.

In the example shown in FIG. 11, the first extension 106 and the second extension 108 may be omitted from the gate layer 102. That is, the gate layer 102 may have a substantially uniform thickness.

Second Embodiment

In a nitride semiconductor device, for example, when a positive voltage is applied to the gate electrode, an electric field may locally concentrate on a portion of the electron supply layer in the vicinity of an end of the gate layer. Such local concentration of an electric field may cause a decrease in the breakdown voltage of the nitride semiconductor device. Second and third embodiments of nitride semiconductor devices reduce concentration of an electric field and will be described below.

Cross-Sectional Structure of Nitride Semiconductor Device

Figure 12:
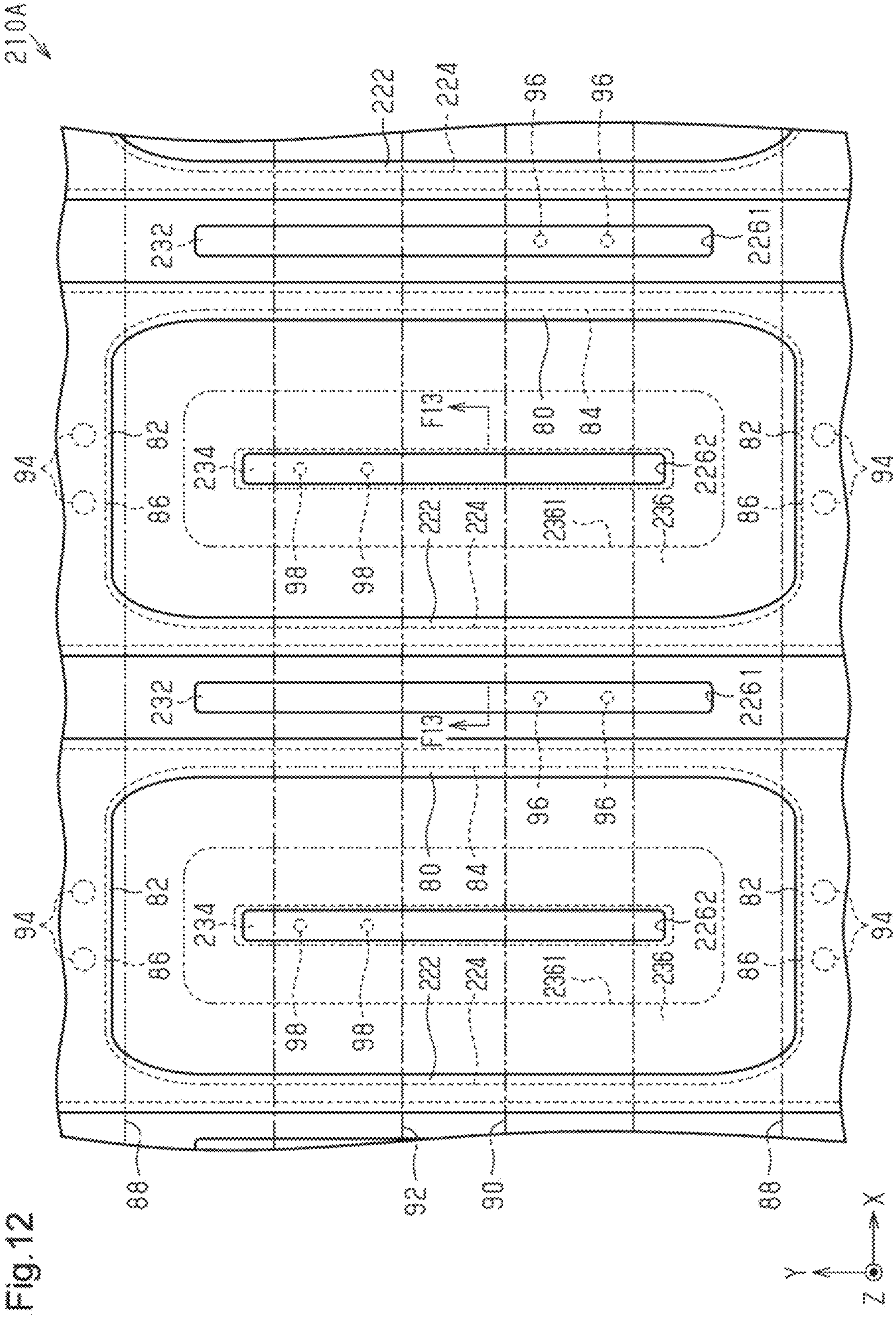
FIG. 12 is a schematic plan view showing a second embodiment of an exemplary nitride semiconductor device.
Figure 13:
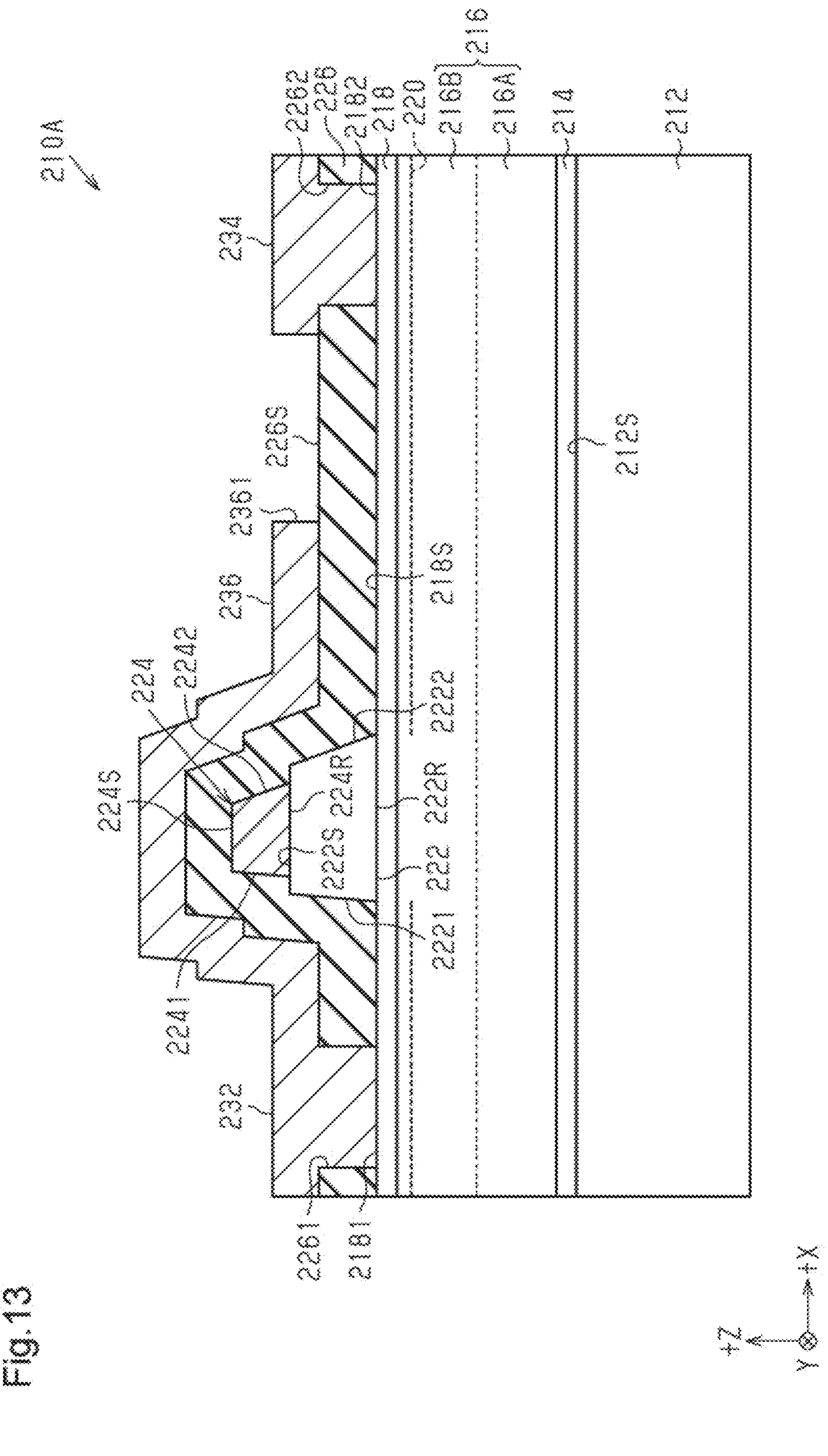
FIG. 13 is a schematic cross-sectional view of the nitride semiconductor device taken along line F13-F13 in FIG. 12.
Figure 14:
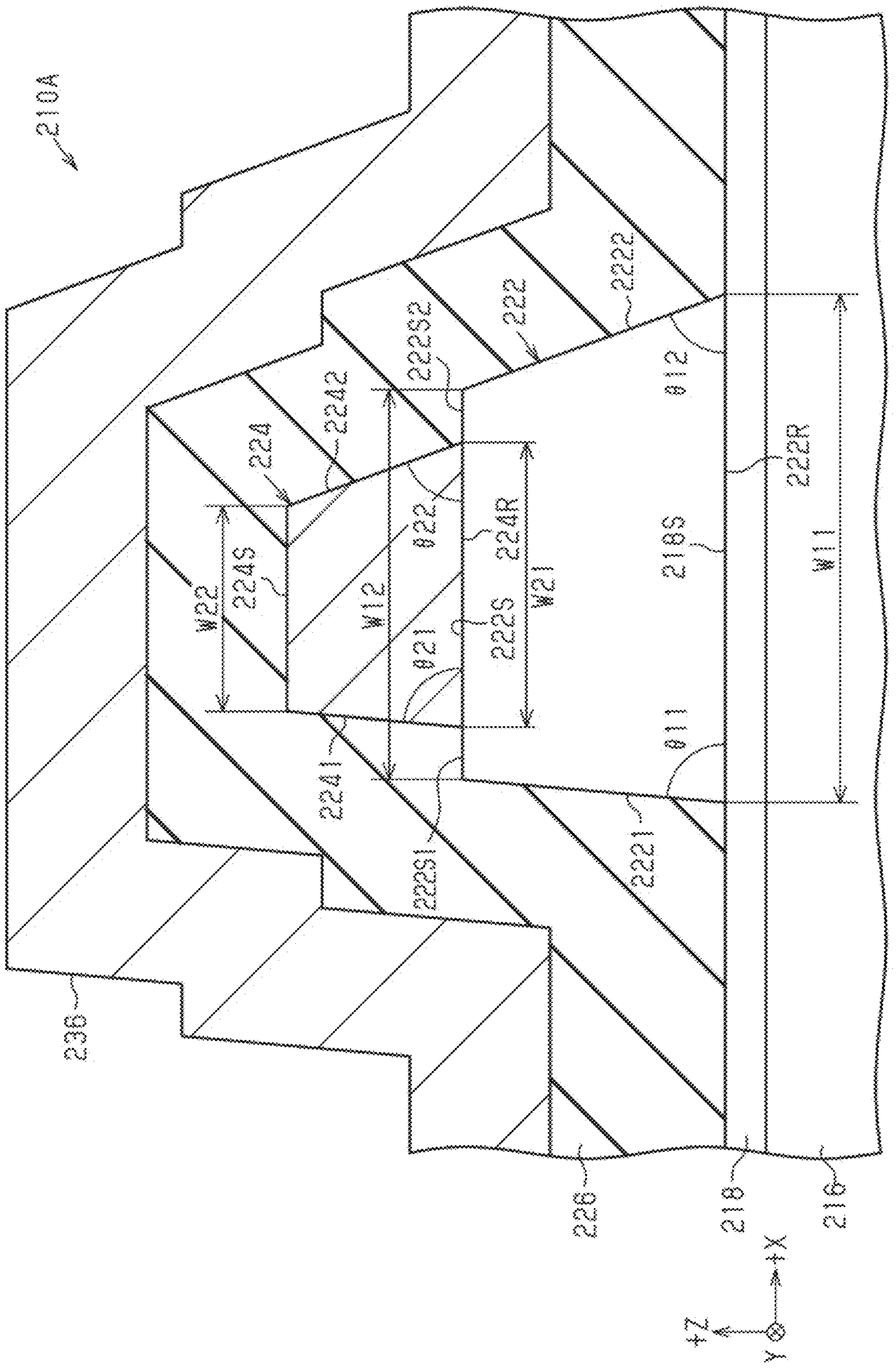
FIG. 14 is a schematic enlarged cross-sectional view showing a portion of FIG. 13.

FIG. 12 is a schematic plan view showing a second embodiment of an exemplary nitride semiconductor device 210A. FIG. 13 is a schematic cross-sectional view of the nitride semiconductor device 210A taken along line F13-F13 in FIG. 12. FIG. 14 is a schematic enlarged cross-sectional view showing a portion of FIG. 13. FIGS. 13 and 14 show the structure of one gate layer 222 and one gate electrode 224 of the nitride semiconductor device 210A.

The term "plan view" used in the present embodiment refers to a view of the nitride semiconductor device 210A in the Z-axis direction when the XYZ-axes are orthogonal to each other as shown in FIG. 13. In the nitride semiconductor device 210A shown in FIG. 13, the +Z direction defines the upper side, and the −Z direction defines the lower side. The +X direction defines the right, and the −X direction defines the left. Unless otherwise specified, "plan view" refers to a view of the nitride semiconductor device 210A taken from above in the Z-axis.

The nitride semiconductor device 210A may be configured as a high electron mobility transistor (HEMT) that uses a nitride semiconductor.

As shown in FIG. 13, the nitride semiconductor device 210A includes a substrate 212, a buffer layer 214 formed on the substrate 212, an electron transit layer 216 formed on the buffer layer 214, and an electron supply layer 218 formed on the electron transit layer 216. The nitride semiconductor device 210A further includes a gate layer 222 formed on the electron supply layer 218 and a gate electrode 224 formed on the gate layer 222.

In an example, a silicon (Si) substrate may be used as the substrate 212. The substrate 212 may have a thickness, for example, in a range of 200 μm to 1500 μm. The substrate 212 includes an upper surface 212S. Instead of using a Si substrate, a silicon carbide (SiC) substrate, a gallium nitride (GaN) substrate, or a sapphire substrate may be used as the substrate 212. The term "thickness" in the following description refers to a dimension extending in the Z-direction shown in FIGS. 13 and 14 unless otherwise specifically described.

The buffer layer 214 may be formed from any material that limits wafer warpage and formation of cracks caused by a mismatch in thermal expansion coefficient between the substrate 212 and the electron transit layer 216. The buffer layer 214 may include one or more nitride semiconductor layers. The buffer layer 214 may include, for example, at least one of an aluminum nitride (AlN) layer, an aluminum gallium nitride (AlGaN) layer, and a graded AlGaN layer having different aluminum (Al) compositions. In an example, the buffer layer 214 may be composed of a single film of AlN, a single film of AlGaN, a film having a superlattice structure of AlGaN/GaN, a film having a superlattice structure of AlN/AlGaN, or a film having a superlattice structure of AlN/GaN.

In an example, the buffer layer 214 may include a first buffer layer, which is an AlN layer formed on the substrate 212, and a second buffer layer, which is an AlGaN formed on the AlN layer (first buffer layer). In an example, the first buffer layer may be an AlN layer having a thickness of 200 nm. In an example, the second buffer layer may be a graded AlGaN layer having a thickness of 300 nm. To inhibit current leakage in the buffer layer 214, a portion of the buffer layer 214 may be doped with an impurity so that the buffer layer 214 excluding an outer layer region becomes semi-insulating. In this case, the impurity is, for example, carbon (C) or iron (Fe). The concentration of the impurity may be, for example, greater than or equal to $4\times10^{16}$ $cm^{-3}$.

The electron transit layer 216 is formed on the buffer layer 214 that is formed on the substrate 212. Hence, the electron transit layer 216 may be formed above the substrate 212 or on the substrate 212. The electron transit layer 216 may be, for example, a GaN layer. The electron transit layer 216 may have a thickness, for example, in a range of 0.5 μm to 2 μm. The electron transit layer 216 of the second embodiment includes a first semiconductor layer 216A formed on the buffer layer 214 and a second semiconductor layer 216B formed on the first semiconductor layer 216A. The first semiconductor layer 216A may be formed above the substrate 212 or on the substrate 212. The first semiconductor layer 216A and the second semiconductor layer 216B are formed of GaN layers having different impurity concentrations.

In an example, the first semiconductor layer 216A is a C-doped GaN layer including carbon (C) as the impurity. The second semiconductor layer 216B is a non-doped GaN layer. The first semiconductor layer 216A may be in a range of 0.5 μm to 2 μm. The C concentration in the first semiconductor layer 216A may be in a range of $5\times10^{17}$ $cm^{-3}$ to $9\times10^{19}$ $cm^{-3}$. The second semiconductor layer 216B may be in a range of 0.05 μm to 0.4 μm. The second semiconductor layer 216B is in contact with the electron supply layer 218. One or more nitride semiconductor layers may be present between the buffer layer 214 and the first semiconductor layer 216A. In an example, the electron transit layer 216 includes the first semiconductor layer 216A having a thickness of 0.4 μm and the second semiconductor layer 216B having a thickness of 0.4 The C concentration in the first semiconductor layer 216A may be approximately $2\times10^{19}$ $cm^{-3}$.

The electron supply layer 218 is composed of a nitride semiconductor having a band gap that is larger than that of the electron transit layer 216. The electron supply layer 218 may be, for example, an AlGaN layer. In the nitride semiconductor, the band gap becomes larger as the Al composition increases. Therefore, the electron supply layer 218, which is an AlGaN layer, has a larger band gap than the electron transit layer 216, which is a GaN layer. In an example, the electron supply layer 218 is composed of $Al_xGa_{1-x}N$. That is, the electron supply layer 218 is an $Al_xGa_{1-x}N$ layer, where $0<x<0.4$, more preferably, $0.1<x<0.3$. The electron supply layer 218 may have a thickness, for example, in a range of 5 nm to 20 nm.

The electron transit layer 216 and the electron supply layer 218 have different lattice constants in a bulk region. Thus, the electron transit layer 216 and the electron supply layer 218 form a lattice-mismatching heterojunction. In the vicinity of the heterojunction interface between the electron transit layer 216 and the electron supply layer 218, the energy level in the conductive band of the electron transit layer 216 is lower than the Fermi level due to spontaneous polarization of the electron transit layer 216 and the electron supply layer 218 and piezoelectric polarization caused by compressive stress received by the heterojunction of the electron transit layer 216. As a result, a two-dimensional electronic gas 220 (2DEG) spreads in the electron transit layer 216 at a location close to the heterojunction interface between the electron transit layer 216 and the electron supply layer 218 (e.g., approximately a few nanometers from the interface).

The gate layer 222 is formed on the electron supply layer 218. The gate layer 222 extends in the Y-direction. The nitride semiconductor device 210A includes multiple gate layers 222 arranged in the X-direction (refer to FIG. 15). The gate layer 222 is composed of a nitride semiconductor having a band gap that is smaller than that of the electron supply layer 218 and including an acceptor impurity. The gate layer 222 may be formed from any material having a band gap that is smaller than that of the electron supply layer 218, which is, for example, an AlGaN layer. In an example, the gate layer 222 is a GaN layer (p-type GaN layer) doped with an acceptor impurity. The acceptor impurity may include at least one of magnesium (Mg), zinc (Zn), and C. The maximum concentration of the acceptor impurity in the gate layer 222 may be, for example, in a range of $1\times10^{18}$ $cm^{-3}$ to $1\times10^{20}$ $cm^{-3}$. The gate layer 222 may have a thickness, for example, in a range of 50 nm to 200 nm.

The gate electrode 224 is arranged on a portion of an upper surface 222S of the gate layer 222. The gate electrode 224 is formed on the upper surface 222S of the gate layer 222. The gate electrode 224 forms a Schottky junction with the gate layer 222. The gate electrode 224 may be composed of one or more metal layers. In an example, the gate electrode 224 is composed of a titanium nitride (TiN) layer. In another example, the gate electrode 224 may be composed of a first metal layer formed from Ti and a second metal layer formed from TiN and arranged on the first metal layer. The gate electrode 224 may have a thickness, for example, in a range of 50 nm to 200 nm.

The nitride semiconductor device 210A further includes a passivation layer 226. The passivation layer 226 covers the electron supply layer 218, the gate layer 222, and the gate electrode 224. The passivation layer 226 may be composed of, for example, a material including one of silicon dioxide ($SiO_2$), silicon nitride (SiN), silicon oxynitride (SiON), alumina ($Al_2O_3$), AlN, and aluminum oxynitride (AlON). In an example, the passivation layer 226 is formed from a material including $SiO_2$.

The passivation layer 226 includes a flat upper surface 226S. The passivation layer 226 includes a source opening 2261 and a drain opening 2262. The source opening 2261 extends through the passivation layer 226 from the upper surface 226S to the upper surface of the electron supply layer 218. The source opening 2261 exposes the upper surface of the electron supply layer 218 as a source connection region 2181. The drain opening 2262 extends through the passivation layer 226 from the upper surface 226S to the upper surface of the electron supply layer 218. The drain opening 2262 exposes the upper surface of the electron supply layer 218 as a drain connection region 2182. The gate layer 222 is arranged between the source opening 2261 and the drain opening 2262.

The nitride semiconductor device 210A further includes a source electrode 232 and a drain electrode 234.

The source electrode 232 is in contact with the source connection region 2181 of the electron supply layer 218 through the source opening 2261 in the passivation layer 226. The source electrode 232 is in ohmic contact with the 2DEG 220 located immediately below the electron supply layer 218. The drain electrode 234 is in contact with the drain connection region 2182 of the electron supply layer 218 through the drain opening 2262 in the passivation layer 226. The drain electrode 234 is in ohmic contact with the 2DEG 220 located immediately below the electron supply layer 218.

Each of the source electrode 232 and the drain electrode 234 is composed of, for example, one or more metal layers using at least one of a Ti layer, a TiN layer, an Al layer, an AlSiCu layer, and an AlCu layer. In an example, the source electrode 232 and the drain electrode 234 are formed from the same material.

A portion of the source electrode 232 fills the source opening 2261 in the passivation layer 226. A portion of the drain electrode 234 fills the drain opening 2262 in the passivation layer 226. The source electrode 232 includes a filling region that fills the source opening 2261 and an upper region that is integrally formed with the filling region and is located around the source opening 2261 in plan view.

The nitride semiconductor device 210A may include a source field plate 236 that is continuous with the source electrode 232. The source field plate 236 is formed integrally with the upper region of the source electrode 232 and arranged on the upper surface 226S of the passivation layer 226 to cover the entirety of the gate layer 222 in plan view. The source field plate 236 may be part of the source electrode 232.

The source field plate 236 includes an end 2361 located near the drain electrode 234. The end 2361 is arranged between the drain electrode 234 and the gate electrode 224 in plan view. When the gate-source voltage is 0 V and a high voltage is applied between the source and the drain, the source field plate 236 extends a depletion layer toward the 2DEG 220 located immediately below the source field plate 236. Thus, the source field plate 236 reduces concentration of an electric field in the vicinity of the end of the gate electrode 224 and the vicinity of the end of the gate layer 222.

Planar Layout of Nitride Semiconductor Device

An example of the planar layout of the nitride semiconductor device 210A will be described with reference to FIG. 12 In FIG. 12, the gate electrode 224, the source electrode 232, the drain electrode 234, and the source field plate 236 are indicated by broken lines. The source opening 2261 and the drain opening 2262 of the passivation layer 226 are indicated by solid lines. The remaining of the passivation layer 226 is transparently shown.

As shown in FIG. 12, the gate layer 222 may be formed to surround the drain electrode 234 in plan view. The gate layer 222 may include body portions 80 extending in the Y-axis direction and connection portions 82 connecting adjacent ones of the body portions 80. Each body portion 80 of the gate layer 222 is arranged between the source opening 2261 and the drain opening 2262 of the passivation layer 226.

In plan view, the gate electrode 224 is arranged to overlap the gate layer 222. Accordingly, in the same manner as the gate layer 222, the gate electrode 224 may be formed to surround the drain electrode 234 in plan view. The gate electrode 224 may include body portions 84 extending in the Y-axis direction and connection portions 86 connecting adjacent ones of the body portions 84. The gate electrode 224 may be smaller in area in plan view than the gate layer 222.

The nitride semiconductor device 210A may include a gate interconnect 88, a source interconnect 90, and a drain interconnect 92. In FIG. 12, the gate interconnect 88, the source interconnect 90, and the drain interconnect 92 are indicated by single-dashed lines. The gate interconnect 88, the source interconnect 90, and the drain interconnect 92 are arranged above the source electrode 232 and the drain electrode 234 in the Z-axis direction. The gate interconnect 88 may extend in the X-axis direction and be arranged above the connection portion 86 of the gate electrode 224. The source interconnect 90 and the drain interconnect 92 may extend in the X-axis direction and respectively intersect with the source electrode 232 and the drain electrode 234 in plan view. In an example, the gate electrode 224 may be electrically connected to the gate interconnect 88 through vias 94 arranged on the connection portion 86. The source electrode 232 may be electrically connected to the source interconnect 90 through vias 96. The drain electrode 234 may be electrically connected to the drain interconnect 92 through vias 98.

The planar layout of the nitride semiconductor device 210A is not limited to the example shown in FIG. 12. Any other planar layout can be applied to the nitride semiconductor device 210A.

Exemplary Structure of Gate Layer and Gate Electrode

As shown in FIG. 14, the gate layer 222 is, for example, trapezoidal in cross-sectional view. The gate layer 222 includes the upper surface 222S and a lower surface 222R that face in opposite directions. The lower surface 222R of the gate layer 222 is in contact with the upper surface 218S of the electron supply layer 218. The Z-direction corresponds to the thickness-wise direction of the gate layer 222. FIG. 14 shows a cross-sectional structure of the gate layer 222 that is cut along a plane extending in the thickness-wise direction of the gate layer 222 and the width-wise direction of the gate layer 222. The thickness of the gate layer 222 is the distance from the upper surface 222S of the gate layer 222 to the lower surface 222R. The thickness of the gate layer 222 may be determined taking into consideration various parameters such as gate breakdown voltage.

The lower surface 222R of the gate layer 222 is greater in area than the upper surface 222S of the gate layer 222. More specifically, the gate layer 222 is shaped so that a width W12 of the upper surface 222S in the X-direction is less than a width W11 of the lower surface 222R in the X-direction. The gate length is specified by the width W11 of the lower surface 222R of the gate layer 222. The width W11 of the lower surface 222R is, for example, in a range of 0.2 μm to 0.5 μm. Preferably, the width W11 of the lower surface 222R may be, for example, 0.3 μm.

The gate layer 222 includes a source-side gate surface 2221 and a drain-side gate surface 2222 opposite to each other. The source-side gate surface 2221 is located toward the source electrode 232. The drain-side gate surface 2222 is located toward the drain electrode 234. The source-side gate surface 2221 faces toward the source electrode 232 shown in FIG. 13. The drain-side gate surface 2222 faces toward the drain electrode 234 shown in FIG. 13.

As shown in FIG. 14, each of the source-side gate surface 2221 and the drain-side gate surface 2222 includes an inclined surface having a predetermined angle from the upper surface 218S of the electron supply layer 218 with respect to a direction in which the source electrode 232 and the drain electrode 234 are arranged on the upper surface 218S of the electron supply layer 218, that is, the X-direction.

The source-side gate surface 2221 has an inclination angle θ11 that is the acute one of the angles formed by the source-side gate surface 2221 and the upper surface 218S of the electron supply layer 218. The inclination angle θ11 of the source-side gate surface 2221 is, for example, in a range of 80° to 90°.

The drain-side gate surface 2222 has an inclination angle θ12 that is the acute one of the angles formed by the drain-side gate surface 2222 and the upper surface 218S of the electron supply layer 218. The inclination angle θ12 of the drain-side gate surface 2222 is, for example, in a range of 60° to 80°.

In the gate layer 222 of the second embodiment, the inclination angle θ12 of the drain-side gate surface 2222, which faces the drain electrode 234, is less than the inclination angle θ11 of the source-side gate surface 2221, which faces toward the source electrode 232. The shape of the gate layer 222 in the X-direction differs between the side of the source electrode 232 and the side of the drain electrode 234. The gate layer 222 of the second embodiment has an asymmetrical shape in the X-direction.

The gate electrode 224 is formed on a portion of the upper surface 222S of the gate layer 222. The gate electrode 224 is, for example, trapezoidal in cross-sectional view. The gate electrode 224 includes an upper surface 224S and a lower surface 224R that face in opposite directions. The lower surface 224R of the gate electrode 224 is in contact with the upper surface 222S of the gate layer 222.

The lower surface 224R of the gate electrode 224 is greater in area than the upper surface 224S of the gate electrode 224. More specifically, the gate electrode 224 is shaped so that a width W22 of the upper surface 224S in the X-direction is less than a width W21 of the lower surface 224R in the X-direction.

The gate electrode 224 includes a source-side electrode surface 2241 and a drain-side electrode surface 2242 opposite to each other. The source-side electrode surface 2241 is located toward the source electrode 232. The drain-side electrode surface 2242 is located toward the drain electrode 234. The source-side electrode surface 2241 faces toward the source electrode 232 shown in FIG. 13. The drain-side electrode surface 2242 faces toward the drain electrode 234 shown in FIG. 13.

Each of the source-side electrode surface 2241 and the drain-side electrode surface 2242 includes an inclined surface having a predetermined angle from the upper surface 222S of the gate layer 222 with respect to a direction in which the source electrode 232 and the drain electrode 234 are arranged, that is, the X-direction.

The source-side electrode surface 2241 has an inclination angle θ21 that is the acute one of the angles formed by the source-side electrode surface 2241 and the upper surface 222S of the gate layer 222. The inclination angle θ21 of the source-side electrode surface 2241 is, for example, in a range of 80° to 90°. The inclination angle θ21 of the source-side electrode surface 2241 is equal to, for example, the inclination angle θ11 of the source-side gate surface 2221. Alternatively, the inclination angle θ21 of the source-side electrode surface 2241 may be less than the inclination angle θ11 of the source-side gate surface 2221 or may be greater than the inclination angle θ11 of the source-side gate surface 2221.

The drain-side electrode surface 2242 has an inclination angle θ22 that is the acute one of the angles formed by the drain-side electrode surface 2242 and the upper surface 222S of the gate layer 222. The inclination angle θ22 of the drain-side electrode surface 2242 is, for example, in a range of 60° to 80°. The inclination angle θ22 of the drain-side electrode surface 2242 is, for example, equal to the inclination angle θ12 of the drain-side gate surface 2222. Alternatively, the inclination angle θ22 of the drain-side electrode surface 2242 may be less than the inclination angle θ12 of the drain-side gate surface 2222 or may be greater than the inclination angle θ12 of the drain-side gate surface 2222.

In the gate electrode 224 of the second embodiment, the inclination angle θ22 of the drain-side electrode surface 2242, which faces toward the drain electrode 234, is less than the inclination angle θ21 of the source-side electrode surface 2241, which faces toward the source electrode 232. The shape of the gate electrode 224 in the X-direction differs between the side of the source electrode 232 and the side of the drain electrode 234. The gate electrode 224 of the second embodiment has an asymmetrical shape in the X-direction.

The gate electrode 224 of the second embodiment is formed on a portion of the upper surface 222S of the gate layer 222. The width W21 of the lower surface 224R of the gate electrode 224 is less than the width W12 of the upper surface 222S of the gate layer 222. Thus, the upper surface 222S of the gate layer 222 includes a region that is not in contact with the lower surface 224R of the gate electrode 224, that is, a gate side space (hereafter, referred to as side space) region exposed from the lower surface 224R of the gate electrode 224 and extending outward from the gate electrode 224. In the example shown in FIG. 14, the upper surface 222S of the gate layer 222 includes two side space regions extending outward from opposite side walls of the gate electrode 224 in the X-direction, namely, a first side space 222S1 and a second side space 222S2. The first side space 222S1 is a region located toward the source electrode 232. The second side space 222S2 is a region located toward the drain electrode 234.

Figure 15:
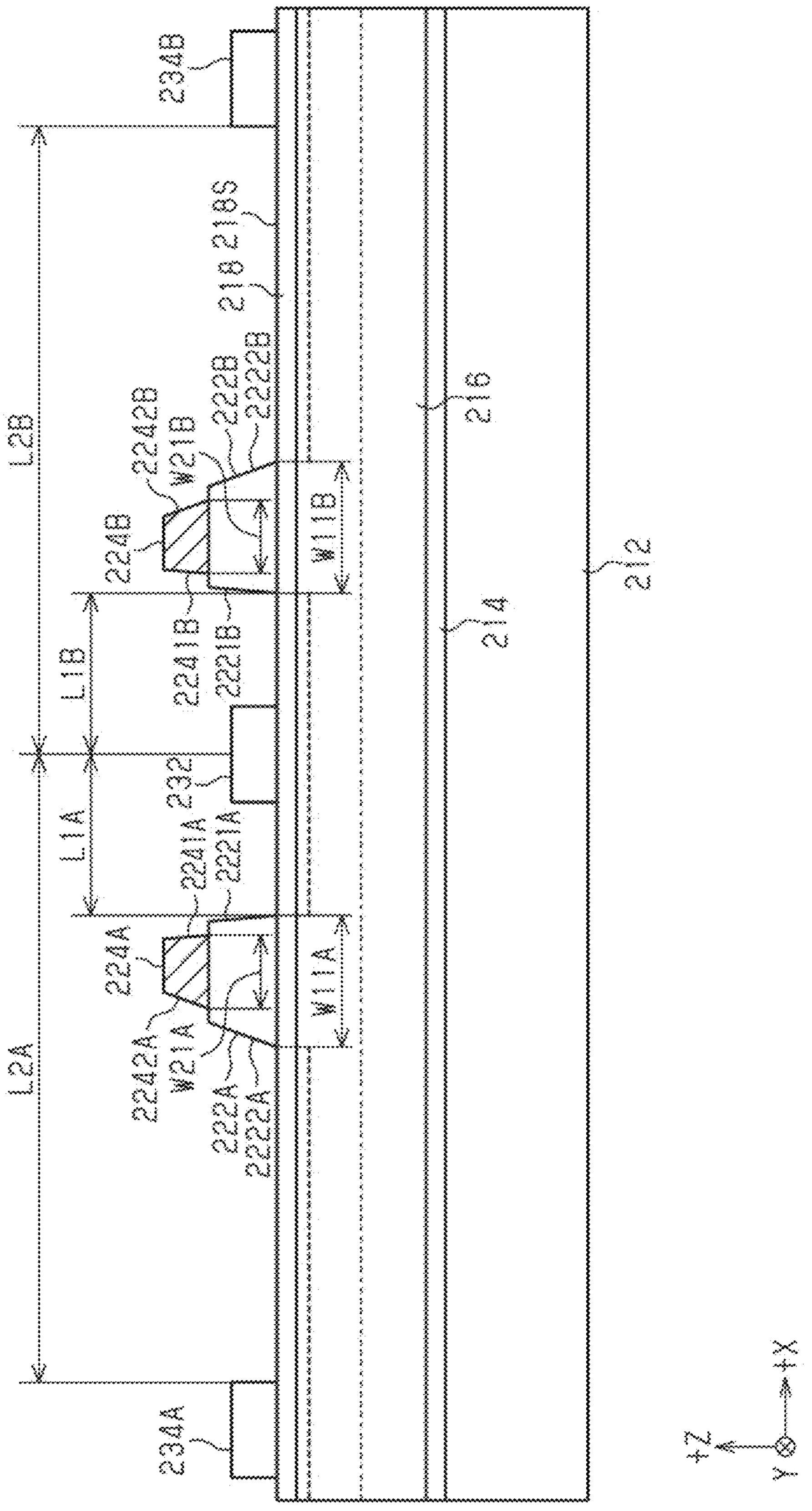
FIG. 15 is a schematic cross-sectional view of the nitride semiconductor device shown in FIG. 13 showing a portion including two gate layers and two gate electrodes.

FIG. 15 shows the structure of two gate layers 222 and two gate electrodes 224 of the nitride semiconductor device 210A arranged in the X-direction. FIG. 15 does not show the passivation layer 226 and the source field plate 236, which are shown in FIG. 13.

As shown in FIG. 15, the nitride semiconductor device 210A includes the two gate layers 222, the two gate electrodes 224, and two drain electrodes 234. To distinguish the two gate layers 222, one of the gate layers 222 is referred to as the first gate layer 222A, and the other of the gate layers 222 is referred to as the second gate layer 222B. To distinguish the two gate electrodes 224, the gate electrode 224 arranged on the first gate layer 222A is referred to as the first gate electrode 224A, and the gate electrode 224 arranged on the second gate layer 222B is referred to as the second gate electrode 224B. To distinguish the two drain electrodes 234, the drain electrode 234 that, with the source electrode 232, sandwiches the first gate layer 222A is referred to as the first drain electrode 234A, and the drain electrode 234 that, with the source electrode 232, sandwiches the second gate layer 222B is referred to as the second drain electrode 234B.

The first gate layer 222A and the second gate layer 222B are located at opposite sides of the source electrode 232. The first gate electrode 224A is formed on the first gate layer 222A. The second gate electrode 224B is formed on the second gate layer 222B. The first drain electrode 234A and the source electrode 232 are located at opposite sides of the first gate layer 222A. The second drain electrode 234B and the source electrode 232 are located at opposite sides of the second gate layer 222B.

The first gate layer 222A and the second gate layer 222B are symmetrically located with respect to the source electrode 232. More specifically, a distance L1A from the center of the source electrode 232 to the first gate layer 222A is equal to a distance L1B from the center of the source electrode 232 to the second gate layer 222B. When the difference between the distance L1A to the first gate layer 222A and the distance L1B to the second gate layer 222B is, for example, within 10% of the distance L1A to the first gate layer 222A, it is considered that the distance L1A to the first gate layer 222A is equal to the distance L1B to the second gate layer 222B.

The first gate layer 222A and the second gate layer 222B are formed to have symmetrical shapes with respect to the source electrode 232. The first gate layer 222A includes a source-side gate surface 2221A located at the side of the source electrode 232 and a drain-side gate surface 2222B located at the side of the first drain electrode 234A. The second gate layer 222B includes a source-side gate surface 2221B located at the side of the source electrode 232 and a drain-side gate surface 2222B located at the side of the second drain electrode 234B. The source-side gate surface 2221A of the first gate layer 222A is equal in inclination angle to the source-side gate surface 2221B of the second gate layer 222B. The drain-side gate surface 2222A of the first gate layer 222A is equal in inclination angle to the drain-side gate surface 2222B of the second gate layer 222B. When the difference between the two inclination angles is within 10% of one of the inclination angles, it is considered that the two inclination angles are equal to each other.

The first gate electrode 224A and the second gate electrode 224B are formed to have symmetrical shapes with respect to the source electrode 232. The first gate electrode 224A includes a source-side electrode surface 2241A located at the side of the source electrode 232 and a drain-side electrode surface 2242A located at the side of the first drain electrode 234A. The second gate electrode 224B includes a source-side electrode surface 2241B located at the side of the source electrode 232 and a drain-side electrode surface 2242B located at the side of the second drain electrode 234B. The inclination angle of the source-side electrode surface 2241A of the first gate electrode 224A is equal to the inclination angle of the source-side electrode surface 2241B of the second gate electrode 224B. The inclination angle of the drain-side electrode surface 2242A of the first gate electrode 224A is equal to the inclination angle of the drain-side electrode surface 2242B of the second gate electrode 224B.

A width W11A of the first gate layer 222A is equal to a width W11B of the second gate layer 222B. When the difference between the width W11A of the first gate layer 222A and the width W11B of the second gate layer 222B is, for example, within 10% of the width W11A of the first gate layer 222A, it is considered that the width W11A of the first gate layer 222A is equal to the width W11B of the second gate layer 222B.

A width W21A of the first gate electrode 224A is equal to a width W21B of the second gate electrode 224B. When the difference between the width W21A of the first gate electrode 224A and the width W21B of the second gate electrode 224B is, for example, within 10% of the width W21A of the first gate electrode 224A, it is considered that the width W21A of the first gate electrode 224A is equal to the width W21B of the second gate electrode 224B.

The first drain electrode 234A and the second drain electrode 234B are symmetrically located with respect to the source electrode 232. More specifically, a distance L2A from the center of the source electrode 232 to the first drain electrode 234A is equal to a distance L2B from the center of the source electrode 232 to the second drain electrode 234B. When the difference between the distance L2A to the first drain electrode 234A and the distance L2B to the second drain electrode 234B is, for example, within 10% of the distance L2A to the first drain electrode 234A, it is considered that the distance L2A to the first drain electrode 234A is equal to the distance L2B to the second drain electrode 234B.

In FIG. 15, the nitride semiconductor device 210A includes one source electrode 232, the two gate layers 222A and 222B, the two gate electrodes 224A and 224B, and the two drain electrodes 234A and 234B. In an actual structure, the structure shown in FIG. 15 is repeated so that the nitride semiconductor device 210A includes a number of source electrodes 232, gate layers 222, gate electrodes 224, and drain electrodes 234.

Operation

Comparative Example

Figure 16:
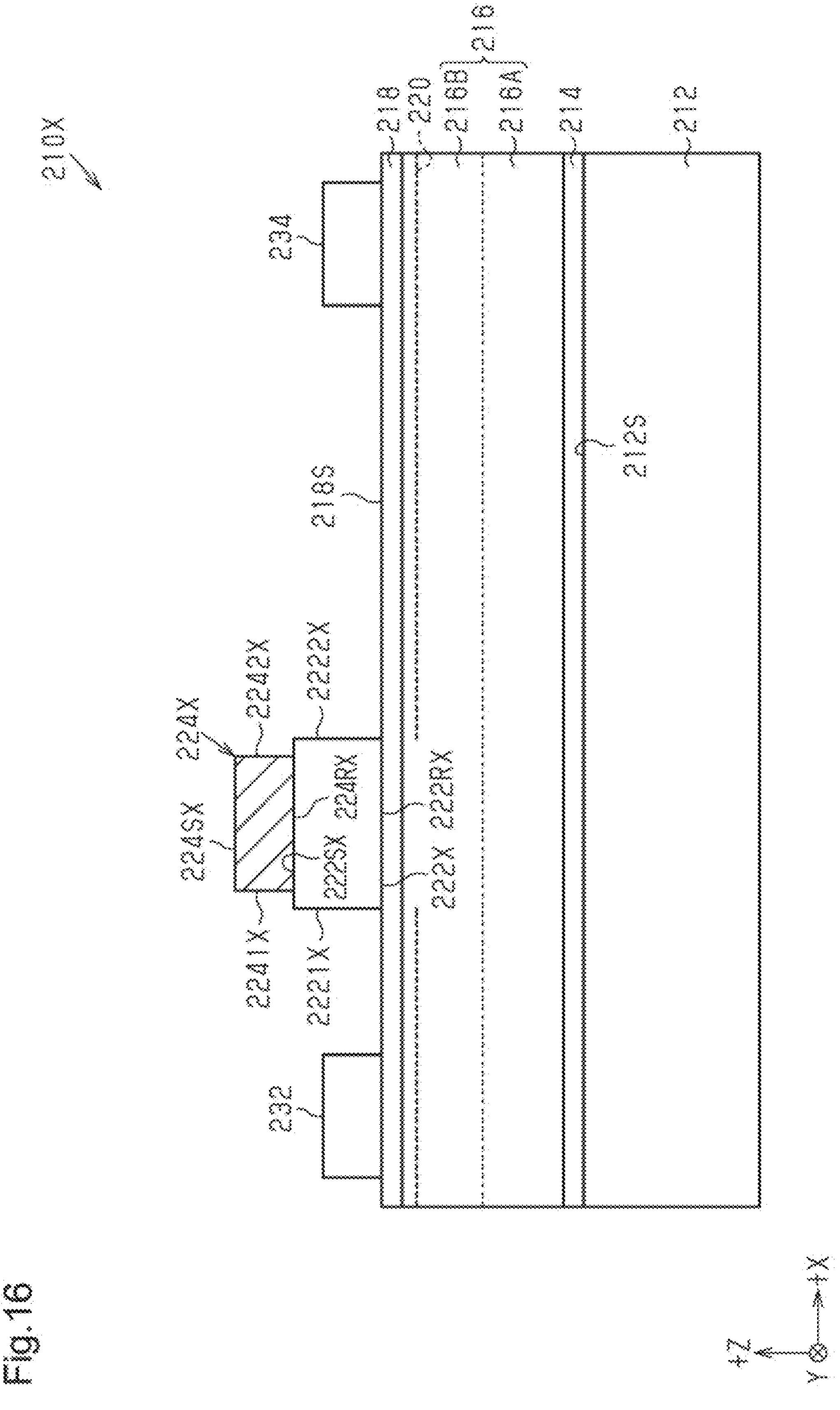
FIG. 16 is a schematic cross-sectional view of a nitride semiconductor device in a comparative example.

FIG. 16 is a schematic enlarged cross-sectional view showing a portion of a nitride semiconductor device 210X in a comparative example of the nitride semiconductor device 210A of the second embodiment. The structure shown in FIG. 16 is a comparative example of the structure shown in FIG. 13. In the nitride semiconductor device 210X of the comparative example, the same reference characters are given to those components that are the same as the corresponding components of the nitride semiconductor device 210A of the second embodiment.

In the nitride semiconductor device 210X of the comparative example, the gate layer 222X is rectangular in cross-sectional view. More specifically, the gate layer 222X includes a source-side gate surface 2221X and a drain-side gate surface 2222X that are orthogonal to the upper surface 218S of the electron supply layer 218. The gate layer 222X includes an upper surface 222SX and a lower surface 222RX that are equal to each other in width (dimension in X-direction). The gate electrode 224X is formed on a portion of the upper surface 222S of the gate layer 222X. The gate electrode 224X is rectangular in cross-sectional view. More specifically, the gate electrode 224X includes a source-side electrode surface 2241X and a drain-side electrode surface 2242X that are orthogonal to the upper surface 222S of the gate layer 222X. The gate electrode 224X includes an upper surface 224SX and a lower surface 224RX that are equal to each other in width.

In the nitride semiconductor device 210X of the comparative example, when a high voltage is applied between the drain and the source, an electric field concentrates on the region between the drain and the source in the vicinity of an end of the gate electrode 224X. Such electric field concentration may cause a dielectric breakdown of the electron supply layer 218 or the like and thus may decrease the drain-source breakdown voltage. Also, in the nitride semiconductor device 210X of the comparative example, when a positive voltage is applied to the gate electrode 224X, an electric field locally concentrates on a portion of the gate layer 222X in the vicinity of an end of the gate electrode 224X. Such local concentration of an electric field may cause the gate layer 222X to have a crystal defect and, ultimately, a crystal fracture and may decrease the gate breakdown voltage.

Nitride Semiconductor Device of Second Embodiment

In the nitride semiconductor device 210A shown in FIGS. 13 and 14, the gate layer 222 includes the drain-side gate surface 2222, which is inclined from the upper surface 218S of the electron supply layer 218 at the inclination angle θ12. The gate layer 222 including the inclined drain-side gate surface 2222 reduces concentration of an electric field on the end of the gate layer 222 located at the side of the drain electrode 234. Thus, the nitride semiconductor device 210A limits a dielectric breakdown of the electron supply layer 218 or the like, thereby avoiding a decrease in the drain-source breakdown voltage.

The gate electrode 224 also includes the drain-side electrode surface 2242, which is inclined from the upper surface 222S of the gate layer 222 at the inclination angle θ22. When a positive voltage is applied to the gate electrode 224 including the inclined drain-side electrode surface 2242, the gate electrode 224 reduces concentration of an electric field on a portion of the gate layer 222 in the vicinity of the end of the gate electrode 224. The nitride semiconductor device 210A limits occurrence of a crystal defect and a crystal fracture of the gate layer 222, thereby avoiding a decrease in the gate breakdown voltage.

The gate layer 222 includes the source-side gate surface 2221 located at the side of the source electrode 232 and the drain-side gate surface 2222 located at the side of the drain electrode 234. The inclination angle θ11 of the source-side gate surface 2221 is greater than the inclination angle θ12 of the drain-side gate surface 2222. Thus, the width W11 of the gate layer 222, that is, the gate length, is decreased as compared to a structure in which the source-side gate surface 2221 and the drain-side gate surface 2222 have equal inclination angles.

Manufacturing Method of Nitride Semiconductor Device of Second Embodiment

An example of a method for manufacturing the nitride semiconductor device 210A shown in FIGS. 13 and 15 will be described.

FIGS. 17 to 28 are schematic cross-sectional views showing an example of manufacturing steps of the nitride semiconductor device 210A. In the nitride semiconductor device 210A of the second embodiment, as shown in FIG. 15, the two gate layers 222 and the two gate electrodes 224 have symmetrical shapes with respect to the source electrode 232. FIGS. 17 to 28 show cross-sectional shapes according to the manufacturing steps based on the state shown in FIG. 15. To facilitate understanding, in FIGS. 16 to 27, the same reference characters are given to those components that are the same as the corresponding components shown in FIG. 13.

Figure 17:
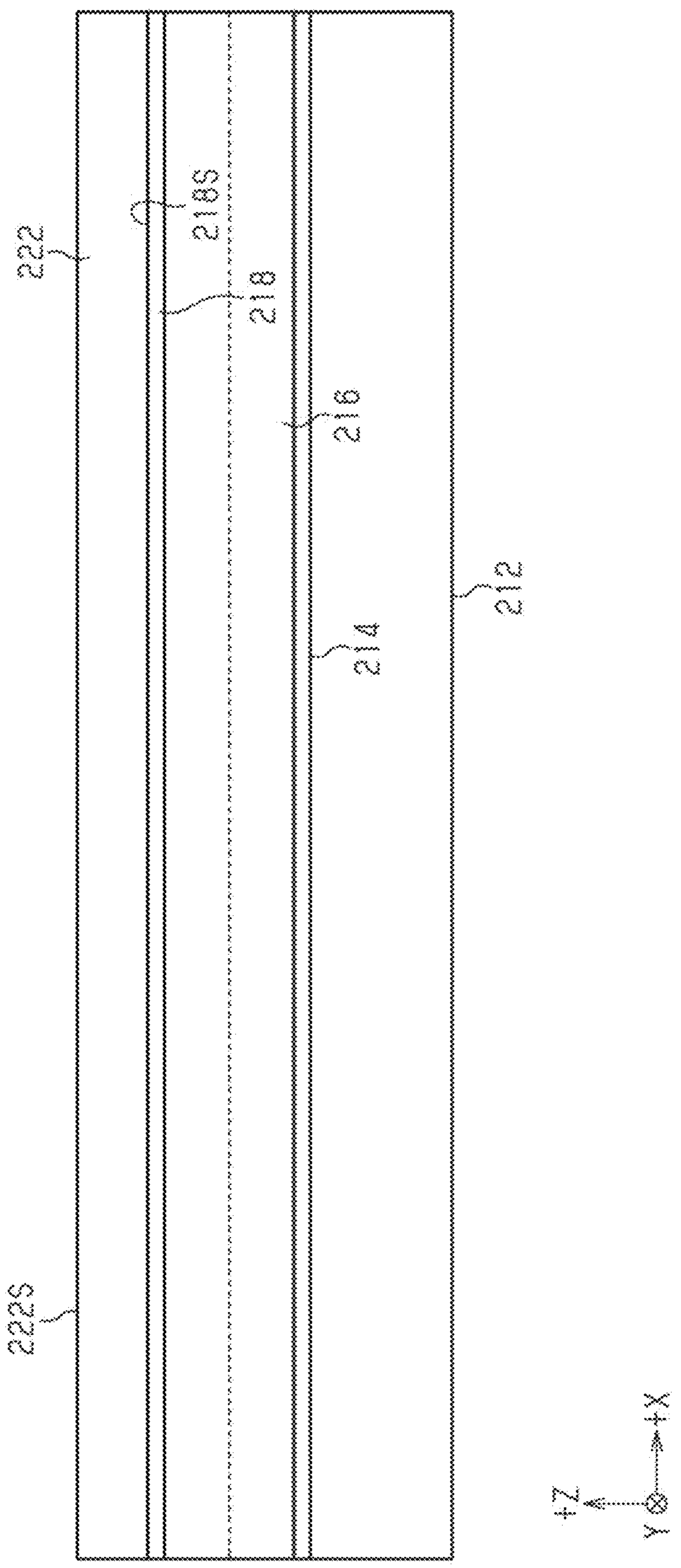
FIG. 17 is a schematic cross-sectional view showing an exemplary step for manufacturing the nitride semiconductor device shown in FIG. 13.

As shown in FIG. 17, the manufacturing method of the nitride semiconductor device 210A includes sequentially forming the buffer layer 214, a first nitride semiconductor layer 216, a second nitride semiconductor layer 218, and a third nitride semiconductor layer 222 on the substrate 212, which is, for example, a Si substrate. The buffer layer 214, the first nitride semiconductor layer 216, the second nitride semiconductor layer 218, and the third nitride semiconductor layer 222 may be epitaxially grown by metal organic chemical vapor deposition (MOCVD).

Although not shown in detail, in an example, the buffer layer 214 may be a multilayer buffer layer. In the multilayer buffer layer, an AlN layer (first buffer layer) is formed on the substrate 212, and then a graded AlGaN layer (second buffer layer) is formed on the AlN layer. The graded AlGaN layer may be formed, for example, by stacking three AlGaN layers having Al compositions of 75%, 50%, and 25% in the order from the side of the AlN layer.

The first nitride semiconductor layer 216 is formed on the buffer layer 214. Thus, the first nitride semiconductor layer 216 is formed on the substrate 212 with the buffer layer 214 arranged between the first nitride semiconductor layer 216 and the substrate 212. The first nitride semiconductor layer 216 may be a GaN layer. The first nitride semiconductor layer 216 forms the electron transit layer 216 shown in FIGS. 13 to 15.

The second nitride semiconductor layer 218 is formed on the first nitride semiconductor layer 216. The second nitride semiconductor layer 218 may be an AlGaN layer. Hence, the second nitride semiconductor layer 218 has a larger band gap than the first nitride semiconductor layer 216. The second nitride semiconductor layer 218 forms the electron supply layer 218 shown in FIGS. 13 to 15.

The third nitride semiconductor layer 222 is formed on the second nitride semiconductor layer 218. The third nitride semiconductor layer 222 may be a GaN layer (p-type GaN layer) including an acceptor impurity. The acceptor impurity may be, for example, magnesium. The third nitride semiconductor layer 222 forms the gate layer 222 shown in FIGS. 13 to 15.

The buffer layer 214, the first nitride semiconductor layer 216, the second nitride semiconductor layer 218, and the third nitride semiconductor layer 222 are composed of nitride semiconductors having lattice constants relatively close to each other. This allows for continuous epitaxial growth of the buffer layer 214, the first nitride semiconductor layer 216, the second nitride semiconductor layer 218, and the third nitride semiconductor layer 222.

Figure 18:
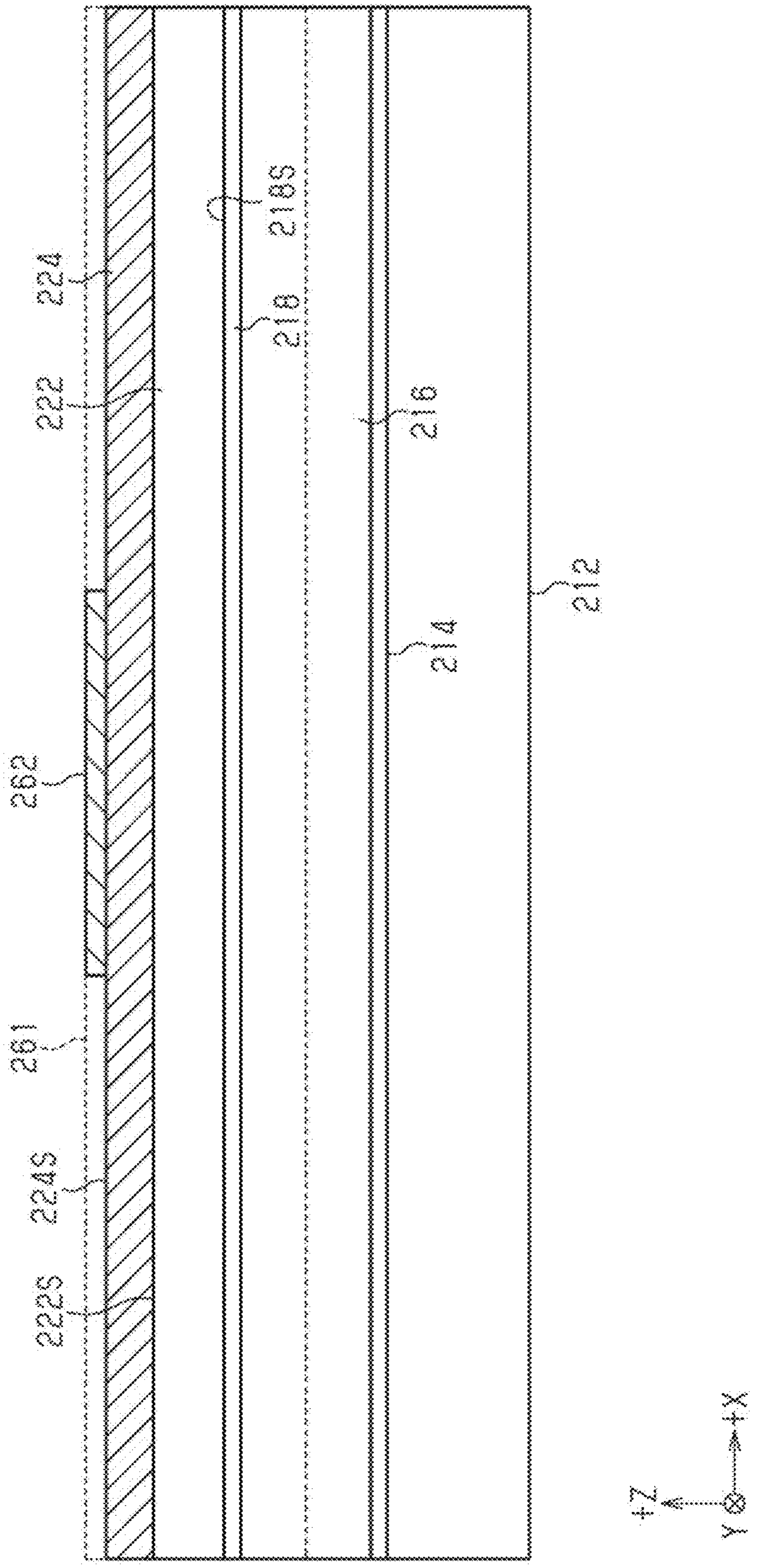
FIG. 18 is a schematic cross-sectional view showing a manufacturing step subsequent to FIG. 17.

As shown in FIG. 18, the manufacturing method of the nitride semiconductor device 210A further includes forming a metal layer 224 on the third nitride semiconductor layer 222. The metal layer 224 forms the gate electrode 224 shown in FIGS. 13 to 15. The metal layer 224 may be, for example, a TiN layer. The TiN layer is formed by sputtering.

The manufacturing method of the nitride semiconductor device 210A further includes forming a first mask 262. The first mask 262 is formed to cover a portion of the metal layer 224 corresponding to the region between the first gate electrode 224A and the second gate electrode 224B shown in FIG. 15. For example, a $SiO_2$ film is formed as the first mask 262 on the third nitride semiconductor layer 222. The first mask 262 is obtained by forming a first mask layer 261 to cover the upper surface 224S of the metal layer 224 and patterning the first mask layer 261. In FIG. 18, the first mask layer 261 is indicated by a broken line.

Figure 19:
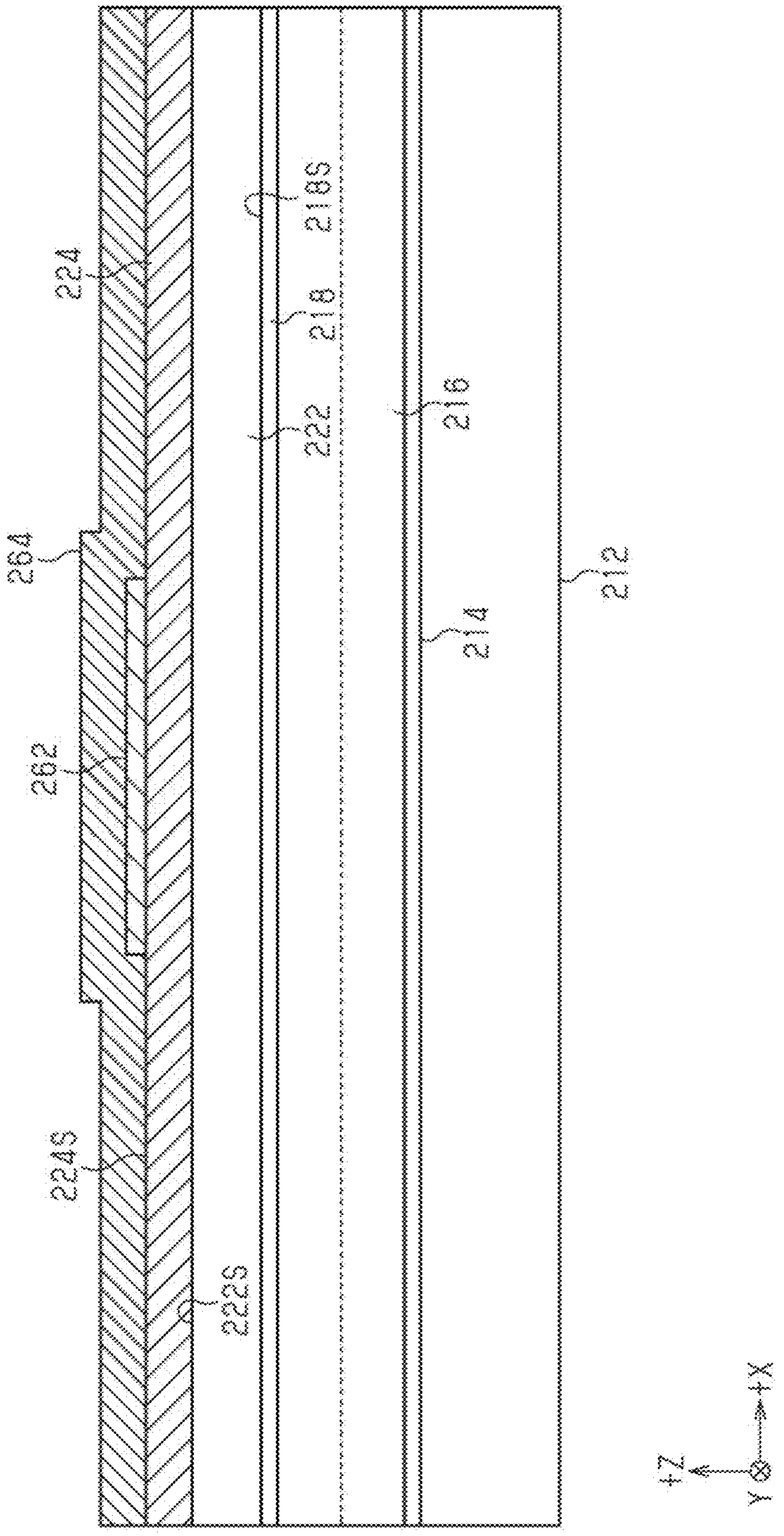
FIG. 19 is a schematic cross-sectional view showing a manufacturing step subsequent to FIG. 18.

As shown in FIG. 19, the manufacturing method of the nitride semiconductor device 210A further includes forming a second mask layer 264 that covers the metal layer 224 and the first mask 262. The second mask layer 264 is used when forming a second mask for self-alignment. The second mask layer 264 may be, for example, a SiN layer. The second mask layer 264 is formed to have a thickness corresponding to the widths W21 and W22 of the gate electrode 224 shown in FIG. 14.

Figure 20:
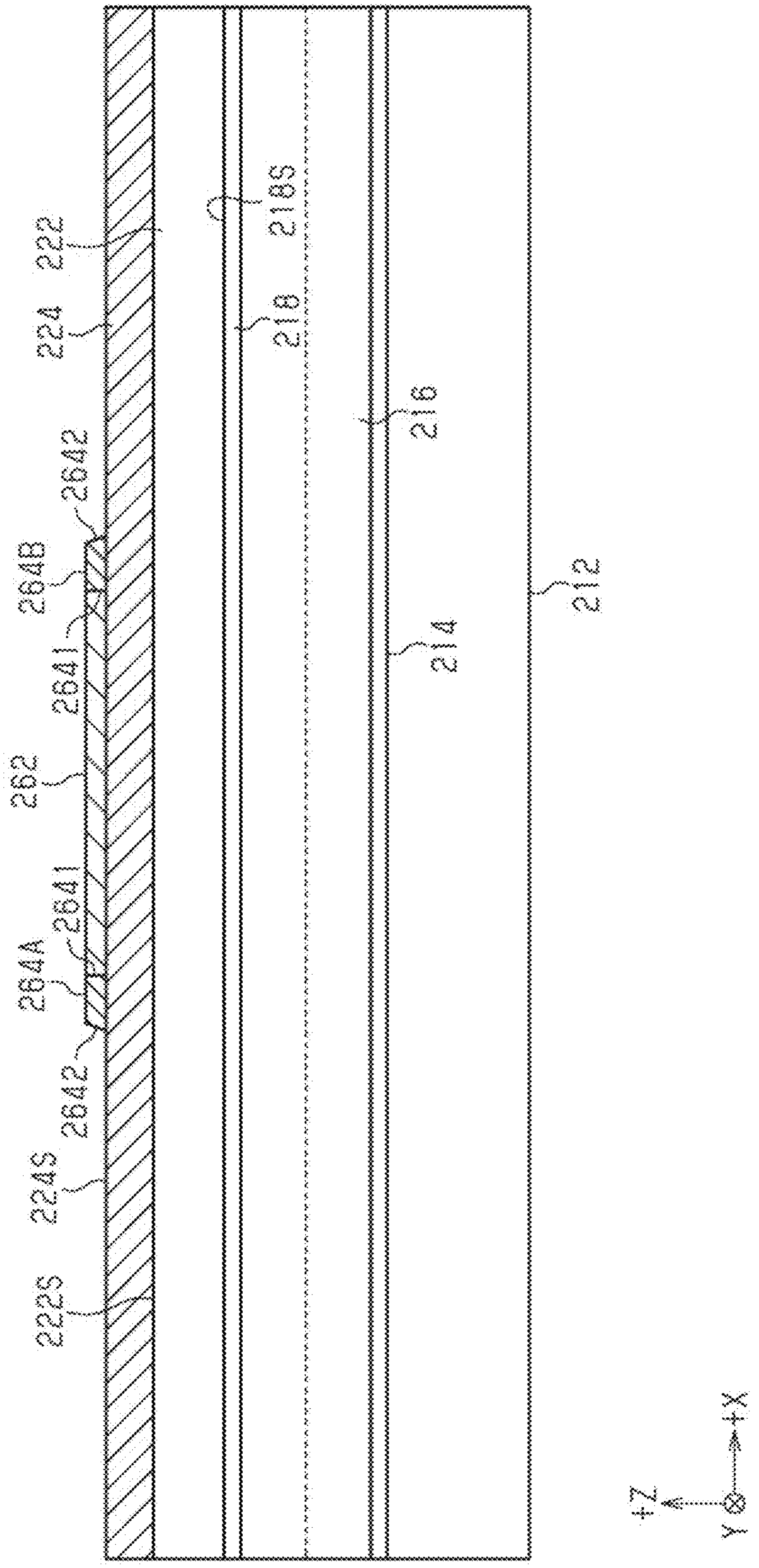
FIG. 20 is a schematic cross-sectional view showing a manufacturing step subsequent to FIG. 19.

As shown in FIG. 20, the manufacturing method of the nitride semiconductor device 210A further includes forming second masks 264A and 264B. The second masks 264A and 264B are obtained by etching back the second mask layer 264 shown in FIG. 19 until the surfaces of the metal layer 224 and the first mask 262 are exposed. The second masks 264A and 264B may be formed to be, for example, side walls of the first mask 262. The second masks 264A and 264B each have, for example, a trapezoidal cross section. The second masks 264A and 264B each include a side surface 2642 opposite to the first mask 262. The side surface 2642 is inclined from the upper surface 224S of the metal layer 224.

Figure 21:
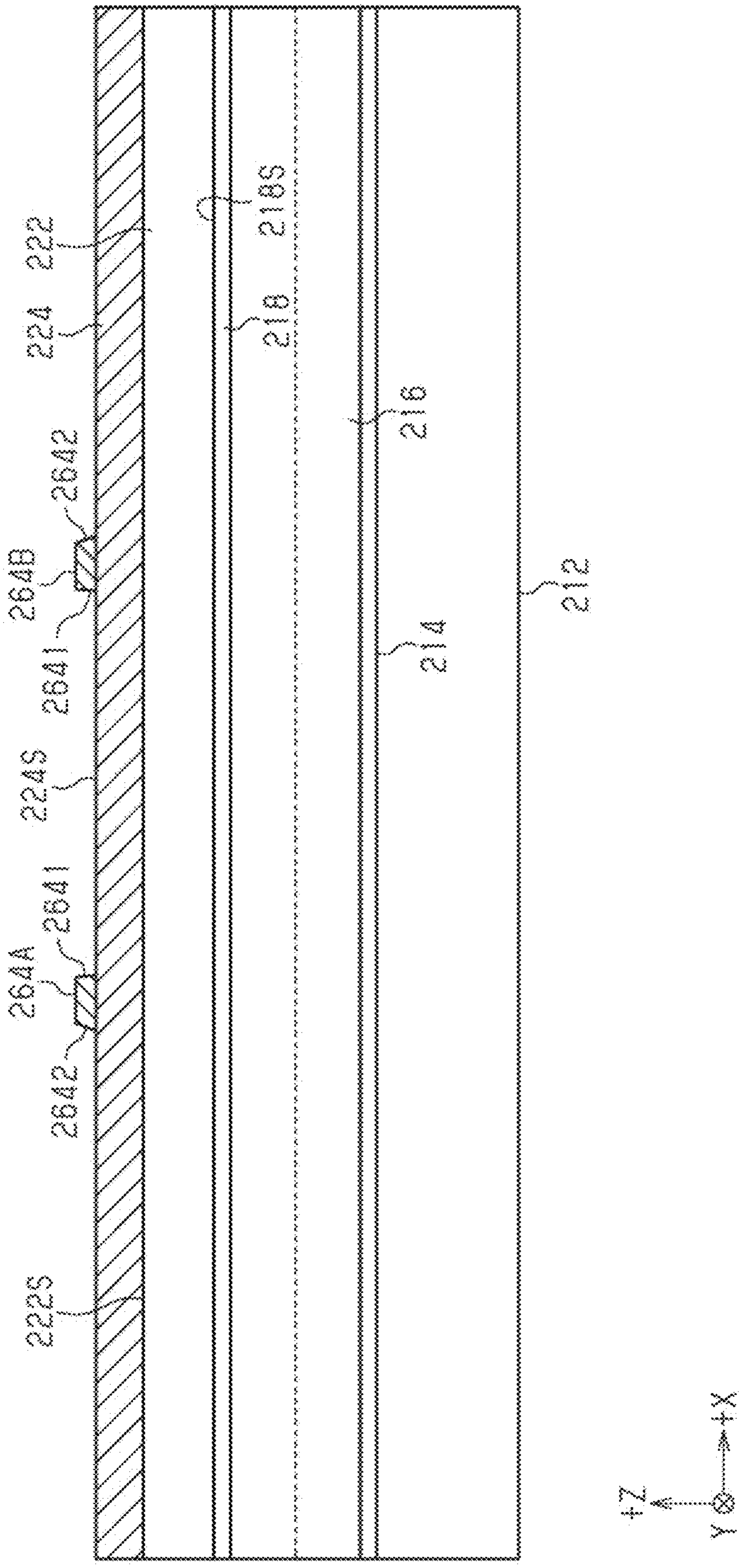
FIG. 21 is a schematic cross-sectional view showing a manufacturing step subsequent to FIG. 20.

As shown in FIG. 21, the manufacturing method of the nitride semiconductor device 210A further includes removing the first mask 262. Removal of the first mask 262 forms the two second masks 264A and 264B on the metal layer 224.

Figure 22:
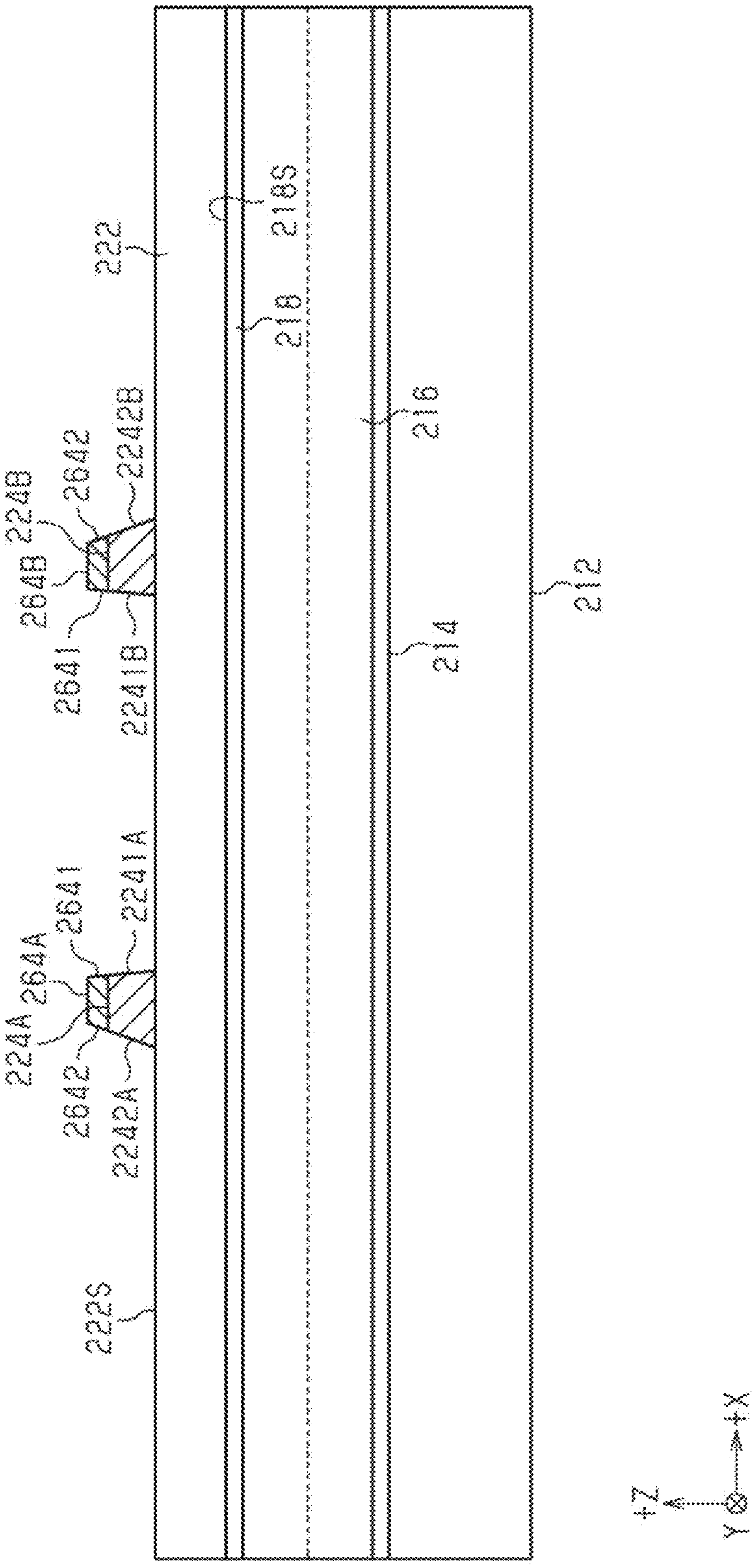
FIG. 22 is a schematic cross-sectional view showing a manufacturing step subsequent to FIG. 21.

As shown in FIG. 22, the manufacturing method of the nitride semiconductor device 210A further includes forming the gate electrode 224. The gate electrode 224 includes the first gate electrode 224A and the second gate electrode 224B. The first gate electrode 224A and the second gate electrode 224B are formed by patterning the metal layer 224 (refer to FIG. 21) exposed from the two second masks 264A and 264B.

The first gate electrode 224A is shaped in accordance with the second mask 264A. As shown in FIG. 22, the first gate electrode 224A is trapezoidal in cross-sectional view. The first gate electrode 224A includes the source-side electrode surface 2241A, which faces toward the second gate electrode 224B, and the drain-side electrode surface 2242A, which faces away from the second gate electrode 224B. The source-side electrode surface 2241A includes the inclination angle θ11 shown in FIG. 14. The drain-side electrode surface 2242A includes the inclination angle θ12 shown in FIG. 14.

The second gate electrode 224B is shaped in accordance with the second mask 264B. As shown in FIG. 22, the second gate electrode 224B is trapezoidal in cross-sectional view. The second gate electrode 224B includes the source-side electrode surface 2241B, which faces toward the first gate electrode 224A, and the drain-side electrode surface 2242B, which faces away from the second gate electrode 224B. The source-side electrode surface 2241B includes the inclination angle θ21 shown in FIG. 14. The drain-side electrode surface 2242B includes the inclination angle θ22 shown in FIG. 14.

Figure 23:
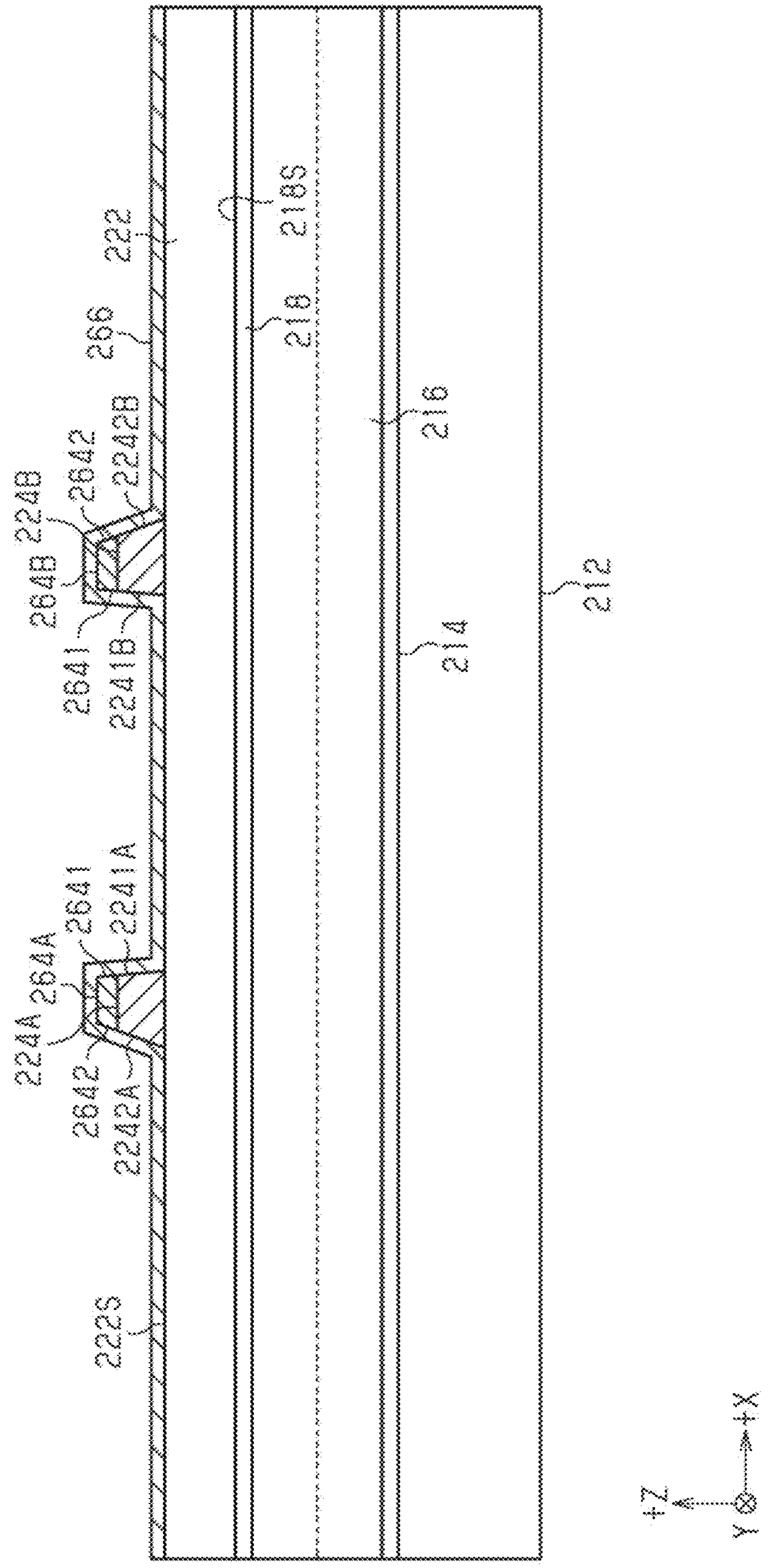
FIG. 23 is a schematic cross-sectional view showing a manufacturing step subsequent to FIG. 22.

As shown in FIG. 23, the manufacturing method of the nitride semiconductor device 210A further includes forming a third mask layer 266. The third mask layer 266 is, for example, a SiN layer. The third mask layer 266 may be formed by, for example, plasma-enhanced chemical vapor deposition (PECVD). The third mask layer 266 is formed to cover the upper surface 222S of the third nitride semiconductor layer 222, the side surfaces of the first gate electrode 224A and the second gate electrode 224B, and the upper and side surfaces of the second masks 264A and 264B.

Figure 24:
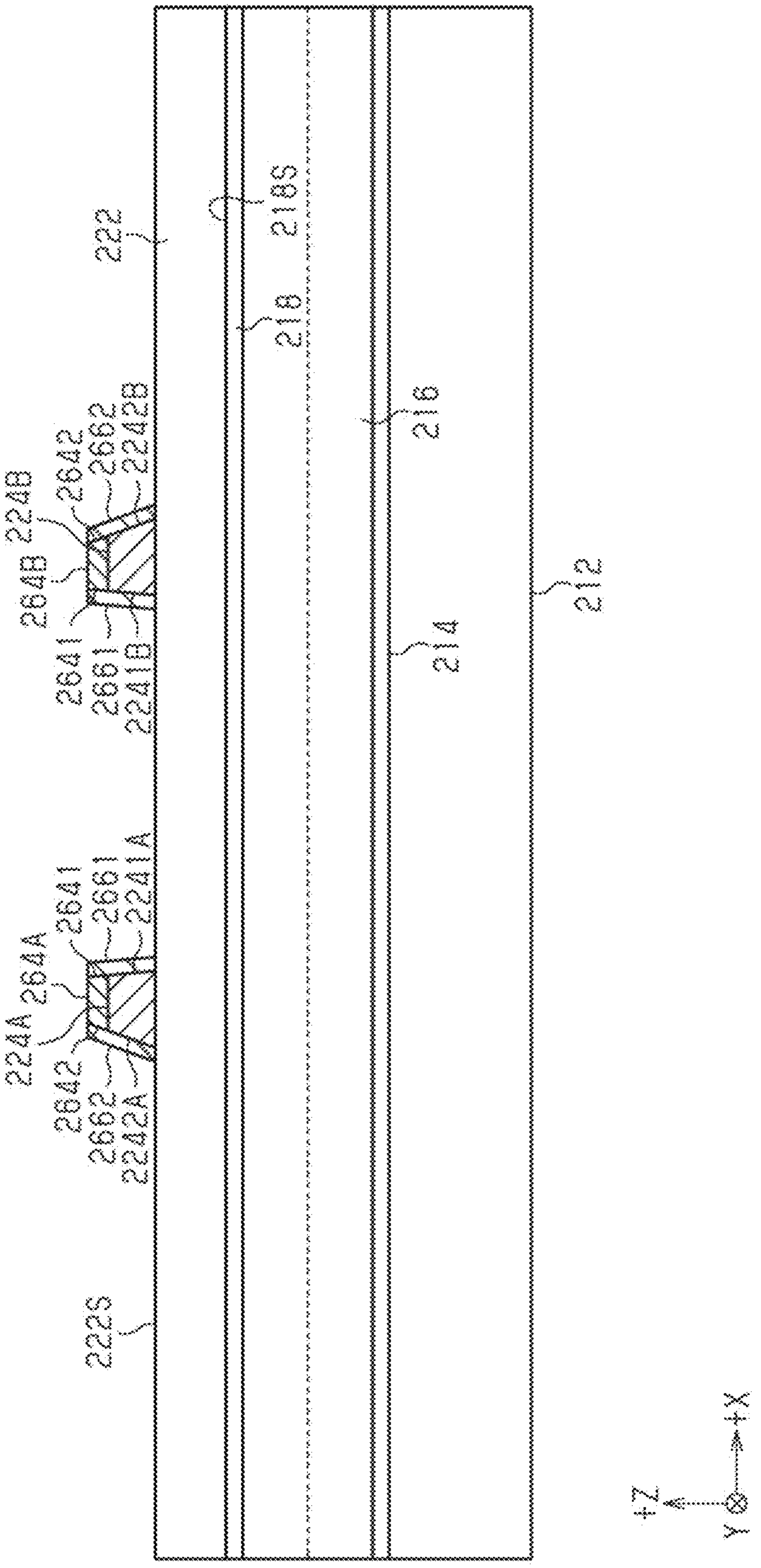
FIG. 24 is a schematic cross-sectional view showing a manufacturing step subsequent to FIG. 23.

As shown in FIG. 24, the manufacturing method of the nitride semiconductor device 210A further includes forming third masks 2661 and 2662 that cover the source-side electrode surfaces 2241A and 2241B and the drain-side electrode surface 2242A and 2242B, which are the side surfaces of the first gate electrode 224A and the second gate electrode 224B, and side surfaces 2641 and 2642 of the second masks 264A and 264B. The third masks 2661 and 2662 are obtained by etching back the third mask layer 266 shown in FIG. 23 until the upper surface of the third nitride semiconductor layer 222 is exposed.

Figure 25:
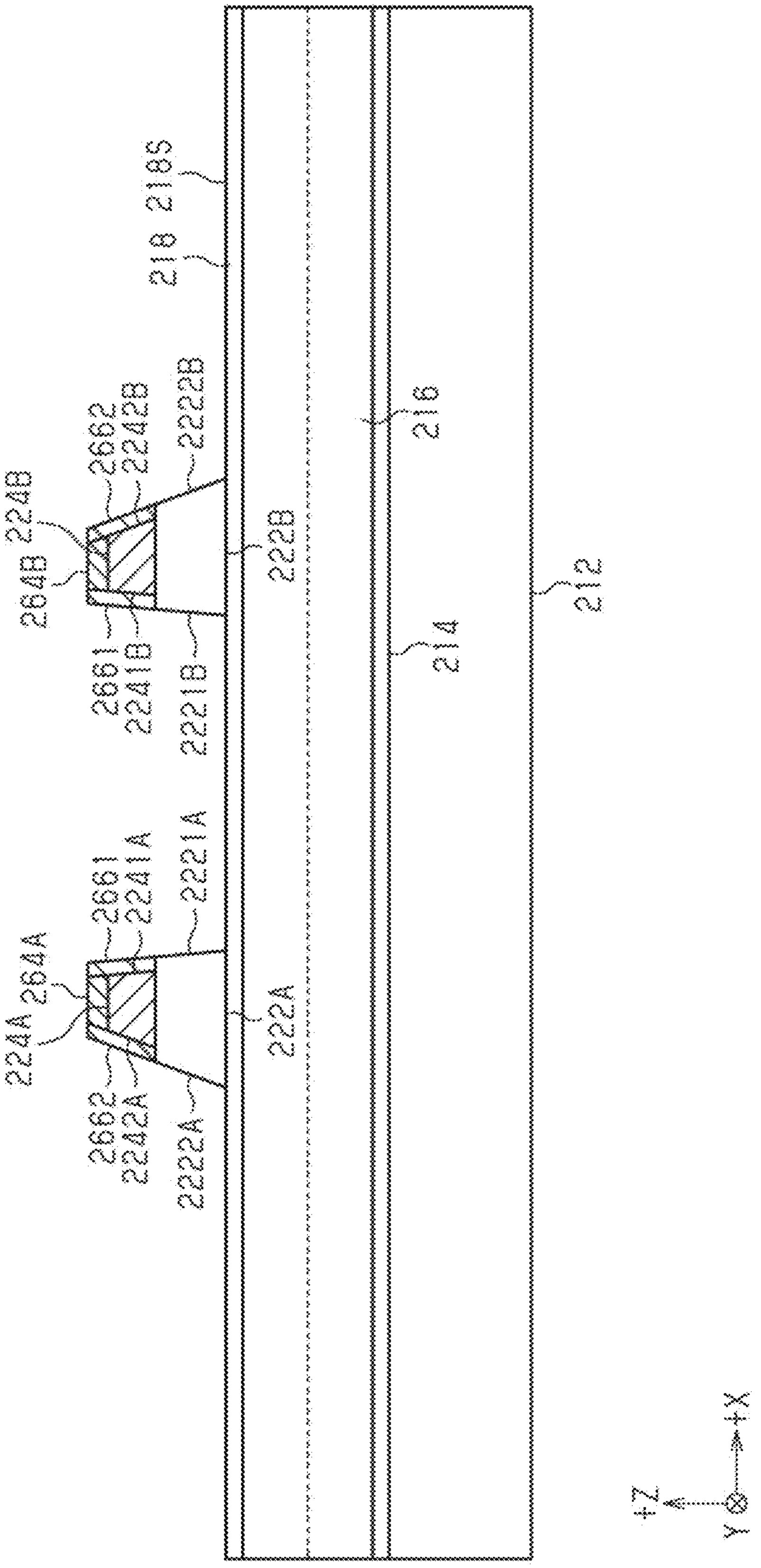
FIG. 25 is a schematic cross-sectional view showing a manufacturing step subsequent to FIG. 24.

As shown in FIG. 25, the manufacturing method of the nitride semiconductor device 210A further includes forming the first gate layer 222A and the second gate layer 222B. The first gate layer 222A and the second gate layer 222B are obtained by etching the third nitride semiconductor layer 222 exposed from the second masks 264A and 264B and the third masks 2661 and 2662.

In this process, the first gate layer 222A is shaped in accordance with the third masks 2661 and 2662 that cover the first gate electrode 224A. As shown in FIG. 25, the first gate layer 222A is trapezoidal in cross-sectional view. The first gate layer 222A includes the source-side gate surface 2221A, which faces toward the second gate layer 222B, and the drain-side gate surface 2222A, which faces away from the second gate layer 222B. The source-side gate surface 2221A includes the inclination angle θ11 shown in FIG. 14. The drain-side gate surface 2222A includes the inclination angle θ12 shown in FIG. 14.

The second gate layer 222B is shaped in accordance with the third masks 2661 and 2662 that cover the second gate electrode 224B. As shown in FIG. 25, the second gate layer 222B is trapezoidal in cross-sectional view. The second gate layer 222B includes the source-side gate surface 2221B, which faces toward the first gate layer 222A, and the drain-side gate surface 2222B, which faces away from the first gate layer 222A. The source-side gate surface 2221B includes the inclination angle θ11 shown in FIG. 14. The drain-side gate surface 2222B includes the inclination angle θ12 shown in FIG. 14.

Figure 26:
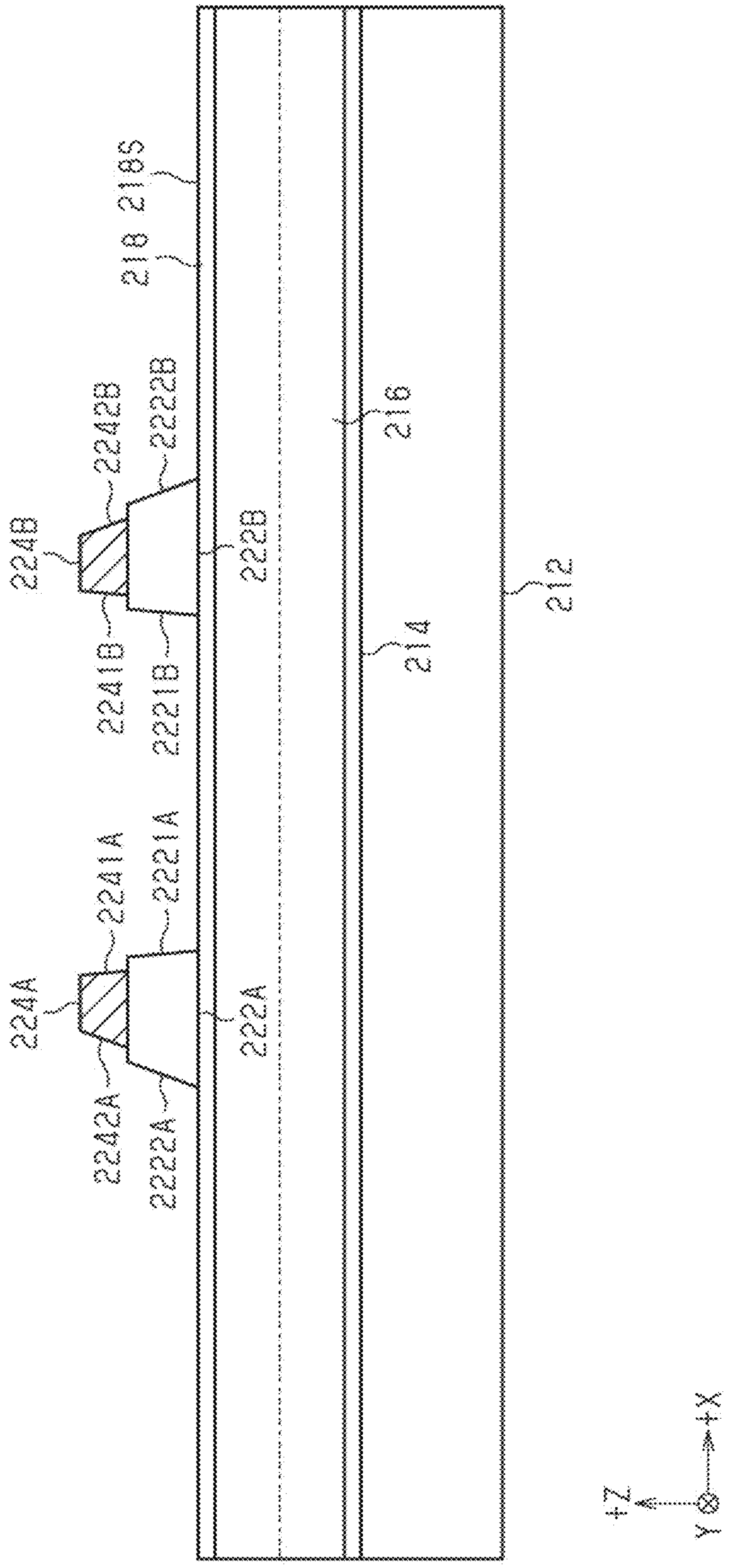
FIG. 26 is a schematic cross-sectional view showing a manufacturing step subsequent to FIG. 25.

As shown in FIG. 26, the manufacturing method of the nitride semiconductor device 210A further includes removing the second masks 264A and 264B and the third masks 2661 and 2662.

Figure 27:
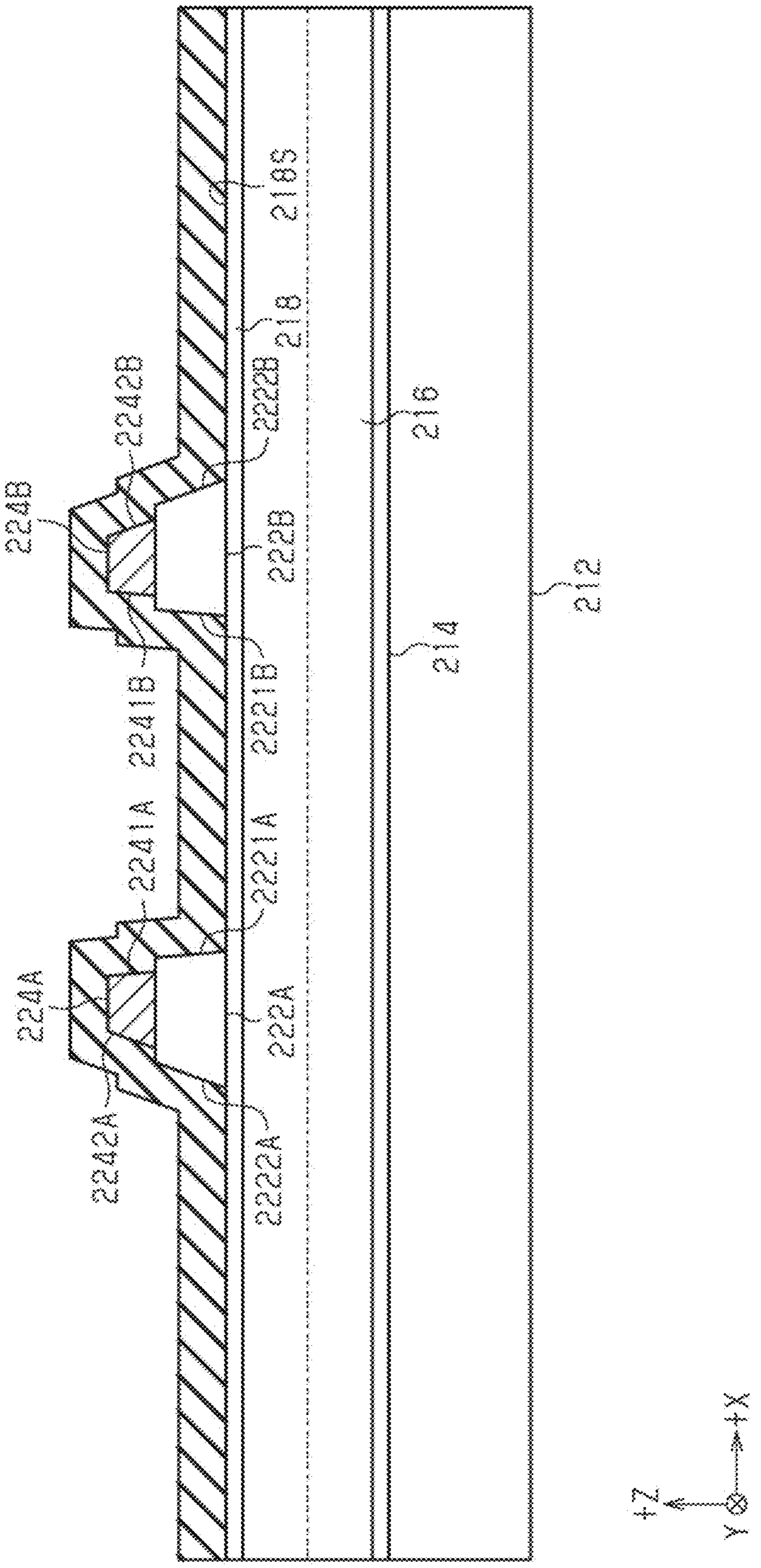
FIG. 27 is a schematic cross-sectional view showing a manufacturing step subsequent to FIG. 26.

As shown in FIG. 27, the manufacturing method of the nitride semiconductor device 210A further includes forming the passivation layer 226 that covers the entirety of exposed surfaces of the electron supply layer 218, the first and second gate layers 222A and 222B, and the first and second gate electrodes 224A and 224B. The passivation layer 226 may be, for example, a SiN layer. The passivation layer 226 may be formed by, for example, low-pressure chemical vapor deposition (LPCVD).

Figure 28:
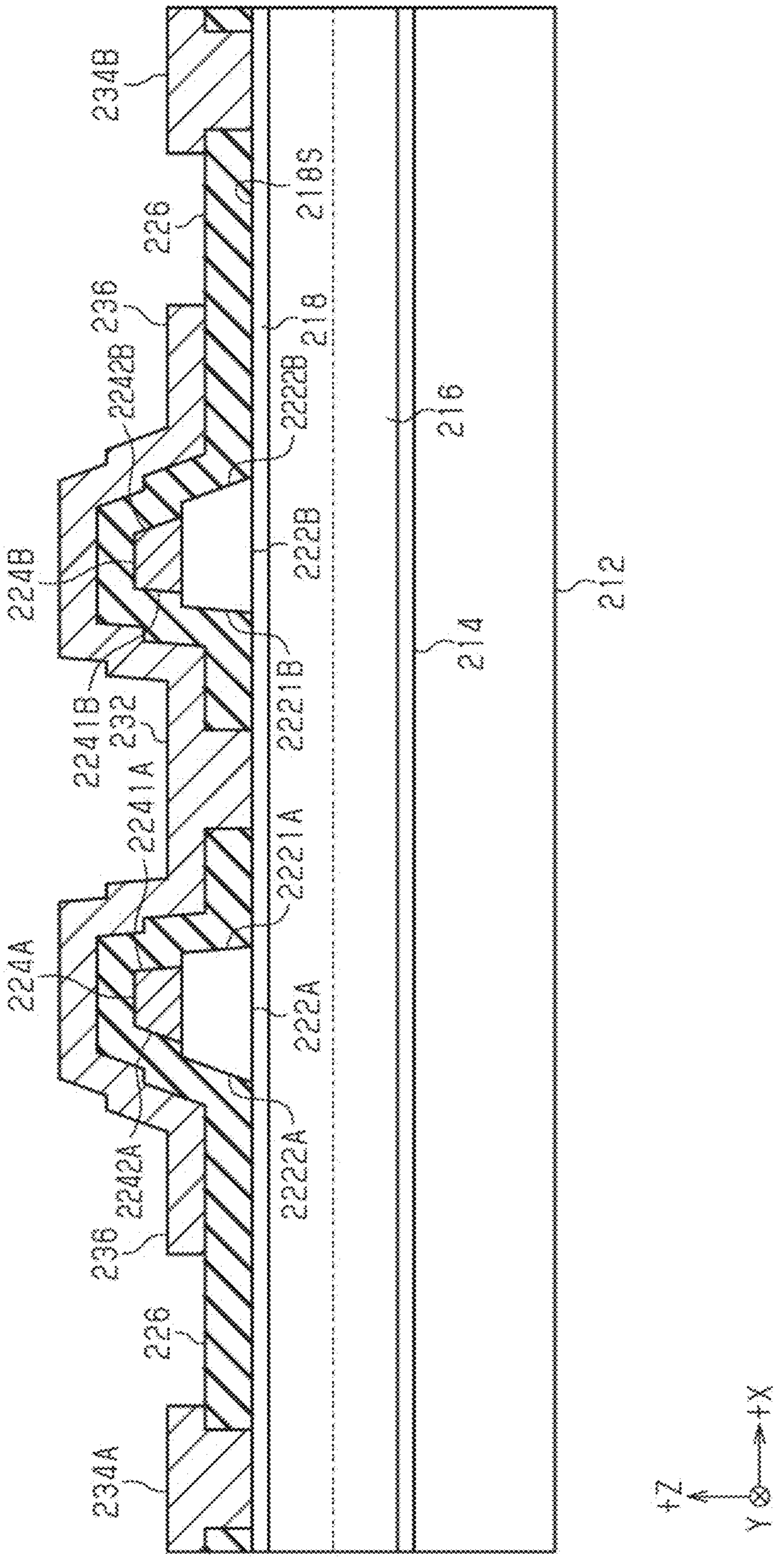
FIG. 28 is a schematic cross-sectional view showing a manufacturing step subsequent to FIG. 27.

As shown in FIG. 28, the manufacturing method of the nitride semiconductor device 210A further includes forming the source opening 2261 and the drain opening 2262 in the passivation layer 226. The source opening 2261 and the drain opening 2262 may be formed by selectively removing the passivation layer 226 through lithography and etching.

The manufacturing method of the nitride semiconductor device 210A further includes forming the source electrode 232, the drain electrodes 234A and 234B, and the source field plate 236. The source electrode 232, the drain electrodes 234A and 234B, and the source field plate 236 may be obtained by forming a metal layer that fills the source opening 2261 and the drain opening 2262 and covers the passivation layer 226 and then selectively removing the metal layer through lithography and etching. The metal layer may include at least one of a Ti layer, a TiN layer, an Al layer, an AlSiCu layer, and an AlCu layer. This obtains the nitride semiconductor device 210A shown in FIGS. 13 to 15.

In the manufacturing method of the nitride semiconductor device 210A of the second embodiment, the two second masks 264A and 264B are formed on opposite sides of the first mask 262 as side walls and are used to form the first gate electrode 224A and the second gate electrode 224B. With this structure, the width (dimension in the X-direction in FIG. 21) of the second masks 264A and 264B is decreased as compared to a structure in which two second masks are formed without the first mask 262.

The separate second masks 264A and 264B may be formed by forming a mask layer that covers the metal layer 224 shown in FIG. 18 and a resist film that covers the mask layer, forming a pattern in the resist film through photolithography, and etching the mask layer using the pattern as a mask. In this case, the widths of the second masks 264A and 264B depend on the properties of an exposure machine that exposes the resist film that will form a pattern. In an example, when an exposure machine uses i-line, the minimum width is approximately 0.7 μm.

In contrast, the side walls formed on opposite sides of the first mask 262, that is, the widths of the second masks 264A and 264B, are determined by the thickness of the second mask layer 264 (refer to FIG. 19) that covers the first mask 262. The widths of the second masks 264A and 264B may be adjusted by adjusting the thickness of the second mask layer 264. The gate layer 222 is formed by the third masks 2661 and 2662 covering the gate electrode 224. Therefore, the width of the gate layer 222 is determined by the thickness of the third masks 2661 and 2662 covering the gate electrode 224, that is, the thickness of the third mask layer 266. Thus, the gate layer 222 and the gate electrode 224 are formed with no effect of limitations imposed by the exposure machine or the like. This allows the gate layer 222 and the gate electrode 224 to have a width that is smaller than the width limited by the properties of the exposure machine. A decrease in the width of the gate layer 222 decreases the on-resistance of the nitride semiconductor device 210A.

As described above, the present embodiment has the following advantages.

(2-1) The nitride semiconductor device 210A includes the electron transit layer 216, the electron supply layer 218, the gate layer 222, the gate electrode 224, the source electrode 232, and the drain electrode 234. The electron transit layer 216 is composed of a nitride semiconductor. The electron supply layer 218 is formed on the electron transit layer 216 and is composed of a nitride semiconductor having a band gap that is larger than that of the electron transit layer 216. The gate layer 222 is formed on the electron supply layer 218 and is composed of a nitride semiconductor having a band gap that is smaller than that of the electron supply layer 218. The gate electrode 224 is formed on the gate layer 222. The source electrode 232 and the drain electrode 234 are arranged at opposite sides of the gate layer 222 in the X-direction and are in contact with the electron supply layer 218.

The gate layer 222 includes the source-side gate surface 2221, which is one of the opposite surfaces in the X-direction located closer to the source electrode 232, and the drain-side gate surface 2222, which is opposite to the source-side gate surface 2221. As viewed in a direction orthogonal to the thickness-wise direction of the gate layer 222 and the X-direction, the inclination angle θ12 of the drain-side gate surface 2222 is smaller than the inclination angle θ11 of the source-side gate surface 2221.

The gate layer 222 including the inclined drain-side gate surface 2222 reduces concentration of an electric field on the end of the gate layer 222 located at the side of the drain electrode 234. Thus, the nitride semiconductor device 210A limits a dielectric breakdown of the electron supply layer 218 or the like, thereby avoiding a decrease in the drain-source breakdown voltage.

(2-2) The gate electrode 224 also includes the drain-side electrode surface 2242, which is inclined from the upper surface 222S of the gate layer 222 at the inclination angle θ22. When a positive voltage is applied to the gate electrode 224 including the inclined drain-side electrode surface 2242, the gate electrode 224 reduces concentration of an electric field on a portion of the gate layer 222 in the vicinity of the end of the gate electrode 224. The nitride semiconductor device 210A limits occurrence of a crystal defect and a crystal fracture of the gate layer 222, thereby avoiding a decrease in the gate breakdown voltage.

(2-3) The gate layer 222 includes the source-side gate surface 2221 located at the side of the source electrode 232 and the drain-side gate surface 2222 located at the side of the drain electrode 234. The inclination angle θ11 of the source-side gate surface 2221 is greater than the inclination angle θ12 of the drain-side gate surface 2222. Thus, the width W11 of the gate layer 222, that is, the gate length, is decreased as compared to a structure in which the source-side gate surface 2221 and the drain-side gate surface 2222 have equal inclination angles.

(2-4) In the manufacturing method of the nitride semiconductor device 210A of the second embodiment, the two second masks 264A and 264B are formed on opposite sides of the first mask 262 as side walls and are used to form the first gate electrode 224A and the second gate electrode 224B. With this structure, the widths of the second masks 264A and 264B are decreased as compared to a structure in which two second masks are formed without the first mask 262. The widths of the gate layer 222 and the gate electrode 224 are decreased as compared to a structure in which the two second masks 264A and 264B are formed by photolithography.

Third Embodiment

Cross-Sectional Structure of Nitride Semiconductor Device

Figure 29:
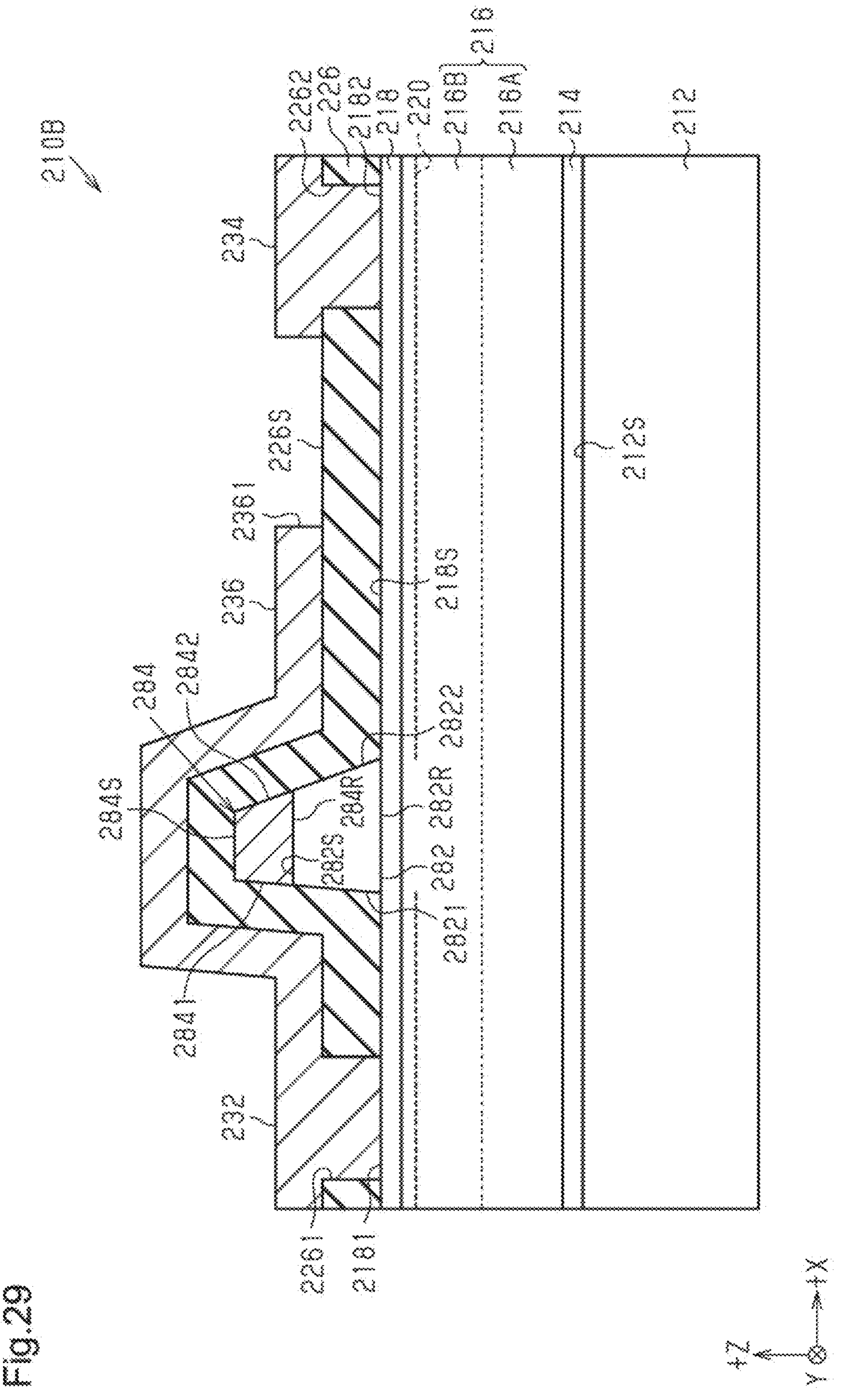
FIG. 29 is a schematic cross-sectional view showing a third embodiment of an exemplary nitride semiconductor device.

FIG. 29 is a schematic cross-sectional view showing a third embodiment of an exemplary nitride semiconductor device 210B. FIG. 29 is shown in correspondence with FIG. 13, which shows the nitride semiconductor device 210A of the second embodiment. In FIG. 29, the same reference characters are given to those components that are the same as the corresponding components of the nitride semiconductor device 210A of the second embodiment. Such components will not be described in detail.

The nitride semiconductor device 210B of the third embodiment includes a gate layer 282 and a gate electrode 284. The gate layer 282 includes an upper surface 282S, a lower surface 282R facing a direction opposite from the upper surface 282S, a source-side gate surface 2821 facing toward the source electrode 232, and a drain-side gate surface 2822 facing toward the drain electrode 234. The gate electrode 284 includes an upper surface 284S, a lower surface 284R facing a direction opposite from the upper surface 284S, a source-side electrode surface 2841 facing toward the source electrode 232, and a drain-side electrode surface 2842 facing toward the drain electrode 234.

The inclination angle of the source-side gate surface 2821 is equal to the inclination angle θ11 of the source-side gate surface 2221 of the second embodiment shown in FIG. 14. The inclination angle of the drain-side gate surface 2822 is equal to the inclination angle θ12 of the drain-side gate surface 2222 of the second embodiment shown in FIG. 14. Therefore, the inclination angle of the drain-side gate surface 2822 is smaller than the inclination angle of the source-side gate surface 2821.

The inclination angle of the source-side electrode surface 2841 is equal to the inclination angle θ21 of the source-side electrode surface 2241 of the second embodiment shown in FIG. 14. The inclination angle of the drain-side electrode surface 2842 is equal to the inclination angle θ22 of the drain-side electrode surface 2242 of the second embodiment shown in FIG. 14. Therefore, the inclination angle of the drain-side electrode surface 2842 is smaller than the inclination angle of the source-side electrode surface 2841.

In the third embodiment, the source-side gate surface 2821 of the gate layer 282 is flush with the source-side electrode surface 2841 of the gate electrode 284. Also, the drain-side gate surface 2822 of the gate layer 282 is flush with the drain-side electrode surface 2842 of the gate electrode 284.

The nitride semiconductor device 210B, which includes the gate layer 282 and the gate electrode 284 as described above, reduces concentration of an electric field in the same manner as the nitride semiconductor device 210A of the second embodiment.

Manufacturing Method of Nitride Semiconductor Device of Third Embodiment

An example of a method for manufacturing the nitride semiconductor device 210B shown in FIG. 29 will be described.

The manufacturing method of the nitride semiconductor device 210B of the third embodiment differs from the manufacturing method of the nitride semiconductor device 210A of the second embodiment in the steps of forming the gate layer 282 and the gate electrode 284. The steps will now be described in detail.

Figure 30:
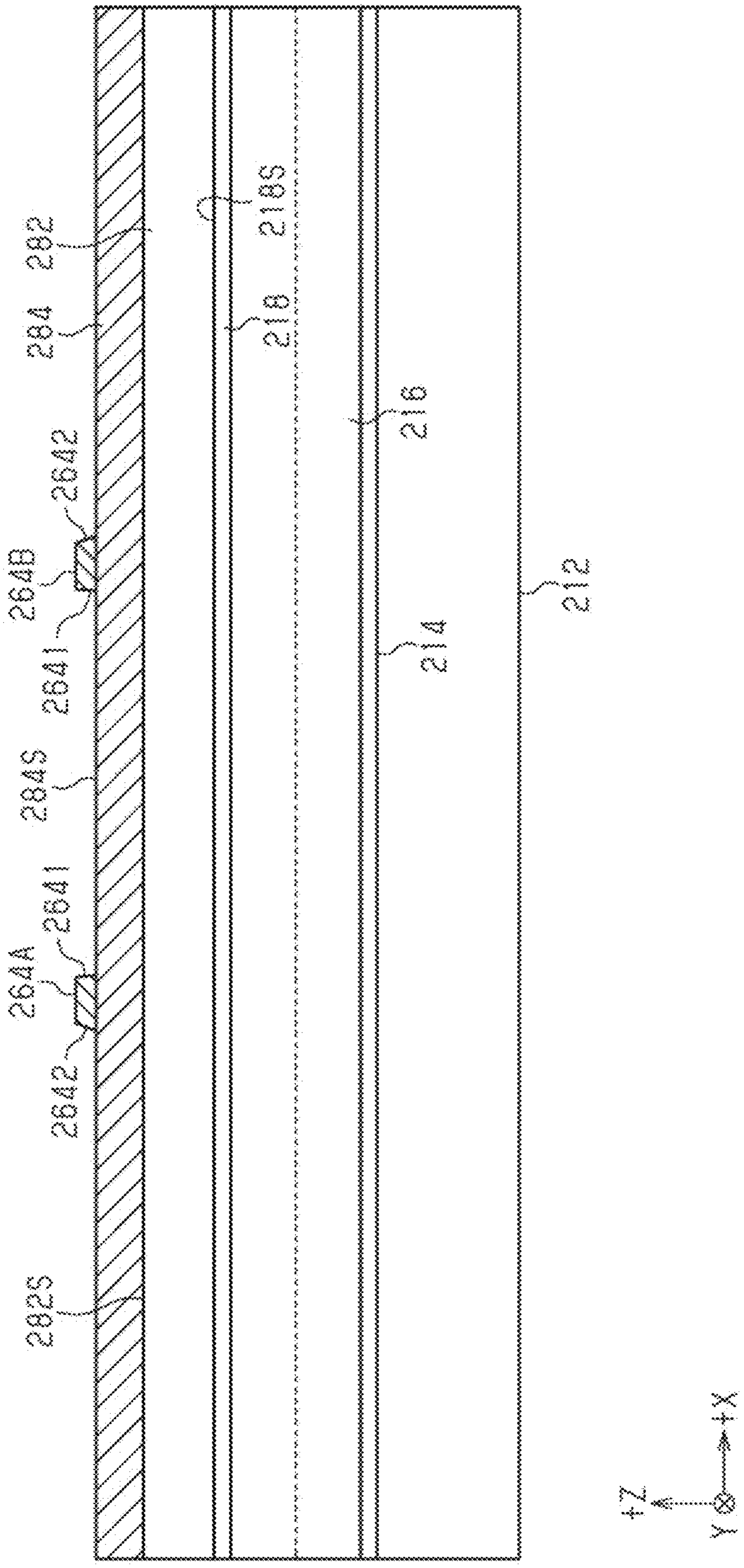
FIG. 30 is a schematic cross-sectional view showing an exemplary step for manufacturing the nitride semiconductor device shown in FIG. 29.

As shown in FIG. 30, the manufacturing method of the nitride semiconductor device 210B includes sequentially forming the buffer layer 214, a first nitride semiconductor layer 216, a second nitride semiconductor layer 218, and a third nitride semiconductor layer 282 on the substrate 212, which is, for example, a Si substrate. The third nitride semiconductor layer 282 includes the same material as the third nitride semiconductor layer 222 of the second embodiment. The third nitride semiconductor layer 282 forms the gate layer 282 shown in FIG. 29. The manufacturing method of the nitride semiconductor device 210A further includes forming a metal layer 284 on the third nitride semiconductor layer 282. The metal layer 284 forms the gate electrode 284 shown in FIG. 29. The metal layer 284 may be, for example, a TiN layer.

The manufacturing method of the nitride semiconductor device 210B further includes forming the two second masks 264A and 264B on the upper surface of the metal layer 284. The second masks 264A and 264B are formed by the same step shown in FIG. 21 in the manufacturing method of the nitride semiconductor device 210A of the second embodiment. That is, FIG. 30 shows a manufacturing step that follows the step shown in FIG. 20 of the second embodiment.

Figure 31:
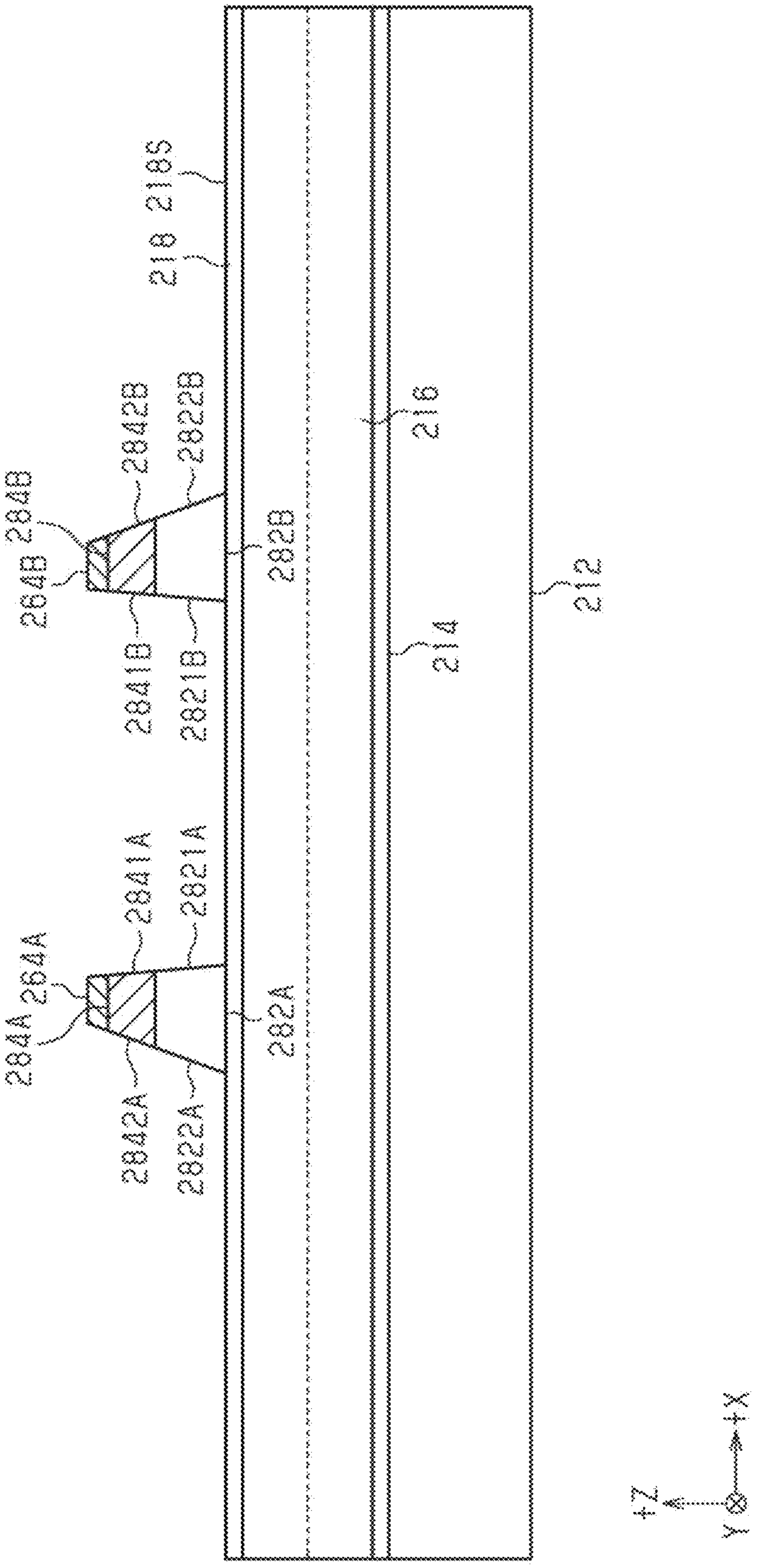
FIG. 31 is a schematic cross-sectional view showing a manufacturing step subsequent to FIG. 30.

As shown in FIG. 31, the manufacturing method of the nitride semiconductor device 210B includes forming gate electrodes 284A and 284B and gate layers 282A and 282B. The gate electrodes 284A and 284B include source-side electrode surfaces 2841A and 2841B and drain-side electrode surfaces 2842A and 2842B. The gate layers 282A and 282B include source-side gate surfaces 2821A and 2821B and drain-side gate surfaces 2822A and 2822B. The first gate electrode 284A and the second gate electrode 284B are obtained by etching the metal layer 284 (refer to FIG. 30) exposed from the second masks 264A and 264B. The first gate layer 282A and the second gate layer 282B are obtained by etching the third nitride semiconductor layer 282 (refer to FIG. 30) exposed from the second masks 264A and 264B, the first gate electrode 284A, and the second gate electrode 284B Subsequently, the passivation layer 226, the source electrode 232, and the drain electrode 234 (refer to FIG. 29) are formed by the manufacturing steps of the manufacturing method of the nitride semiconductor device 210A of the second embodiment shown in FIGS. 27 and 28. This obtains the nitride semiconductor device 210B shown in FIG. 29.

Advantages

As described above, the third embodiment has the following advantages.

(3-1) The nitride semiconductor device 210B of the third embodiment includes the gate layer 282 and the gate electrode 284. In the gate layer 282, the inclination angle of the drain-side gate surface 2822 is smaller than the inclination angle of the source-side gate surface 2821. Thus, in the same manner as the nitride semiconductor device 210A of the second embodiment, the nitride semiconductor device 210B of third embodiment mitigates concentration of an electric field on the end of the gate layer 282 at the side of the drain electrode 234. The nitride semiconductor device 210B limits a dielectric breakdown of the electron supply layer 218 or the like, thereby avoiding a decrease in the drain-source breakdown voltage.

(3-2) In the gate electrode 284, the inclination angle of the drain-side electrode surface 2842 is smaller than the inclination angle of the source-side electrode surface 2841. When a positive voltage is applied to the gate electrode 284 including the drain-side electrode surface 2842, the gate electrode 284 reduces concentration of an electric field on a portion of the gate layer 282 in the vicinity of the end of the gate electrode 284. The nitride semiconductor device 210B limits occurrence of a crystal defect and a crystal fracture of the gate layer 222, thereby avoiding a decrease in the gate breakdown voltage.

(3-3) In the nitride semiconductor device 210B of the third embodiment, the source-side gate surface 2821 of the gate layer 282 is flush with the source-side electrode surface 2841 of the gate electrode 284. Also, in the nitride semiconductor device 210B, the drain-side gate surface 2822 of the gate layer 282 is flush with the drain-side electrode surface 2842 of the gate electrode 284. The gate layer 282 of the third embodiment does not include the first side space 222S1 and the second side space 222S2 of the gate layer 222 of the second embodiment. In an example, when the gate electrode 284 and the gate electrode 224 of the second embodiment have the same width, the width of the gate layer 282 of the third embodiment is less than the gate layer 222 of the second embodiment. In the nitride semiconductor device 210B of the third embodiment, the gate length is shorter than in the nitride semiconductor device 210A of the second embodiment.

(3-4) In the manufacturing method of the nitride semiconductor device 210B of the third embodiment, the gate layer 282 is formed by etching the third nitride semiconductor layer 282 exposed from the gate electrode 284 following formation of the gate electrode 284. Thus, the number of steps is less than that of the nitride semiconductor device 210A of the second embodiment. Accordingly, the nitride semiconductor device 210B of the third embodiment is manufactured in a shorter time.

Modified Examples of Second and Third Embodiments

The embodiments may be modified, for example, as follows. The embodiments described above and modified examples described below may be combined with one another as long as there is no technical inconsistency. In the following modified examples, the same reference characters are given to those elements that are the same as the corresponding elements of the above embodiment. Such elements will not be described in detail.

In the embodiments, the shapes of the gate layers 222 and 282 may be changed.

Figure 32:
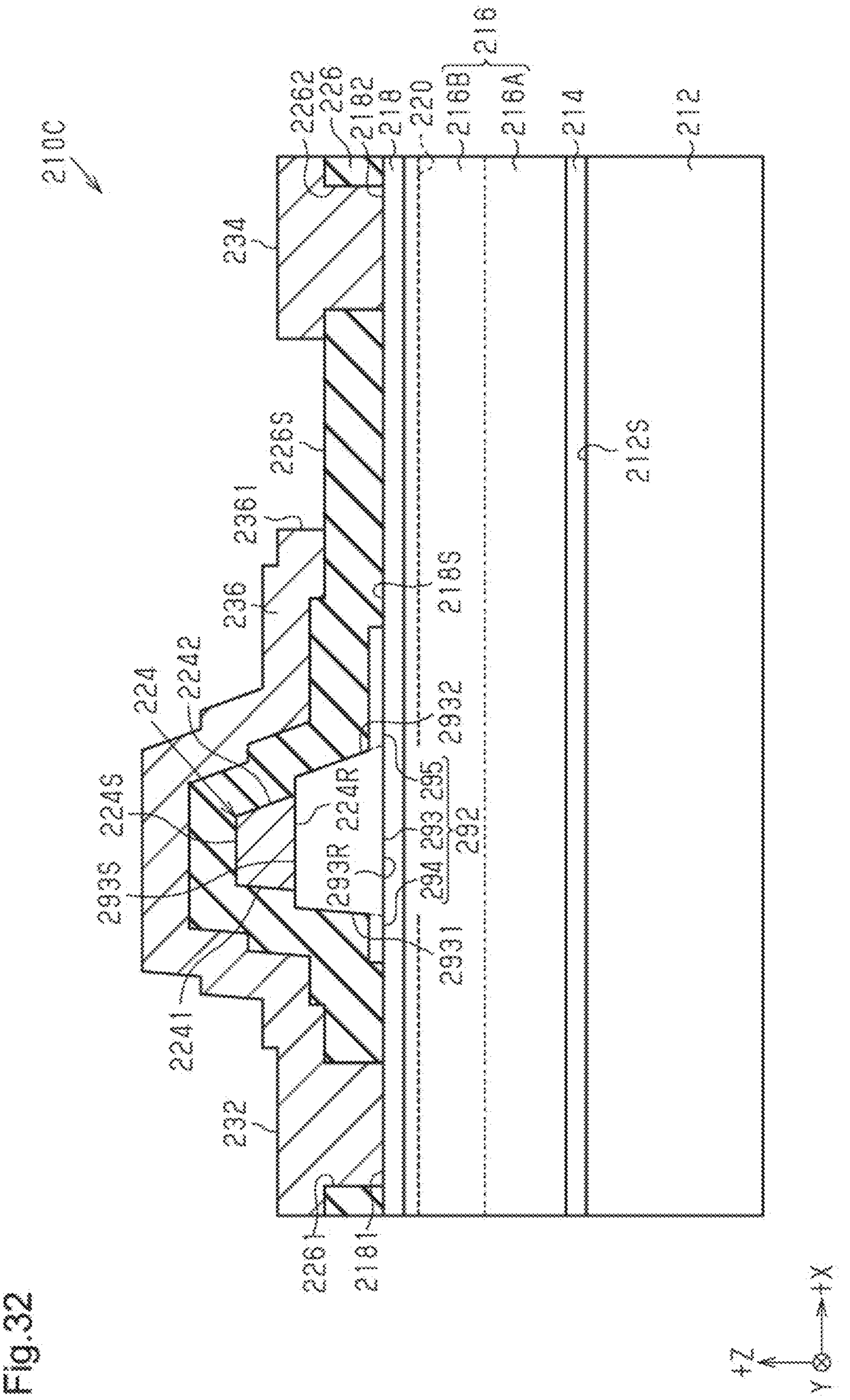
FIG. 32 is a schematic cross-sectional view of a nitride semiconductor device in a modified example.

FIG. 32 shows a modified example of a nitride semiconductor device 210C including a gate layer 292 having a step structure. In an example, the gate layer 292 includes a ridge 293, a source-side step 294, and a drain-side step 295. The source-side step 294 and the drain-side step 295 extend from opposite sides of the ridge 293 in opposite directions. The ridge 293, the source-side step 294, and the drain-side step 295 form the step structure of the gate layer 292.

The ridge 293 corresponds to a relatively thick portion of the gate layer 292. The ridge 293 includes an upper surface 293S and a lower surface 293R that face in opposite directions. The gate electrode 224 is in contact with a portion of the upper surface 293S of the ridge 293. The ridge 293 may have a trapezoidal cross-section extending along the XZ-plane shown in FIG. 32. The ridge 293 may have a thickness, for example, in a range of 100 nm to 200 nm. The thickness of the ridge 293 is a distance from the upper surface of the ridge 293 to the lower surface (the lower surface of the gate layer 292 in contact with the electron supply layer 218). The thickness of the ridge 293 (the gate layer 292) may be determined taking into consideration various parameters such as gate breakdown voltage.

The ridge 293 may have, for example, the same shape as the gate layer 222 of the second embodiment shown in FIGS. 13 and 14. The ridge 293 includes a source-side gate surface 2931, located at the side of the source electrode 232, and a drain-side gate surface 2932, located at the side of the drain electrode 234 opposite from the source-side gate surface 2931. The source-side gate surface 2931 is inclined from the upper surface 218S of the electron supply layer 218. The inclination angle of the source-side gate surface 2931 is equal to the inclination angle θ11 of the source-side gate surface 2221 of the second embodiment shown in FIG. 14. The drain-side gate surface 2932 is inclined from the upper surface 218S of the electron supply layer 218. The inclination angle of the drain-side gate surface 2932 is equal to the inclination angle θ12 of the drain-side gate surface 2222 of the second embodiment shown in FIG. 14. The ridge 293 may have the same shape as the gate layer 282 of the third embodiment shown in FIG. 29.

The source-side step 294 extends from the source-side gate surface 2931 of the ridge 293 toward the source opening 2261 of the passivation layer 226. The drain-side step 295 extends from the drain-side gate surface 2932 of the ridge 293 toward the drain opening 2262 of the passivation layer 226. In the example shown in FIG. 32, the drain-side step 295 extends longer than the source-side step 294 from the ridge 293. Alternatively, the source-side step 294 and the drain-side step 295 may have the same length. The source-side step 294 and the drain-side step 295 have the same thickness. When the difference between the thickness of the source-side step 294 and the thickness of the drain-side step 295 is, for example, within 10% of the thickness of the source-side step 294, it is considered that the source-side step 294 and the drain-side step 295 have the same thickness.

The nitride semiconductor device 210C of the modified example reduces concentration of an electric field on the gate layer 292 in the same manner as the nitride semiconductor device 210A of the second embodiment. This avoids a decrease in the gate breakdown voltage.

The source field plate 236 is formed integrally with the upper region of the source electrode 232 and arranged on the passivation layer 226 to cover the entirety of the gate layer 222 (in the example shown in FIG. 13, all of the ridge 293, the source-side step 294, and the drain-side step 295) in plan view.

In the nitride semiconductor device 210C of the modified example, the density of holes accumulated in the interface between the gate layer 222 and the electron supply layer 218 is reduced by the source-side step 294 and the drain-side step 295. This limits the band bending of the electron supply layer 218 caused by the hole accumulation and limits an increase in leakage current of the gate.

In the embodiments, the source field plate 236 may be omitted.

In the second embodiment, one of the first side space 222S1 and the second side space 222S2 may be omitted from the gate layer 222. In an example, the source-side gate surface 2221 of the gate layer 222 may be flush with the source-side electrode surface 2241 of the gate electrode 224. The drain-side gate surface 2222 of the gate layer 222 may be flush with the drain-side electrode surface 2242 of the gate electrode 224. In the above cases, the width of the gate layer 222 may be decreased, or the width of the gate electrode 224 may be increased.

One or more of the various examples described in this specification may be combined within a range where there is no technical inconsistency.

In this specification, "at least one of A and B" should be understood to mean "only A, or only B, or both A and B."

In the present disclosure, the term "on" includes the meaning of "above" in addition to the meaning of "on" unless otherwise clearly indicated in the context. Therefore, the phrase "first layer formed on second layer" is intended to mean that the first layer may be formed on the second layer in contact with the second layer in one embodiment and that the first layer may be located above the second layer without contacting the second layer in another embodiment. In other words, the term "on" does not exclude a structure in which another layer is formed between the first layer and the second layer. For example, a structure in which the electron supply layer 18 is formed on the electron transit layer 16 includes a structure in which an intermediate layer is disposed between the electron supply layer 18 and the electron transit layer 16 to stably form the 2DEG.

In the present disclosure, the terms "first," "second," "third," and the like are used to distinguish objects and are not used to give priority to one object.

The directional terms used in the present disclosure such as "vertical," "horizontal," "above," "below," "top," "bottom," "frontward," "backward," "longitudinal," "lateral," "left," "right," "front," and "back" will depend upon a particular orientation of the device being described and illustrated. The present disclosure may include various alternative orientations. Therefore, the directional terms should not be narrowly construed.

In an example, the Z-axis direction as referred to in the present disclosure does not necessarily have to be the vertical direction and does not necessarily have to fully conform to the vertical direction. In the structures according to the present disclosure (e.g., the structure shown in FIG. 2), "upward" and "downward" in the Z-axis direction as referred to in the present description are not limited to "upward" and "downward" in the vertical direction. For example, the X-axis direction may conform to the vertical direction. The Y-axis direction may conform to the vertical direction.

CLAUSES

The technical aspects that are understood from the present disclosure will hereafter be described. It should be noted that, for the purpose of facilitating understanding with no intention to limit, elements described in clauses are given the reference characters of the corresponding elements of the embodiments. The reference characters used as examples to facilitate understanding, and the elements in each clause are not limited to those elements given with the reference characters.

A1. A nitride semiconductor device (10; 100), including:
- an electron transit layer (16) composed of a nitride semiconductor;
- an electron supply layer (18) formed on the electron transit layer (16) and composed of a nitride semiconductor having a band gap that is larger than that of the electron transit layer (16);
- a gate layer (20; 102) formed on the electron supply layer (18) and composed of a nitride semiconductor including an acceptor impurity;
- a gate electrode (22) formed on the gate layer (20; 102); and
- a source electrode (26) and a drain electrode (28) that are formed on the electron supply layer (18),
- where the gate layer (20; 102) includes an upper surface (20A; 102A) in contact with the gate electrode (22), and the upper surface (20A; 102A) is a Ga-polar surface.

A2. The nitride semiconductor device according to clause A1, where
- the gate layer (20) includes
  - a first GaN layer (32) in contact with the gate electrode (22), and
  - a second GaN layer (34) in contact with the electron supply layer (18),
- the first GaN layer (32) is composed of Ga-polar GaN, and
- the second GaN layer (34) is composed of N-polar GaN.

A3. The nitride semiconductor device according to clause A2, where the second GaN layer (34) is greater in thickness than the first GaN layer (32).

A4. The nitride semiconductor device according to clause A2 or A3, where
- the gate layer (20) has a thickness that is greater than or equal to 100 nm and less than 150 nm, and
- the first GaN layer (32) has a thickness that is greater than or equal to 5 nm and less than 30 nm.

A5. The nitride semiconductor device according to any one of clauses A2 to A4, where
- the second GaN layer (34) includes
  - a ridge (36) in contact with the electron supply layer (18) and covered by the first GaN layer (32), and
  - an extension (38; 40) in contact with the electron supply layer (18) and extending outward from the ridge (36) in plan view, and
- the extension (38; 40) is smaller in thickness than the ridge (36).

A6. The nitride semiconductor device according to clause A5, where the extension (38; 40) includes an upper surface (38A, 40A) that is at least partially a N-polar surface.

A7. The nitride semiconductor device according to clause A1, where the gate layer (102) is composed of Ga-polar GaN.

A8. The nitride semiconductor device according to clause A7, where the gate layer (102) includes
- a ridge (104) in contact with the electron supply layer (18) and including the upper surface (102A) of the gate layer (102), and
- an extension (106; 108) in contact with the electron supply layer (18) and extending outward from the ridge (104) in plan view, the extension (106; 108) being smaller in thickness than the ridge (104).

A9. The nitride semiconductor device according to any one of clauses A1 to A8, where the upper surface (20A; 102A) of the gate layer (20; 102) forms a Schottky junction with the gate electrode (22).

A10. The nitride semiconductor device according to any one of clauses A1 to A9, further including:
- a passivation layer (24) covering the electron supply layer (18), the gate layer, and the gate electrode (22) and including a first opening (24A) and a second opening (24B), where
- the source electrode (26) is in contact with the electron supply layer (18) through the first opening (24A),
- the drain electrode (28) is in contact with the electron supply layer (18) through the second opening (24B), and
- the gate layer (20; 102) is arranged between the first opening (24A) and the second opening (24B).

A11. The nitride semiconductor device according to any one of clauses A1 to A10, where
- the electron transit layer (16) is composed of GaN, and
- the electron supply layer (18) is composed of $Al_xGa_{1-x}N$, where $0.1<x<0.3$.

A12. The nitride semiconductor device according to clause A2, where the first GaN layer (32) includes a higher concentration of hydrogen than the second GaN layer (34).

A13. The nitride semiconductor device according to any one of clauses A1 to A12, further including:
- a semiconductor substrate (12); and
- a buffer layer (14) formed on the semiconductor substrate (12),
- where the electron transit layer (16) is formed on the buffer layer (14).

A14. The nitride semiconductor device according to any one of clauses A1 to A13, further including:
- a passivation layer (24) covering the electron supply layer (18), the gate layer, and the gate electrode (22) and including a first opening (24A) and a second opening (24B), where
- the source electrode (26) is in contact with the electron supply layer (18) through the first opening (24A),
- the drain electrode (28) is in contact with the electron supply layer (18) through the second opening (24B),
- the gate layer (102) includes
  - a ridge (104) in contact with the electron supply layer (18) and including the upper surface (102A) of the gate layer (102),
  - a first extension (106) in contact with the electron supply layer (18) and extending from the ridge (104) toward the first opening (24A), and
  - a second extension (108) in contact with the electron supply layer (18) and extending from the ridge (104) toward the second opening (24B),
- the first extension (106) and the second extension (108) are smaller in thickness than the ridge (104).

A15. A method for manufacturing a nitride semiconductor device (10), the method including:

forming an electron transit layer (16) composed of a nitride semiconductor;

forming an electron supply layer (18) on the electron transit layer (16), the electron supply layer (18) being composed of a nitride semiconductor having a band gap that is larger than that of the electron transit layer (16);

forming a gate layer (20) on the electron supply layer (18), the gate layer (22) being composed of a nitride semiconductor including an acceptor impurity;

forming a gate electrode (22) on the gate layer (20); and forming a source electrode (26) and a drain electrode (28) on the electron supply layer (18), where the gate layer (20) includes an upper surface (20A) in contact with the gate electrode (22), and the upper surface (20A) is a Ga-polar surface.

A16. The method according to clause A15, where the forming a gate layer (20) includes forming a first nitride semiconductor layer (50) on the electron supply layer (18), the first nitride semiconductor layer (50) being N-polar GaN that is grown using $N_2$ as a carrier gas, and forming a second nitride semiconductor layer (52) on the first nitride semiconductor layer (50), the second nitride semiconductor layer (52) being Ga-polar GaN that is grown using $H_2$ as a carrier gas.

A17. The method according to clause A15 or A16, where the gate layer (20) includes a first GaN layer (32) in contact with the gate electrode (22), and a second GaN layer (34) in contact with the electron supply layer (18), the first GaN layer (32) is composed of Ga-polar GaN, and the second GaN layer (34) is composed of N-polar GaN.

A18. The method according to clause A17, where the second GaN layer (34) is greater in thickness than the first GaN layer (32).

A19. The method according to clause A17 or A18, where the gate layer (20) has a thickness that is greater than or equal to 100 nm and less than 150 nm, and the first GaN layer (32) has a thickness that is greater than or equal to 5 nm and less than 30 nm.

A20. The method according to any one of clauses A15 to A19, where the upper surface (20A) of the gate layer (20) forms a Schottky junction with the gate electrode (22).

B1. A nitride semiconductor device, including:

an electron transit layer (216) composed of a nitride semiconductor;

an electron supply layer (218) formed on the electron transit layer (216), the electron supply layer (218) being composed of a nitride semiconductor having a band gap that is larger than that of the electron transit layer (216);

a gate layer (222) formed on the electron supply layer (218), the gate layer (222) being composed of a nitride semiconductor having a band gap that is smaller than that of the electron supply layer (218);

a gate electrode (224) formed on the gate layer (222); and a source electrode (232) and a drain electrode (234) that are in contact with the electron transit layer (216) and arranged at opposite sides of the gate layer (222) in a specified direction, where the gate layer (222) includes a source-side gate surface (2221) and a drain-side gate surface (2222) opposite to each other in the specified direction, the source-side gate surface (2221) is located toward the source electrode (232), as viewed in a direction orthogonal to a thickness-wise direction of the gate layer (222) and the specified direction, the drain-side gate surface (2222) has an inclination angle (θ12) that is smaller than an inclination angle of the source-side gate surface (2221).

B2. The nitride semiconductor device according to clause B1, where the inclination angle of the source-side gate surface (2221) is in a range of 80° to 90°, and the inclination angle of the drain-side gate surface (2222) is in a range of 60° to 80°.

B3. The nitride semiconductor device according to clause B1 or B2, where the gate layer (222) includes a lower surface that is in contact with the electron supply layer (218) and has a length in a range of 0.2 μm to 0.5 μm.

B4. The nitride semiconductor device according to any one of clauses B1 to B3, where the gate electrode (224) includes a source-side electrode surface (2241) and a drain-side electrode surface (2242) opposite to each other in the specified direction, the source-side electrode surface (2241) being located toward the source electrode (232), and the drain-side electrode surface (2242) being located toward the drain electrode (234), and an inclination angle (θ22) of the drain-side electrode surface (2242) is less than an inclination angle (θ21) of the source-side electrode surface (2241).

B5. The nitride semiconductor device according to clause B4, where the inclination angle (θ22) of the drain-side electrode surface (2242) is less than or equal to the inclination angle (θ12) of the drain-side gate surface (2222).

B6. The nitride semiconductor device according to clause B4, where the inclination angle (θ22) of the drain-side electrode surface (2242) is greater than or equal to the inclination angle (θ12) of the drain-side gate surface (2222).

B7. The nitride semiconductor device according to any one of clauses B4 to B6, where the inclination angle (θ21) of the source-side electrode surface (2241) is less than or equal to the inclination angle (θ11) of the source-side gate surface (2221).

B8. The nitride semiconductor device according to any one of clauses B4 to B6, where the inclination angle (θ21) of the source-side electrode surface (2241) is greater than or equal to the inclination angle (θ11) of the source-side gate surface (2221).

B9. The nitride semiconductor device according to any one of clauses B4 to B8, where in plan view, the drain-side electrode surface (2242) is located closer to the source electrode (232) than the drain-side gate surface (2222).

B10. The nitride semiconductor device according to any one of clauses B4 to B9, where the drain-side electrode surface (2242) is flush with the drain-side gate surface (2222).

B11. The nitride semiconductor device according to any one of clauses B7 to B10, where in plan view, the source-side electrode surface (2241) is located closer to the drain electrode (234) than the source-side gate surface (2221).

B12. The nitride semiconductor device according to any one of clauses B7 to B11, where the source-side electrode surface (2241) is flush with the source-side gate surface (2221).

B13. The nitride semiconductor device according to any one of clauses B1 to B12, where the gate layer (222) includes a first gate layer (222) and a second gate layer (222) located at opposite sides of the source electrode (232) in the specified direction, and the gate electrode (224) includes a first gate electrode (224) formed on the first gate layer (222) and a second gate electrode (224) formed on the second gate layer (222).

B14. The nitride semiconductor device according to any one of clauses B1 to B13, where the gate layer (222) includes a drain-side step portion extending continuously from the drain-side gate surface (2222) toward the drain electrode (234) and a source-side step portion extending continuously from the source-side gate surface (2221) toward the source electrode (232).

B15. A method for manufacturing a nitride semiconductor device that includes an electron transit layer (216), an electron supply layer (218) arranged on the electron transit layer (216), a gate layer (222) arranged on the electron supply layer (218), a gate electrode (224) arranged on the gate layer (222), a source electrode (232) and a drain electrode (234) that are located at opposite sides of the gate layer (222) in a specified direction and in contact with the electron transit layer (216), the gate layer (222) including a first gate layer (222) and a second gate layer (222) located at opposite sides of the source electrode (232) in the specified direction, the gate electrode (224) including a first gate electrode (224) formed on the first gate layer (222) and a second gate electrode (224) formed on the second gate layer (222), the method including:

forming a first nitride semiconductor layer (216) that forms the electron transit layer (216), a second nitride semiconductor layer (218) that forms the electron supply layer (218), and a third nitride semiconductor layer (222) that forms the gate layer (222) in this order on a substrate;

forming a metal layer (224) that forms the gate electrode (224) and a first mask layer (261) in this order on the third nitride semiconductor layer (222);

patterning the first mask layer (261) to form a first mask (262) that partially covers the metal layer (224);

forming a second mask layer (264) that covers the metal layer (224) and the first mask (262);

etching back the second mask layer (264) to form a second mask (264A, 264B) that covers opposite sides of the first mask;

removing the first mask (262);

etching the metal layer using the second mask (264A, 264B) to form the first gate electrode (224A) and the second gate electrode (224B); and etching the third nitride semiconductor layer (33) using the first gate electrode (224A) and the second gate electrode (224B) to form the first gate layer (222A) and the second gate layer (222B).

B16. The method according to clause B15, where forming the first gate electrode (224) and the second gate electrode (224) and then removing the second mask;

forming a third mask layer (266) that covers the first gate electrode (224), the second gate electrode (224), and then the third nitride semiconductor layer (222); and etching back the third mask layer (266) to form a third mask (2661, 2662) that covers opposite surfaces of the first gate electrode (224) and opposite surfaces of the second gate electrode (224), where the first gate layer (222A) and the second gate layer (222B) are formed by etching the third nitride semiconductor layer (222) using the first gate electrode (224), the second gate electrode (224), and the third mask (2661, 2662).

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A nitride semiconductor device, comprising:

an electron transit layer composed of a nitride semiconductor;

an electron supply layer formed on the electron transit layer and composed of a nitride semiconductor having a band gap that is larger than that of the electron transit layer;

a gate layer formed on the electron supply layer and composed of a nitride semiconductor including an acceptor impurity;

a gate electrode formed on the gate layer; and a source electrode and a drain electrode that are formed on the electron supply layer, wherein the gate layer includes an upper surface in contact with the gate electrode, and the upper surface is a Ga-polar surface, wherein the gate layer includes:

a first GaN layer in contact with the gate electrode; and a second GaN layer in contact with the electron supply layer, and the first GaN layer is composed of Ga-polar GaN, and the second GaN layer is composed of N-polar GaN.

2. The nitride semiconductor device according to claim 1, wherein the second GaN layer is greater in thickness than the first GaN layer.

3. The nitride semiconductor device according to claim 1, wherein the gate layer has a thickness that is greater than or equal to 100 nm and less than 150 nm, and the first GaN layer has a thickness that is greater than or equal to 5 nm and less than 30 nm.

4. The nitride semiconductor device according to claim 1, wherein the second GaN layer includes a ridge in contact with the electron supply layer and covered by the first GaN layer, and an extension in contact with the electron supply layer and extending outward from the ridge in plan view, and the extension is smaller in thickness than the ridge.

5. The nitride semiconductor device according to claim 4, wherein the extension includes an upper surface that is at least partially a N-polar surface.

6. The nitride semiconductor device according to claim 1, wherein the upper surface of the gate layer forms a Schottky junction with the gate electrode.

7. The nitride semiconductor device according to claim 1, further comprising:

a passivation layer covering the electron supply layer, the gate layer, and the gate electrode and including a first opening and a second opening, wherein the source electrode is in contact with the electron supply layer through the first opening, the drain electrode is in contact with the electron supply layer through the second opening, and the gate layer is arranged between the first opening and the second opening.

8. The nitride semiconductor device according to claim 1, wherein the electron transit layer is composed of GaN, and the electron supply layer is composed of $Al_xGa_{1-x}N$, where $0.1<x<0.3$.

9. The nitride semiconductor device according to claim 1, wherein the first GaN layer includes a higher concentration of hydrogen than the second GaN layer.

10. The nitride semiconductor device according to claim 1, further comprising:

a semiconductor substrate; and a buffer layer formed on the semiconductor substrate, wherein the electron transit layer is formed on the buffer layer.

11. A method for manufacturing a nitride semiconductor device, the method comprising:

forming an electron transit layer composed of a nitride semiconductor;

forming an electron supply layer on the electron transit layer, the electron supply layer being composed of a nitride semiconductor having a band gap that is larger than that of the electron transit layer;

forming a gate layer on the electron supply layer, the gate layer being composed of a nitride semiconductor including an acceptor impurity;

forming a gate electrode on the gate layer; and forming a source electrode and a drain electrode on the electron supply layer, wherein the gate layer includes an upper surface in contact with the gate electrode, and the upper surface is a Ga-polar surface, wherein forming the gate layer includes forming a first nitride semiconductor layer on the electron supply layer, the first nitride semiconductor layer being N-polar GaN that is grown using $N_2$ as a carrier gas, and forming a second nitride semiconductor layer on the first nitride semiconductor layer, the second nitride semiconductor layer being Ga-polar GaN that is grown using $H_2$ as a carrier gas.

* * * * *